(12) United States Patent
Tsukamoto

(10) Patent No.: US 11,374,013 B2
(45) Date of Patent: Jun. 28, 2022

(54) SEMICONDUCTOR STORAGE DEVICE AND ELECTRONIC APPARATUS

(71) Applicant: SONY SEMICONDUCTOR SOLUTIONS CORPORATION, Kanagawa (JP)

(72) Inventor: Masanori Tsukamoto, Kanagawa (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 0 days.

(21) Appl. No.: 16/754,696

(22) PCT Filed: Aug. 23, 2018

(86) PCT No.: PCT/JP2018/031209
§ 371 (c)(1),
(2) Date: Apr. 8, 2020

(87) PCT Pub. No.: WO2019/077876
PCT Pub. Date: Apr. 25, 2019

(65) Prior Publication Data
US 2020/0243550 A1    Jul. 30, 2020

(30) Foreign Application Priority Data
Oct. 17, 2017    (JP) .............................. JP2017-200957

(51) Int. Cl.
*H01L 27/11507* (2017.01)
*H01L 27/11504* (2017.01)
*H01L 21/265* (2006.01)

(52) U.S. Cl.
CPC .............. *H01L 27/11507* (2013.01); *H01L 27/11504* (2013.01); *H01L 21/26513* (2013.01); *H01L 21/26586* (2013.01)

(58) Field of Classification Search
CPC ......... H01L 27/11502; H01L 27/11507; H01L 27/11504; H01L 27/10829;
(Continued)

(56) References Cited

U.S. PATENT DOCUMENTS 6,198,151 B1    3/2001    Wada
6,300,683 B1    10/2001    Nagasaka et al.
(Continued)

FOREIGN PATENT DOCUMENTS

JP    11-126830 A    1/1999
JP    11-097651 A    4/1999
(Continued)

OTHER PUBLICATIONS

International Search Report and Written Opinion of PCT Application No. PCT/JP2018/031209, dated Oct. 23, 2018, 11 pages of ISRWO.

*Primary Examiner* — Thanhha S Pham
(74) *Attorney, Agent, or Firm* — Chip Law Group

(57) ABSTRACT

Provided is a semiconductor storage device and an electronic apparatus having a structure that is more suitable for miniaturization and high integration of memory cells. A semiconductor storage device includes: a recessed portion provided in a semiconductor substrate; a ferroelectric film provided along an inner side of the recessed portion; an electrode provided on the ferroelectric film so as to be embedded in the recessed portion; a first conductivity-type separation region provided in the semiconductor substrate under the recessed portion; and a second conductivity-type electrode region provided in the semiconductor substrate on at least one side of the recessed portion.

11 Claims, 35 Drawing Sheets

(58) Field of Classification Search
CPC ......... H01L 27/10832; H01L 27/10861; H01L 27/10867; H01L 29/945
See application file for complete search history.

(56) References Cited

U.S. PATENT DOCUMENTS

| | | |
|---|---|---|
| 2001/0050388 A1 | 12/2001 | Hamamoto |
| 2005/0048715 A1* | 3/2005 | Rupp ................ H01L 27/10864 438/244 |
| 2006/0030110 A1 | 2/2006 | Kumura et al. |

FOREIGN PATENT DOCUMENTS

| | | |
|---|---|---|
| JP | 11-126830 A | 5/1999 |
| JP | 11-168194 A | 6/1999 |
| JP | 11-233649 A | 8/1999 |
| JP | 2006-049566 A | 2/2006 |
| JP | 2007-273664 A | 10/2007 |

* cited by examiner

SEMICONDUCTOR STORAGE DEVICE AND ELECTRONIC APPARATUS

CROSS REFERENCE TO RELATED APPLICATIONS

This application is a U.S. National Phase of International Patent Application No. PCT/JP2018/031209 filed on Aug. 23, 2018, which claims priority benefit of Japanese Patent Application No. JP 2017-200957 filed in the Japan Patent Office on Oct. 17, 2017. Each of the above-referenced applications is hereby incorporated herein by reference in its entirety.

TECHNICAL FIELD

The present disclosure relates to a semiconductor storage device and an electronic apparatus.

BACKGROUND ART

A complementary MOS (CMOS) circuit including an n-type metal-oxide-semiconductor field-effect transistor (nMOSFET) and a p-type MOSFET (pMOSFET) provided on the same substrate is known as a circuit that consumes less power, can perform high speed operation, and can easily achieve miniaturization and high integration.

Therefore, the CMOS circuit is used in a large number of large scale integration (LSI) devices. Note that, in recent years, such LSI devices have been put into production as a system on a chip (SoC) in which an analog circuit, a memory, a logic circuit, and the like are mounted on a chip.

The memory mounted on the LSI devices is, for example, a static random access memory (static RAM: SRAM) or the like. In recent years, using a dynamic RAM (DRAM), a magnetic RAM (MRAM), a ferroelectric RAM (FeRAM), or the like, instead of the SRAM, has been studied in order to further reduce costs and power consumption of the LSI devices.

Herein, the FeRAM is a semiconductor storage device that stores information by using a remanent polarization direction of ferroelectrics. As an example of a structure of the FeRAM, for example, a structure including a trench-type capacitor made from a ferroelectric material as a memory cell is proposed.

For example, Patent Document 1 cited below discloses a semiconductor storage device including, as a memory cell, a capacitor including ferroelectrics provided on an inner surface of a trench structure, an electrode provided in the trench structure, and an electrode provided on an outer surface of the trench structure.

CITATION LIST

Patent Document

Patent Document 1: Japanese Patent Application Laid-Open No. 11-168194

SUMMARY OF THE INVENTION

Problems to be Solved by the Invention

However, in the semiconductor storage device disclosed in Patent Document 1 cited above, the capacitor made from metal/ferroelectrics/metal is formed for each memory cell, and thus a single memory cell occupies a large area. Therefore, a structure of the semiconductor storage device disclosed in Patent Document 1 cited above is not suitable for miniaturization and high integration of memory cells.

In view of this, there have been demanded a semiconductor storage device and an electronic apparatus having a structure that is more suitable for miniaturization and high integration of memory cells.

Solutions to Problems

The present disclosure provides a semiconductor storage device including: a recessed portion provided in a semiconductor substrate; a ferroelectric film provided along an inner side of the recessed portion; an electrode provided on the ferroelectric film so as to be embedded in the recessed portion; a first conductivity-type separation region provided in the semiconductor substrate under the recessed portion; and a second conductivity-type electrode region provided in the semiconductor substrate on at least one side of the recessed portion.

Further, the present disclosure provides an electronic apparatus including a semiconductor storage device, in which the semiconductor storage device includes a recessed portion provided in a semiconductor substrate, a ferroelectric film provided along an inner side of the recessed portion, an electrode provided on the ferroelectric film so as to be embedded in the recessed portion, a first conductivity-type separation region provided in the semiconductor substrate under the recessed portion, and a second conductivity-type electrode region provided in the semiconductor substrate on at least one side of the recessed portion.

Further, the present disclosure provides a method of manufacturing a semiconductor storage device, including: a step of providing a recessed portion in a semiconductor substrate; a step of providing a second conductivity-type electrode region in the semiconductor substrate on at least one side of the recessed portion; a step of providing a first conductivity-type separation region in the semiconductor substrate under the recessed portion; a step of providing a ferroelectric film along an inner side of the recessed portion; and a step of providing an electrode on the ferroelectric film so that the electrode is embedded in the recessed portion.

According to the present disclosure, adjacent memory cells can share the recessed portion in which a capacitor including the ferroelectric film is formed. Thus, an area occupied by a single memory cell can be further reduced in the semiconductor storage device.

Effects of the Invention

As described above, the present disclosure can provide a semiconductor storage device and an electronic apparatus having a structure that is more suitable for miniaturization and high integration of memory cells.

Note that the effects described above are not necessarily limitative. With or in the place of the above effects, there may be achieved any one of the effects described in this specification or other effects that may be grasped from this specification.

MODE FOR CARRYING OUT THE INVENTION

Figure 1:
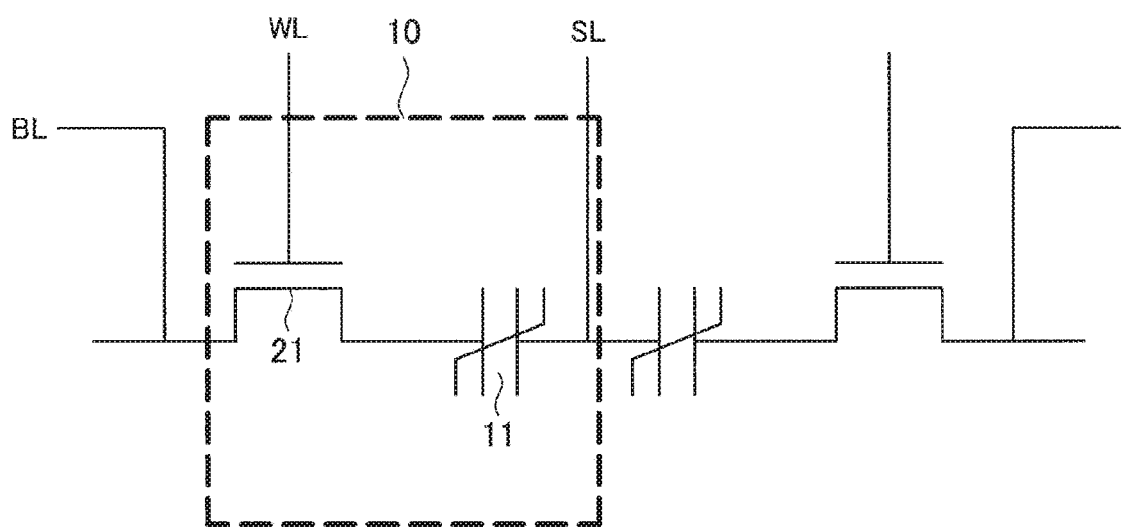
FIG. 1 is a circuit diagram showing an equivalent circuit of a semiconductor storage device according to an embodiment of the present disclosure.

Hereinafter, preferred embodiments of the present disclosure will be described in detail with reference to the appended drawings. Note that, in this specification and the appended drawings, constituent elements that have substantially the same function configuration are denoted with the same reference signs, and repeated explanation of these constituent elements is omitted.

Note that, in the drawings described below, the size of some constituent members may be exaggerated in some cases for the sake of explanation. Therefore, the relative sizes of the constituent members shown in the respective drawings do not necessarily accurately express the magnitude relationship between the actual constituent members. Further, in the following description, a direction in which substrates or layers are laminated is referred to as "upward direction" in some cases.

Note that description will be provided in the following order.
1. Overview
2. Structure example
3. Manufacturing methods
   3.1. First manufacturing method
   3.2. Second manufacturing method
   3.3. Third manufacturing method
   3.4. Fourth manufacturing method
4. Operation example
5. Modification example
6. Application examples

1. Overview

First, an overview of a semiconductor storage device according to an embodiment of the present disclosure will be described with reference to FIG. 1. FIG. 1 is a circuit diagram showing an equivalent circuit of a semiconductor storage device according to this embodiment. Note that, hereinafter, the term "gate" indicates a gate electrode of a field-effect transistor, the term "drain" indicates a drain electrode or drain region of the field-effect transistor, and the term "source" indicates a source electrode or source region of the field-effect transistor.

As shown in FIG. 1, a semiconductor storage device 10 includes a capacitor 11 that stores information and a transistor 21 that controls selection and non-selection of the capacitor 11. The semiconductor storage device 10 is, for example, a single memory cell that stores information of one bit as 0 or 1.

The capacitor 11 is a ferroelectric capacitor including a pair of electrodes between which a ferroelectric film is sandwiched. The capacitor 11 can store information by using a remanent polarization direction of the ferroelectric film sandwiched between the pair of electrodes. In the capacitor 11, one of the pair of electrodes is electrically connected to a source line SL, and the other of the pair of electrodes is electrically connected to the source or drain of the transistor 21.

Further, the source line SL electrically connected to one of the electrodes of the capacitor 11 is shared by a capacitor of an adjacent memory cell. Specifically, one of the electrodes of the capacitor 11 and one of electrodes of the capacitor of the adjacent memory cell are continuously provided, and the source line SL is connected to the electrodes that are continuously provided.

The transistor 21 is a field-effect transistor that controls selection and non-selection of the capacitor 11. One of the source and drain of the transistor 21 is electrically connected to the other of the electrodes of the capacitor 11, and the other of the source and drain thereof is electrically connected to a bit line BL. Further, a gate of the transistor 21 is electrically connected to a word line WL, and a state of a channel of the transistor 21 is controlled by an application voltage from the word line WL.

In a case where information is written to the capacitor 11 in such the semiconductor storage device 10, first, a voltage is applied to the word line WL to cause the channel of the transistor 21 to transition to an on state. Thereafter, a predetermined potential difference is applied between the source line SL and the bit line BL, thereby applying an electric field to the ferroelectric film of the capacitor 11. With this, the semiconductor storage device 10 can control the remanent polarization direction of the ferroelectric film of the capacitor 11 by using an external electric field, and can therefore write information to the capacitor 11.

Meanwhile, in a case where information is read from the capacitor 11 in the semiconductor storage device 10, first, a voltage is applied to the word line WL to cause the channel of the transistor 21 to transition to the on state. Thereafter, a predetermined potential difference is applied between the source line SL and the bit line BL, thereby causing a polarization direction of the ferroelectric film of the capacitor 11 to transition to a predetermined direction. At this time, in the capacitor 11, the magnitude of a current flowing at the time of the transition is changed depending on the polarization direction of the ferroelectric film before the transition. Therefore, in the semiconductor storage device 10, information stored in the capacitor 11 can be read by measuring the magnitude of the current flowing through the capacitor 11.

Thus, the semiconductor storage device 10 can operate as a ferroelectric random access memory (FeRAM) that causes the capacitor 11 to store information.

In the semiconductor storage device 10, one of the electrodes of the capacitor 11 is shared as one of electrodes by the capacitor of the adjacent memory cell. Specifically, in the semiconductor storage device 10, an electrode embedded in a recessed portion provided in a semiconductor substrate is shared by adjacent memory cells, and the respective capacitors 11 are electrically separated on both sides of the electrode. Thus, an area occupied by a single memory cell can be reduced in the semiconductor storage device 10. This makes it possible to miniaturize and highly integrate memory cells.

Further, because the transistor 21 that controls selection and non-selection of the capacitor 11 is provided in the semiconductor storage device 10, it is possible to control whether to apply a voltage to the capacitor 11 by using the transistor 21. Therefore, in the semiconductor storage device 10, it is possible to prevent a non-selected capacitor 11 from being influenced (so-called write disturb or read disturb) when information is written to and read from a selected capacitor 11. Further, the semiconductor storage device can apply a voltage only to the selected capacitor 11 when information is written and read. This makes it possible to restrain ferroelectrics of the capacitor 11 from being deteriorated.

2. Structure Example

Figure 2:
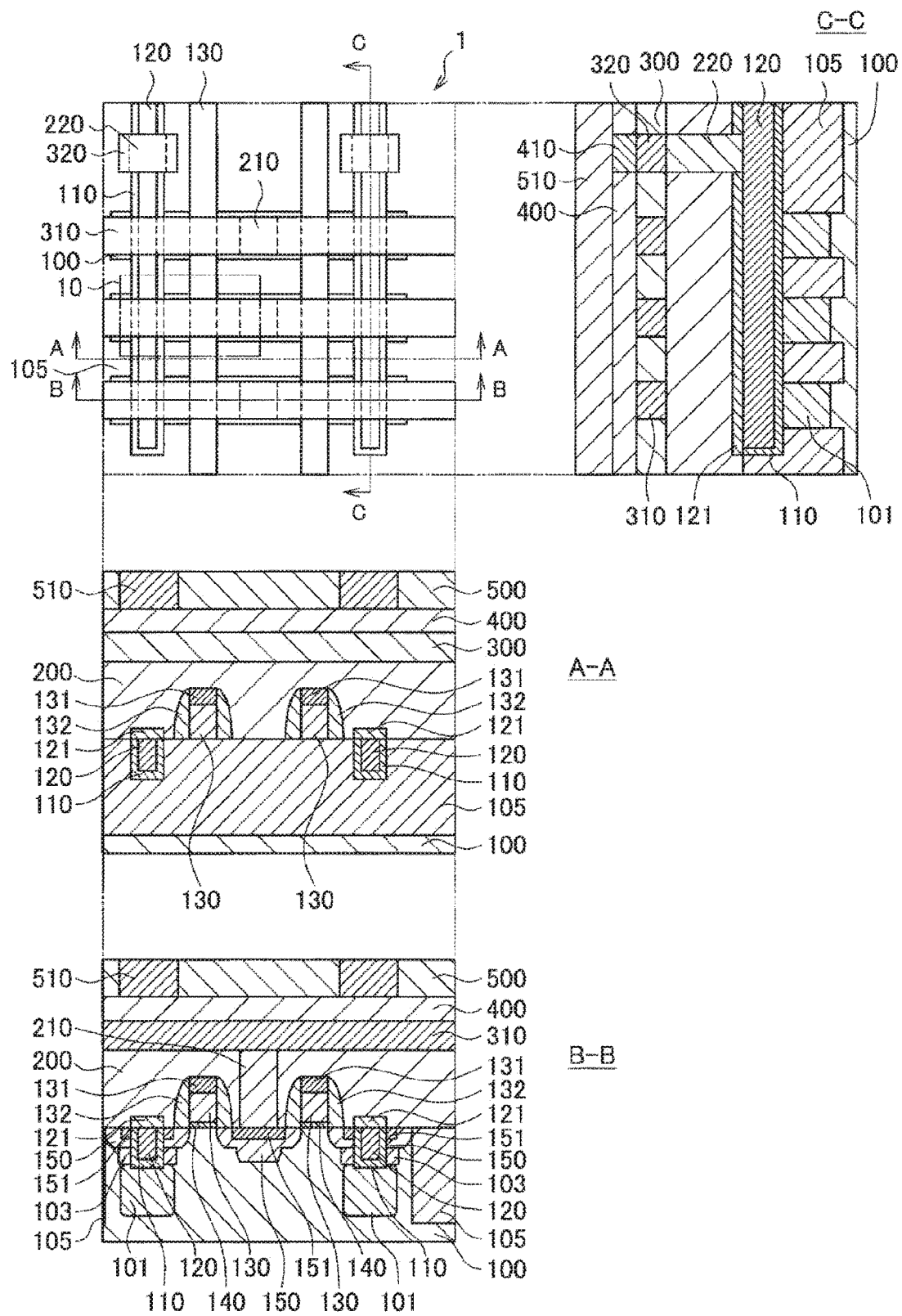
FIG. 2 is a schematic diagram showing a planar structure and cross-sectional structures of the semiconductor storage device according to the same embodiment.

Next, a specific structure of the semiconductor storage device 10 according to this embodiment will be described with reference to FIG. 2. FIG. 2 is a schematic diagram showing a planar structure and cross-sectional structures of the semiconductor storage device 10 according to this embodiment.

Note that, in order to clearly show arrangement of each configuration, the plan view of FIG. 2 is shown as a planar transparent view in which layers formed over the whole surface of a semiconductor substrate 100, a third interlayer insulating film 500, a second wiring layer 510, and a second interlayer insulating film 400 are omitted. Each cross-sectional view of FIG. 2 shows a cross-section obtained by cutting the plan view along the line A-A, the line B-B, or the line C-C.

Further, hereinafter, the term "first conductivity-type" indicates one of the "p-type" and the "n-type", and the term "second conductivity-type" indicates the other of the "p-type" and the "n-type", which is different from the "first conductivity-type".

As shown in FIG. 2, the semiconductor storage devices 10 are provided on the semiconductor substrate 100. A large number of the semiconductor storage devices 10 are arranged in matrix on the semiconductor substrate 100 to form a semiconductor storage device (semiconductor memory) capable of storing a large amount of information.

The capacitor 11 includes a ferroelectric film 110 provided along an inner side of a recessed portion provided in the semiconductor substrate 100, a capacitor electrode 120 provided to be embedded in the recessed portion, and an electrode region 103 provided on each side of the recessed portion in the semiconductor substrate 100. The electrode region 103 is connected to one of source or drain regions 150 to be electrically connected to the transistor 21, and the capacitor electrode 120 is electrically connected to the source line SL via a contact 220. Note that the capacitor 11 is electrically separated from a capacitor 11 of an adjacent memory cell by a separation region 101 provided under the recessed portion in the semiconductor substrate 100.

The transistor 21 includes a gate insulating film 140 provided on the semiconductor substrate 100, a gate electrode 130 provided on the gate insulating film 140, and the source or drain regions 150 provided in the semiconductor substrate 100. One of the source or drain regions 150 is connected to the electrode region 103 to be electrically connected to the capacitor 11, and the other of the source or drain regions 150 is electrically connected to the bit line BL via a contact 210. Further, the gate electrode 130 is extended to be electrically connected to the word line WL.

Note that a structure that forms a capacitor by embedding a dielectric and an electrode in a recessed portion provided in a semiconductor substrate can be, for example, a trench-type dynamic random access memory (DRAM). However, the DRAM stores information by using electric charges accumulated in a capacitor, and thus, for example, a capacitance of the capacitor of approximately 20 fF is necessary for a capacitance of the bit line of 100 fF in order to read the stored information with sufficient accuracy.

For example, in a case where a dielectric constant of the dielectric for use in the capacitor is 25, a width of a dielectric film is 60 nm, and a thickness of the film is 5 nm, a depth of the recessed portion for forming a capacitor having the capacitance of 20 fF is approximately 8 µm. It is extremely difficult to process the recessed portion having such the depth. This makes it difficult to achieve miniaturization and high integration in the DRAM.

The semiconductor storage device 10 according to this embodiment functions as an FeRAM that stores information by using remanent polarization of ferroelectrics. The FeRAM is different from the DRAM in operation principles, and thus, for example, even if the capacitance of the bit line is 100 fF, information can be read with sufficient accuracy by forming the capacitor 11 in the recessed portion having the depth of approximately 400 nm in a case where the remanent polarization of the ferroelectrics is approximately 25 $\mu C/\mu m^2$. Therefore, miniaturization and high integration can be easily performed in the semiconductor storage device 10 according to this embodiment.

Hereinafter, each configuration of the semiconductor storage device 10 will be described more specifically.

The semiconductor substrate 100 is a substrate that is made from a semiconductor material and on which the capacitors 11 and the transistors 21 are formed. The semiconductor substrate 100 may be a silicon substrate, or may be a silicon on insulator (SOI) substrate in which an insulating film made from $SiO_2$ or the like is inserted into a silicon substrate. Alternatively, the semiconductor substrate 100 may be a substrate formed by using another element semiconductor made from germanium or the like, or a substrate formed by using a compound semiconductor made from gallium arsenide (GaAs), gallium nitride (GaN), silicon carbide (SiC), or the like.

An element separation layer 105 is made from an insulation material and electrically separates the respective elements (i.e., the capacitors 11 and the transistors 21) provided on the semiconductor substrate 100. The element separation layer 105 may be provided to extend in, for example, parallel strip regions that are separated from each other in a first direction of the semiconductor substrate 100 (i.e., a lateral direction seen from a position facing FIG. 2; the same applies hereinafter). For example, the element separation layer 105 may be made from insulative oxynitride such as silicon oxide ($SiO_x$), silicon nitride ($SiN_x$), or silicon oxynitride (SiON).

For example, the element separation layer 105 may be formed by shallow trench isolation (STI) by removing a part of the semiconductor substrate 100 in a predetermined region by etching or the like and then embedding silicon oxide ($SiO_x$) in the opening. Further, the element separation layer 105 may be formed by local oxidation of silicon (LOCOS) by thermally oxidizing the semiconductor substrate 100 in the predetermined region.

Note that regions separated by the element separation layer 105 as the strip regions that are parallel to each other function as an element region in which each element (i.e., the capacitor 11 and the transistor 21) is formed. For example, first conductivity-type impurities (e.g., p-type impurities such as boron (B) or aluminum (Al)) may be introduced into the semiconductor substrate 100 in the element region.

The ferroelectric film 110 is made from a ferroelectric material and is provided along the inner side of the recessed portion provided in the semiconductor substrate 100. Specifically, the ferroelectric film 110 extends in a second direction (i.e., a longitudinal direction seen from the position facing FIG. 2; the same applies hereinafter) orthogonal to the first direction in which the element separation layer 105 extends, and is provided to have a predetermined film thickness along the inner side of the recessed portion provided over the plurality of element regions. The ferroelectric film 110 is sandwiched between the capacitor electrode 120 and the electrode region 103, thereby functioning as the capacitor 11.

The ferroelectric film 110 is made from a ferroelectric material that is spontaneously polarized and whose polarization direction is controllable by an external electric field. For example, the ferroelectric film 110 may be made from a ferroelectric material having a perovskite structure, such as lead zirconate titanate (Pb(Zr, Ti)$O_3$:PZT) or strontium bismuth tantalate ($SrBi_2Ta_2O_9$:SBT). Further, the ferroelectric film 110 may be a ferroelectric film obtained by modifying a film made from a high dielectric material such as $HfO_x$, $ZrO_x$, or $HfZrO_x$ by heat treatment or the like, or may be a ferroelectric film formed by introducing atoms such as lanthanum (La), silicon (Si), or gadolinium (Gd) into a film made from the above high dielectric materials. Furthermore, the ferroelectric film 110 may be formed as a single layer, or may be formed as a plurality of layers. For example, the ferroelectric film 110 may be a single layer film made from a ferroelectric material such as $HfO_x$.

The capacitor electrode 120 is made from a conductive material and is provided to be embedded in the recessed portion provided in the semiconductor substrate 100. Specifically, the capacitor electrode 120 extends in the second direction orthogonal to the first direction in which the element separation layer 105 extends, and is provided on the ferroelectric film 110 in the recessed portion provided over the plurality of element regions so as to be embedded in the recessed portion. With this, the capacitor electrode 120 can electrically connect each capacitor 11 of the semiconductor storage device 10. For example, the capacitor electrode 120 may be made from a low-resistance metal such as titanium (Ti) or tungsten (W), or may be made from a metal compound such as titanium nitride (TiN) or tantalum nitride (TaN). The capacitor electrode 120 may be formed as a single layer, or may be formed as a laminated body of a plurality of layers.

A cap layer 121 is made from an insulation material and is provided on the capacitor electrode 120 to protect the capacitor electrode 120. Specifically, the cap layer 121 protects the capacitor electrode 120 from etching performed in a step of forming the transistor 21 in a case where the transistor 21 is formed after the capacitor 11 is formed. Note that, by providing a high etch selectivity to a flattening film 200 in a step of forming the contact 220, the cap layer 121 can also prevent the capacitor electrode 120 from being etched. For example, the cap layer 121 may be made from insulative oxynitride such as silicon oxide ($SiO_x$), silicon nitride ($SiN_x$), or silicon oxynitride (SiON). Specifically, in a case where the flattening film 200 is made from silicon oxide ($SiO_x$), the cap layer 121 may be made from silicon nitride ($SiN_x$).

The electrode region 103 is a second conductivity-type region formed on at least one side of the recessed portion provided in the semiconductor substrate 100. Specifically, the electrode regions 103 are provided by introducing second conductivity-type impurities into regions on both sides of the recessed portion provided in the element regions of the semiconductor substrate 100. Each electrode region 103 and the source or drain region 150 are continuously provided, thereby electrically connecting the capacitor 11 and the transistor 21.

For example, the electrode region 103 may be provided by introducing the second conductivity-type impurities (e.g., n-type impurities such as phosphorus (P) or arsenic (As)) into the semiconductor substrate 100 at a concentration of $1 \times 10^{18}$ impurities/$cm^3$ or more. By introducing the second conductivity-type impurities at the concentration of $1 \times 10^{18}$ impurities/$cm^3$ or more, the electrode region 103 can have sufficient conductivity to form the capacitor 11.

The separation region 101 is a first conductivity-type region formed under the recessed portion provided in the semiconductor substrate 100. Specifically, the separation region 101 is provided by introducing the first conductivity-type impurities into a region under the recessed portion provided in the element regions of the semiconductor substrate 100. The separation region 101 electrically separates the electrode regions 103 that are provided on both the side of the recessed portion so as to prevent the electrode regions 103 from being electrically connected to each other.

For example, the separation region 101 may be provided by introducing the first conductivity-type impurities (e.g., the p-type impurities such as boron (B) or aluminum (Al)) into the semiconductor substrate 100 at a concentration of $1 \times 10^{18}$ impurities/$cm^3$ or more. By introducing the first conductivity-type impurities at the concentration of $1 \times 10^{18}$ impurities/$cm^3$ or more, the separation region 101 can sufficiently electrically separate the capacitors 11 that are formed on both side surfaces of the recessed portion so as to prevent the capacitors 11 from being electrically connected.

The capacitor 11 is formed by sandwiching the ferroelectric film 110 between the capacitor electrode 120 and the electrode region 103 described above. With this, the semiconductor storage device 10 can store information in the capacitor 11 by using the remanent polarization of the ferroelectric film 110. Further, in the semiconductor storage device 10, the respective capacitors 11 are provided on both sides in the element regions of the recessed portion in which the ferroelectric film 110 and the capacitor electrode 120 are embedded, and each capacitor 11 is electrically separated by the separation region 101. Thus, two capacitors can be formed by using a single recessed portion (trench). This makes it possible to reduce an area occupied by the semiconductor storage device 10.

Herein, a formation depth of the recessed portion in which the ferroelectric film 110 and the capacitor electrode 120 are embedded can be set to be shallower than a formation depth of the element separation layer 105. This is to perform electrical separation in the second direction in which the recessed portion extends in the element separation layer 105 so as to prevent the capacitor 11 from being unintentionally electrically connected to another capacitor 11 and the transistor 21 provided in the semiconductor substrate 100. If the formation depth of the recessed portion is deeper than the formation depth of the element separation layer 105, the capacitor 11 may be unintentionally electrically connected to the adjacent capacitor 11 or may generate a leakage current in the second direction in which the recessed portion extends. Therefore, the formation depth of the recessed portion in which the ferroelectric film 110 and the capacitor electrode 120 are embedded may be shallower than the formation depth of the element separation layer 105.

Herein, the capacitance of the capacitor 11 can be equal to or more than twice as much as a junction capacitance formed between the electrode region 103 and the semiconductor substrate 100. The junction capacitance is a parasitic capacitance generated by p-n junction between the second conductivity-type electrode region 103 and the first conductivity-type semiconductor substrate 100. A potential of the electrode region 103 is changed depending on a ratio of the junction capacitance to the capacitance of the capacitor 11, and thus, in a case where the capacitance of the capacitor 11 is equal to or more than twice as much as the junction capacitance, a potential change in the electrode region 103 of the non-selected capacitor 11 can be smaller than ⅓ of a potential of the capacitor electrode 120. Thus, information stored in the non-selected capacitor 11 can be restrained from being inverted. Note that the capacitance of the capacitor 11 can be controlled by, for example, permittivity, a film thickness, and an area of the ferroelectric film 110.

The gate insulating film 140 is made from a publicly-known insulation material and is provided on the semiconductor substrate 100. Note that the gate insulating film 140 is not provided on the element separation layer 105 and is provided on each of the semiconductor substrates 100 in the element regions separated by the element separation layer 105. With this, the semiconductor storage device 10 can prevent an unintended region from functioning as a transistor. The gate insulating film 140 may be made from a general insulation material as a gate insulating film of the field-effect transistor. For example, the gate insulating film 140 may be made from insulative oxynitride such as silicon oxide ($SiO_x$), silicon nitride ($SiN_x$), or silicon oxynitride (SiON).

The gate electrode 130 is made from a conductive material and is provided on the gate insulating film 140. Further, the gate electrode 130 extends over the element separation layer 105 in the second direction orthogonal to the first direction in which the element separation layer 105 extends and is therefore provided over the plurality of element regions. With this, the gate electrode 130 can electrically connect the gates of the respective transistors 21 of the semiconductor storage devices 10. At this time, the gate electrode 130 is also provided on the element separation layer 105, but, because the gate insulating film 140 is not provided on the element separation layer 105, the gate electrode 130 functions as wiring on the element separation layer 105.

For example, the gate electrode 130 may be made from polysilicon or the like, or may be made from a metal, an alloy, a metal compound, or an alloy of a high melting point metal (Ni or the like) and polysilicon (so-called silicide). Specifically, the gate electrode 130 may be formed as a laminated structure of a layer made from a metal and a layer made from polysilicon. For example, the gate electrode 130 may be formed as a laminated structure of a metal layer made from TiN or TaN provided on the gate insulating film 140 and a layer made from polysilicon. According to such the laminated structure, the gate electrode 130 can reduce a wiring resistance, as compared to a case where the gate electrode 130 is formed as a single polysilicon layer.

The source or drain regions 150 are the second conductivity-type regions formed in the semiconductor substrate 100. Specifically, the source or drain regions 150 are provided in the semiconductor substrate 100 on both sides of the gate electrode 130. One of the source or drain regions 150 is connected to a first wiring layer 310 functioning as the bit line BL via the contact 210, and the other of the source or drain regions 150 is connected to the electrode region 103.

For example, each source or drain region 150 may be formed by introducing the second conductivity-type impurities (e.g., then-type impurities such as phosphorus (P) or arsenic (As)) into the semiconductor substrate 100 in the element regions separated by the element separation layer 105. Further, a lightly-doped drain (LDD) region whose conductivity type is the same as that of the source or drain region 150 and the concentration of the conductivity-type impurities is lower than that of the source or drain region 150 may be formed in the semiconductor substrate 100 between the source or drain region 150 and the gate electrode 130.

Note that either one of the source or drain regions 150 provided on both the sides of the gate electrode 130 may function as a source region, and either one thereof may function as a drain region. Those functions can be arbitrarily changed depending on a polarity of the conductivity-type impurities or wiring connection.

Side wall insulating films 132 are made from an insulation material and are provided as side walls on side surfaces of the gate electrode 130. Specifically, the side wall insulating films 132 can be formed by uniformly forming an insulating film in a region including the gate electrode 130 and then performing vertical anisotropy etching on the insulating film. For example, the side wall insulating films 132 may be formed as a single layer or a plurality of layers made from insulative oxynitride such as silicon oxide ($SiO_x$), silicon nitride ($SiN_x$), or silicon oxynitride (SiON).

Each side wall insulating film 132 blocks the second conductivity-type impurities introduced into the semiconductor substrate 100, thereby controlling a positional relationship between the gate electrode 130 and the source or drain region 150 in a self-alignment manner. By forming the side wall insulating film 132, impurities can be gradually introduced into the semiconductor substrate 100. This makes it possible to form the LDD region between the source or drain region 150 and the gate electrode 130 in a self-alignment manner.

A contact layer 131 is provided on an upper surface of the gate electrode 130 to improve conductivity of the gate electrode 130. Specifically, the contact layer 131 may be made from a low-resistance metal or a metal compound.

A contact region 151 is provided on the source or drain region 150 in a surface of the semiconductor substrate 100 to reduce a contact resistance between the source or drain region 150 and the contact 210. Specifically, the contact region 151 may be made from an alloy of a high melting point metal such as Ni and polysilicon (so-called silicide).

The flattening film 200 is an insulating film in which the capacitors 11 and the transistors 21 are embedded and which is provided over the whole surface of the semiconductor substrate 100. For example, the flattening film 200 may be made from insulative oxynitride such as silicon oxide ($SiO_x$), silicon nitride ($SiN_x$), or silicon oxynitride (SiON).

Note that, although not shown in FIG. 2, a liner layer made from an inorganic insulation material may be provided over the whole surface on the semiconductor substrate 100, the side wall insulating films 132, and the contact layers 131. The liner layer can prevent the semiconductor substrate 100 from being etched by providing high etch selectivity to the flattening film 200 in a step of forming the contact 210. For example, the liner layer may be made from insulative oxynitride such as silicon oxide ($SiO_x$), silicon nitride ($SiN_x$), or silicon oxynitride (SiON). Specifically, in a case where the flattening film 200 is made from silicon oxide ($SiO_x$), the liner layer may be made from silicon nitride ($SiN_x$).

Further, the liner layer may be formed as a layer that applies compressive stress or tensile stress to a channel under the gate insulating film 140. In such a case, the liner layer can improve carrier mobility in the channel by a stress effect.

The contacts 210 and 220 are made from a conductive material and are provided to penetrate the flattening film 200. Specifically, the contact 210 is provided on the other of the source or drain regions 150 that is not connected to the electrode region 103. The contact 210 electrically connects the other of the source or drain regions 150 and the first wiring layer 310 via the contact region 151. Further, the contact 220 is provided on the extended capacitor electrode 120. The contact 220 electrically connects the second wiring layer 510 and the capacitor electrode 120 via a via 410.

For example, the contacts 210 and 220 may be made from a low-resistance metal such as titanium (Ti) or tungsten (W) or a metal compound such as titanium nitride (TiN) or tantalum nitride (TaN). The contacts 210 and 220 may be formed as a single layer, or may be formed as a laminated body of a plurality of layers. For example, the contacts 210 and 220 may be formed as a laminated body of Ti or TiN and W.

A first interlayer insulating film 300 is a film in which the first wiring layers 310 and 320 are embedded, and is provided on the flattening film 200 over the whole surface of the semiconductor substrate 100. The first interlayer insulating film 300 may be made from, for example, insulative oxynitride such as silicon oxide ($SiO_x$), silicon nitride ($SiN_x$), or silicon oxynitride (SiON).

The first wiring layer 310 is made from a conductive material and is provided on the contact 210 as wiring extending in the first direction that is a direction in which the element regions extend. The first wiring layer 310 is electrically connected to the other of the source or drain regions 150 of the transistor 21 via the contact 210 and functions as the bit line BL. The first wiring layer 320 is made from a conductive material and is provided on the contact 220. The first wiring layer 320 electrically connects the contact 220 in a lower layer and the via 410 in an upper layer. The first wiring layers 310 and 320 may be made from, for example, a metal material such as copper (Cu) or aluminum (Al), or may be formed as a damascene structure or dual damascene structure of Cu.

The second interlayer insulating film 400 is provided on the first interlayer insulating film 300 over the whole surface of the semiconductor substrate 100 so that the via 410 is embedded therein. The second interlayer insulating film 400 may be made from, for example, insulative oxynitride such as silicon oxide ($SiO_x$), silicon nitride ($SiN_x$), or silicon oxynitride (SiON).

The via 410 is made from a conductive material and is provided on the first wiring layer 320. Specifically, the via 410 is provided to penetrate the second interlayer insulating film 400 and electrically connects the first wiring layer 320 in a lower layer and the second wiring layer 510 in an upper layer. The via 410 may be made from, for example, a low-resistance metal such as titanium (Ti) or tungsten (W) or a metal compound such as titanium nitride (TiN) or tantalum nitride (TaN). The via 410 may be formed as a single layer, or may be formed as a laminated body of a plurality of layers, and, for example, may be formed as a laminated body of Ti or TiN and W.

The third interlayer insulating film 500 is provided on the second interlayer insulating film 400 over the whole surface of the semiconductor substrate 100 so that the second wiring layer 510 is embedded therein. The third interlayer insulating film 500 may be made from, for example, insulative oxynitride such as silicon oxide ($SiO_x$), silicon nitride ($SiN_x$), or silicon oxynitride (SiON).

The second wiring layer 510 is made from a conductive material, and is provided on the via 410 as wiring extending in the second direction that is a direction in which the capacitor electrode 120 extends. The second wiring layer 510 is electrically connected to the capacitor electrode 120 via the via 410, the first wiring layer 320, and the contact 220 and functions as the source line SL. The second wiring layer 510 may be made from, for example, a metal material such as copper (Cu) or aluminum (Al), or may be formed as a damascene structure or dual damascene structure of Cu.

According to the above structure, the recessed portion in which the capacitor 11 is formed can be shared by adjacent memory cells in the semiconductor storage device 10, and thus it is possible to reduce the area occupied by the semiconductor storage device 10. Thus, miniaturization and high integration can be performed more easily in the semiconductor storage device 10.

3. Manufacturing Methods (3.1. First Manufacturing Method)

Next, a first manufacturing method of the semiconductor storage device 10 according to this embodiment will be described with reference to FIGS. 3 to 15. FIGS. 3 to 15 are plan views and cross-sectional views showing respective steps of the first manufacturing method of the semiconductor storage device 10.

Note that, in FIGS. 3 to 15, as well as in FIG. 2, layers formed over the whole surface of the semiconductor substrate 100 are omitted. Further, each cross-sectional view shows a cross-section obtained by cutting the plan view along the line AA, the line BB, or the line CC.

Figure 3:
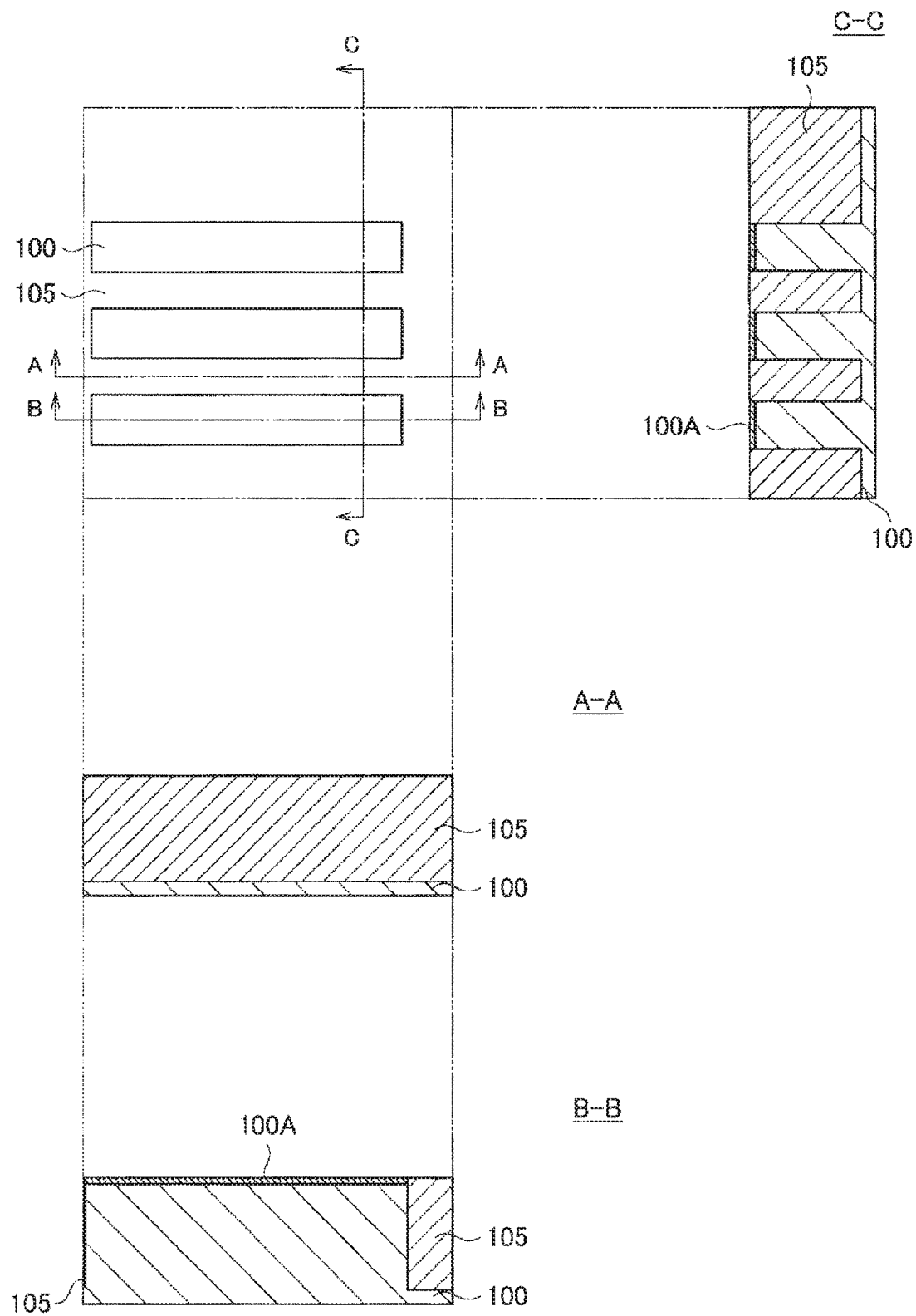
FIG. 3 shows a plan view and cross-sectional views for explaining one step of a first manufacturing method of a semiconductor storage device.

First, as shown in FIG. 3, the element regions in which the respective elements (i.e., the capacitors 11 and the transistors 21) are formed are provided by forming the element separation layer 105 on the semiconductor substrate 100.

Specifically, a $SiO_2$ film is formed on the semiconductor substrate 100 made from Si by dry oxidation or the like, and a $Si_3N_4$ film is further formed thereon by low pressure chemical vapor deposition (CVD) or the like. Then, a resist layer patterned to protect the element regions is formed on the $Si_3N_4$ film, and the $SiO_2$ film, the $Si_3N_4$ film, and the semiconductor substrate 100 are etched at a depth of 350 nm to 400 nm. Next, a $SiO_2$ film having a film thickness of 650 nm to 700 nm is formed to be embedded in an opening provided by the etching, thereby forming the element separation layer 105. The $SiO_2$ film may be formed by, for example, high density plasma CVD having satisfactory step coverage and capable of forming a minute $SiO_2$ film.

Then, the $SiO_2$ film that has been excessively formed is removed by chemical mechanical polish (CMP) or the like to flatten a surface of the semiconductor substrate 100. The removal of the $SiO_2$ film by CMP only needs to be performed until, for example, the $Si_3N_4$ film is exposed.

Further, the $Si_3N_4$ film is removed by using heat phosphoric acid or the like. Note that, in order to form a minuter $SiO_2$ film of the element separation layer 105 or to round corners of the element regions, the semiconductor substrate 100 can also be annealed under an environment of $N_2$, $O_2$, or $H_2/O_2$ before the $Si_3N_4$ film is removed. Next, surfaces of the element regions on the semiconductor substrate 100 are oxidized at a depth of approximately 10 nm to form oxide films 100A, and thereafter the first conductivity-type impurities (e.g., boron (B) or the like) are ion-implanted, thereby converting the semiconductor substrate 100 in the element regions into a first conductivity-type well region.

Figure 4:
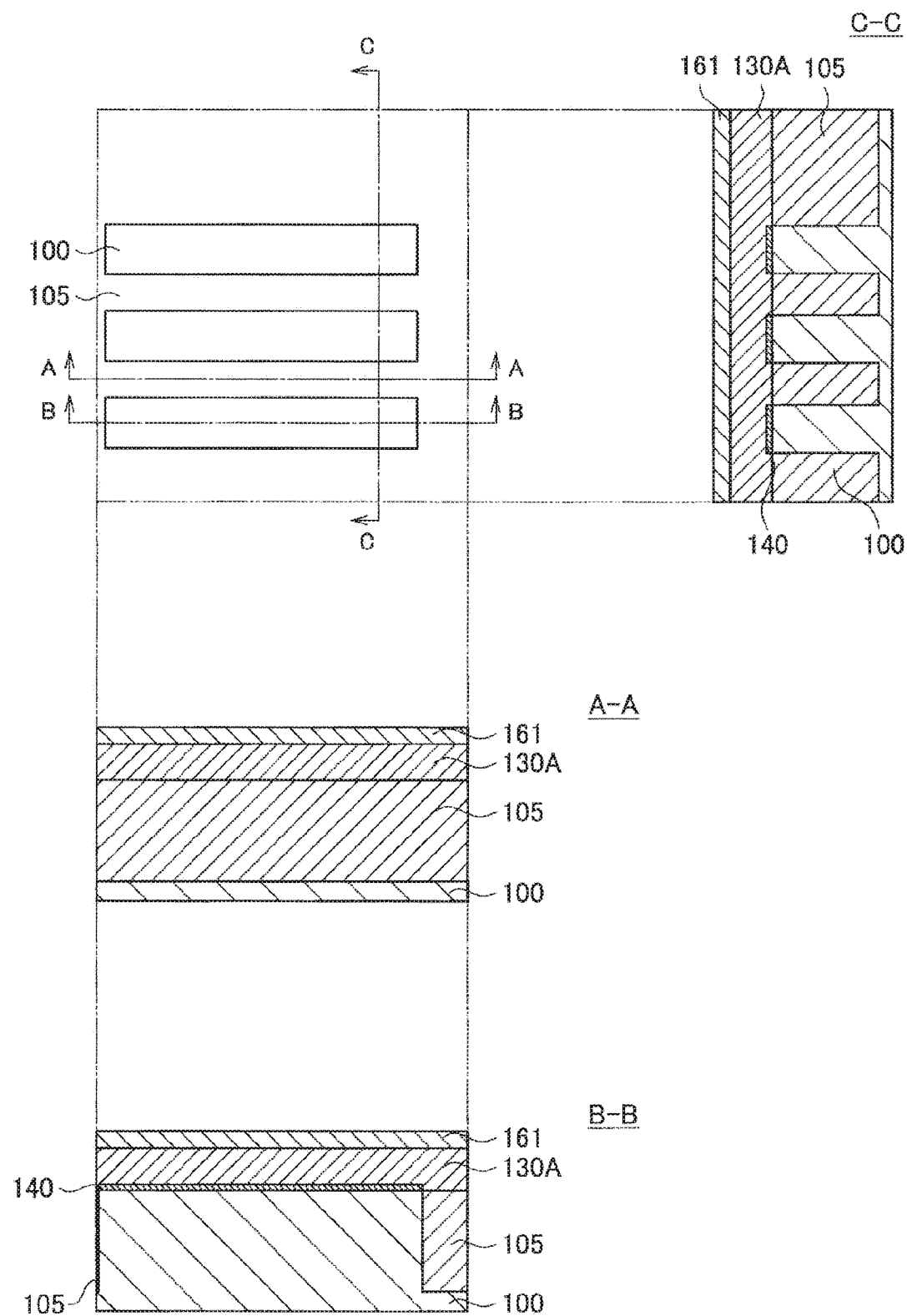
FIG. 4 shows a plan view and cross-sectional views for explaining one step of the first manufacturing method of the semiconductor storage device.

Next, as shown in FIG. 4, the gate insulating films 140 are formed, and thereafter a lower gate electrode 130A (serving as a part of the gate electrode 130 in the latter step) and a protective layer 161 are formed on the gate insulating films 140.

Specifically, first, the oxide films 100A covering the surface of the semiconductor substrate 100 are peeled off by using a hydrofluoric acid solution or the like. Thereafter, the gate insulating films 140 made from $SiO_2$ are formed on the semiconductor substrate 100 by dry oxidation using $O_2$ of 700° C. or rapid thermal anneal (RTA) treatment so as to have a film thickness of 1.5 nm to 10 nm. Note that the gas for use in dry oxidation may be not only $O_2$ but also a mixture gas of $H_2/O_2$ and $N_2O$ or NO. Further, when the gate insulating films 140 are formed, nitrogen doping can also be performed in the $SiO_2$ film by plasma nitridation.

Next, a polysilicon film is formed to have a film thickness of 50 nm to 150 nm by low pressure CVD in which a $SiH_4$ gas is used as a material gas and a film forming temperature is set to 580° C. to 620° C., thereby forming the lower gate electrode 130A. Then, a $Si_3N_4$ film is formed to have a film thickness of approximately 5 nm to 30 nm by low pressure CVD, thereby forming the protective layer 161.

Figure 5:
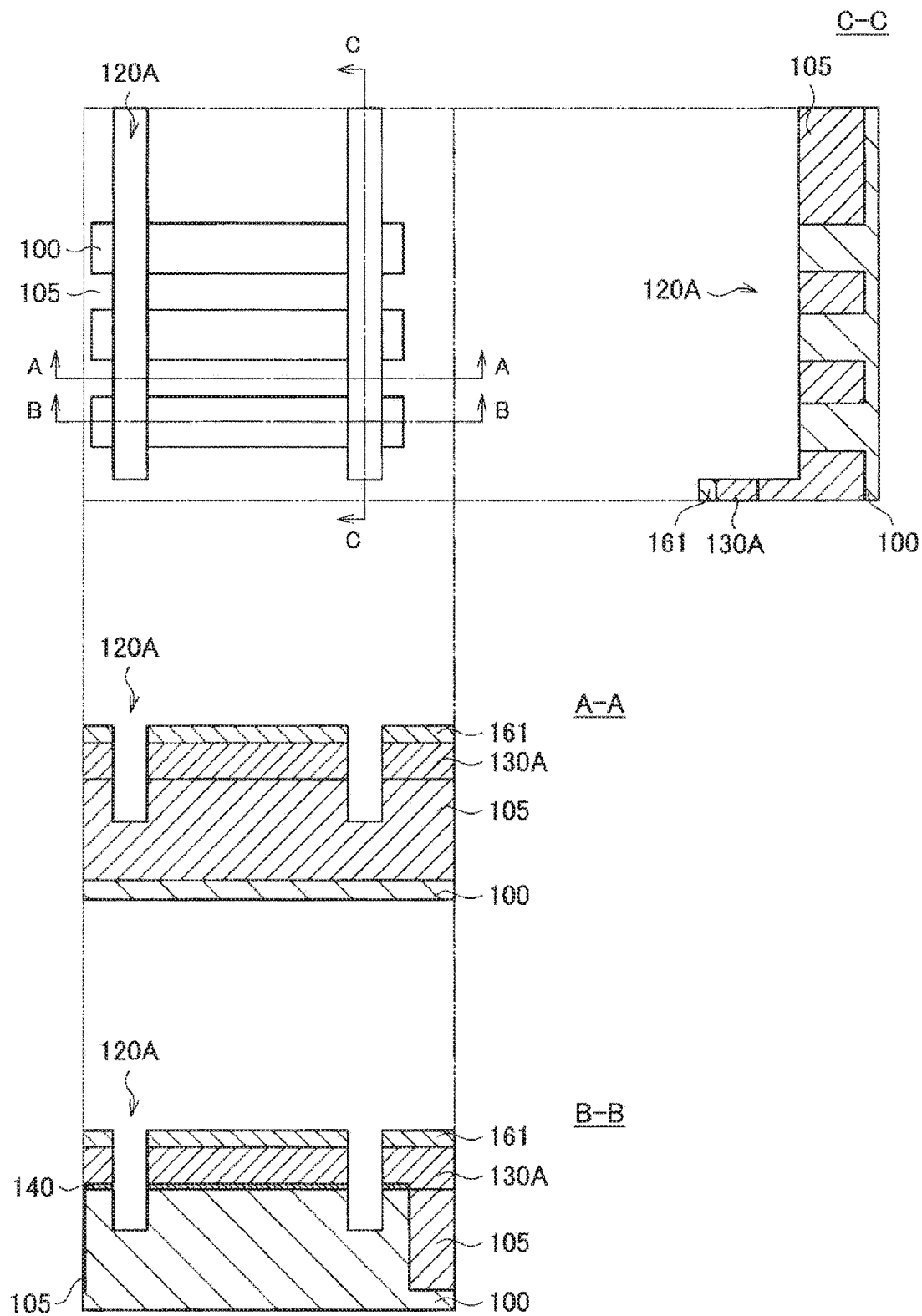
FIG. 5 shows a plan view and cross-sectional views for explaining one step of the first manufacturing method of the semiconductor storage device.

Next, as shown in FIG. 5, recessed portions 120A extending in the second direction are formed on the semiconductor substrate 100.

Specifically, each recessed portion 120A having a width of 60 nm and a depth of 0 nm to 1200 nm is formed by anisotropy etching in which a resist patterned by lithography is used as a mask. For example, an HBr or Cl-based gas can be used for anisotropy etching. Note that, in a case where an aspect ratio is up to approximately 20, the recessed portion 120A can be smoothly subjected to etching and embedding. However, the recessed portion 120A does not need to be provided by etching the semiconductor substrate 100. For example, the recessed portion 120A may be provided by etching only the lower gate electrode 130A, without performing anisotropy etching on the gate insulating film 140.

Figure 6:
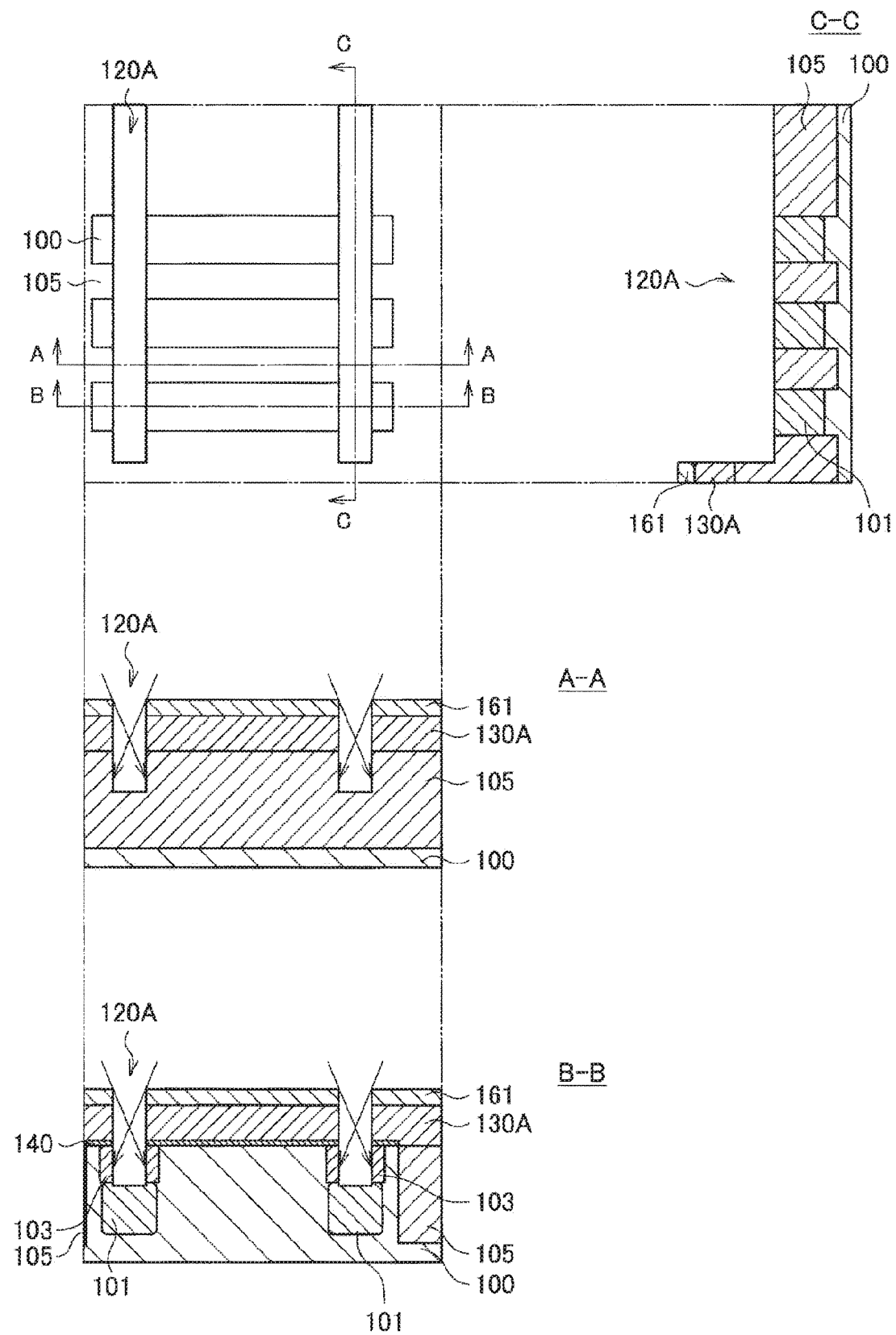
FIG. 6 shows a plan view and cross-sectional views for explaining one step of the first manufacturing method of the semiconductor storage device.

Then, as shown in FIG. 6, ion implantation is performed on inside of the recessed portion 120A to form the electrode regions 103 and the separation region 101.

Specifically, each electrode region 103 is formed by obliquely ion-implanting arsenic (As) that is the second conductivity-type impurities into the recessed portion 120A at 10 keV to 50 keV at the concentration of 5 to $20 \times 10^{14}$ impurities/cm$^2$. An angle of the oblique ion implantation can be adjusted depending on the width and depth of the recessed portion 120A so that ion implantation is performed on an inner surface of the recessed portion 120A. The angle of the oblique ion implantation may be, for example, 10° to 45°. Next, the separation region 101 is formed by ion-implanting boron (B) that is the first conductivity-type impurities into a bottom portion of the recessed portion 120A at 5 keV to 50 keV at the concentration of 5 to $20 \times 10^{13}$ impurities/cm$^2$.

Figure 7:
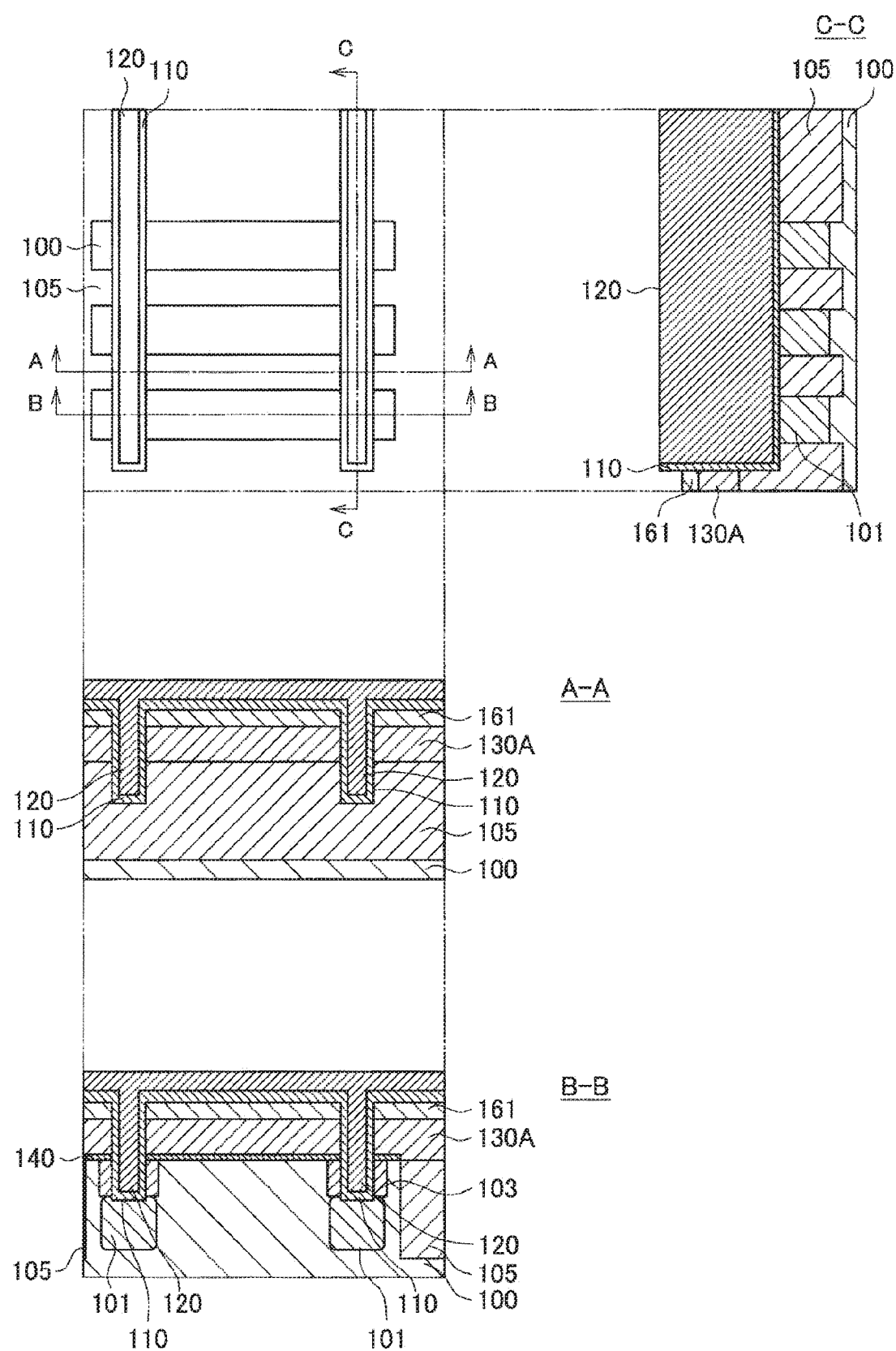
FIG. 7 shows a plan view and cross-sectional views for explaining one step of the first manufacturing method of the semiconductor storage device.

Thereafter, as shown in FIG. 7, the ferroelectric film 110 and the capacitor electrode 120 are formed on the protective layer 161 so as to be embedded in the recessed portion 120A.

Specifically, a natural oxide film on the recessed portion 120A and the protective layer 161 is peeled off by using an HF solution, and thereafter an interface layer made from SiO$_2$ is formed on surfaces of the recessed portion 120A and the protective layer 161 by rapid thermal oxidization (RTO), oxygen plasma treatment, or chemical oxidation treatment using a drug solution such as a hydrogen peroxide solution so as to have a film thickness of 0.5 nm to 1.5 nm. Next, a film of hafnium oxide (HfO$_x$) that is a high dielectric material is formed on the interface layer by CVD or atomic layer deposition (ALD) so as to have a film thickness of 3 nm to 10 nm. Note that hafnium oxide (HfO$_x$) that is a high dielectric material is converted into a ferroelectric material by performing annealing treatment in the latter step.

Note that, instead of hafnium oxide, a high dielectric material such as zirconium oxide (ZrO$_x$) or hafnium zirconium oxide (HfZrO$_x$) can also be used. Further, those high dielectric materials can also be converted into ferroelectric materials by doping lanthanum (La), silicon (Si), gadolinium (Gd), or the like. Furthermore, a perovskite-based ferroelectric material such as lead zirconate titanate (PZT) or strontium bismuth tantalate (SBT) can also be used as the ferroelectric film 110.

Thereafter, a TiN film having a film thickness of 5 nm to 20 nm is formed on the ferroelectric film 110 by CVD, ALD, sputtering, or the like, thereby forming the capacitor electrode 120. Note that TaN can also be used as a material from which the capacitor electrode 120 is made.

Figure 8:
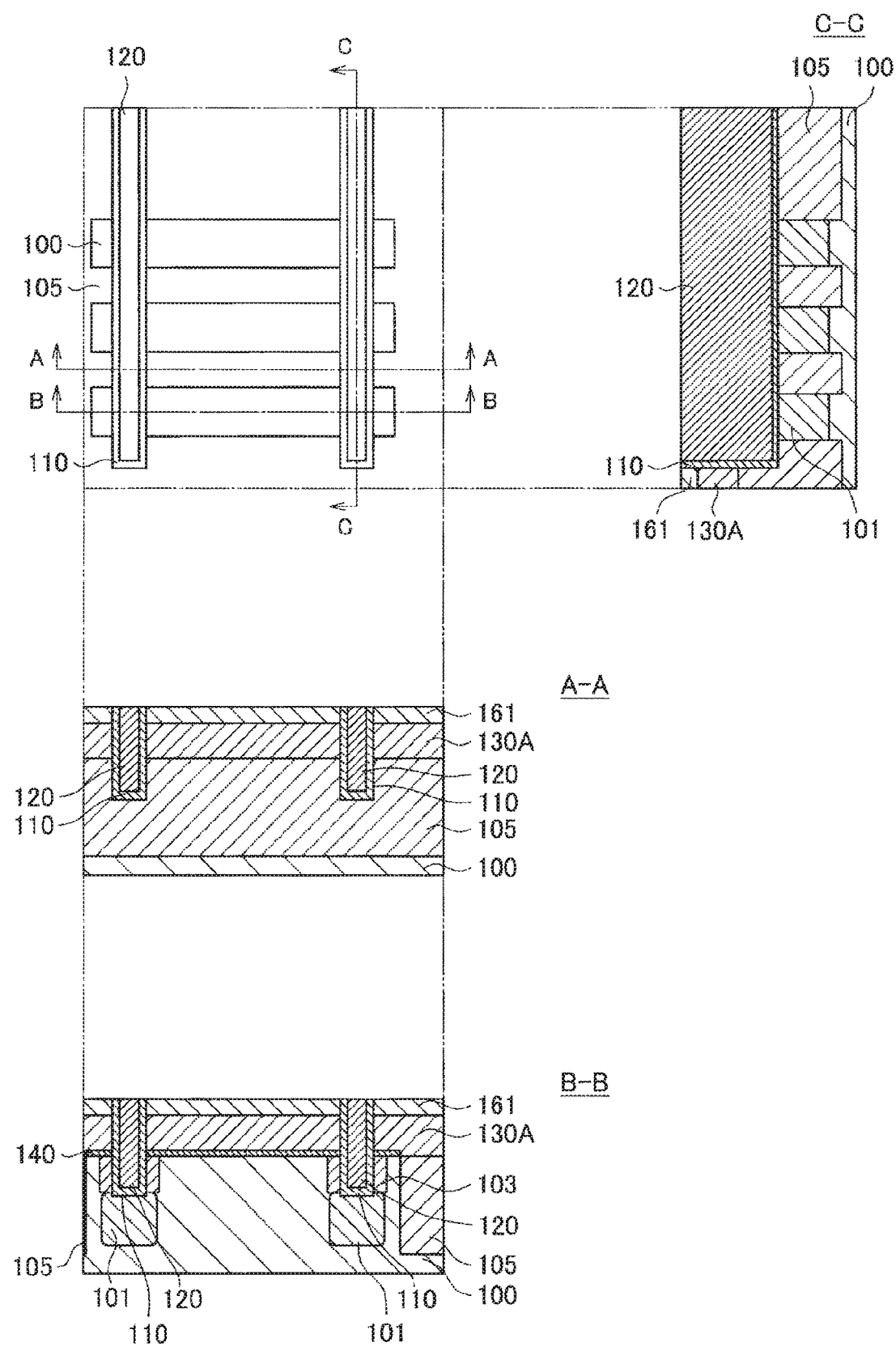
FIG. 8 shows a plan view and cross-sectional views for explaining one step of the first manufacturing method of the semiconductor storage device.

Then, as shown in FIG. 8, the ferroelectric film 110 and the capacitor electrode 120 that have been excessively formed are removed, thereby forming the capacitor 11.

Specifically, the ferroelectric film 110 and the capacitor electrode 120 that have been excessively formed are removed by performing CMP until the protective layer 161 of the Si$_3$N$_4$ film is exposed. At this time, the protective layer 161 of the Si$_3$N$_4$ film functions as a stopper, and thus polishing by CMP can be controllably performed. Thereafter, crystallization annealing is performed for converting HfO$_x$ (high dielectric material at this time) from which the ferroelectric film 110 is made into a ferroelectric material. Note that the crystallization annealing for converting HfO$_x$ into a ferroelectric material may be performed in this step, or may be simultaneously performed in another annealing step. An annealing temperature of the crystallization annealing is changed depending on the type of the high dielectric material from which the ferroelectric film 110 is made or the type of a dopant, but the crystallization annealing only needs to be performed within the range of, for example, 400° C. to 1100° C.

Figure 9:
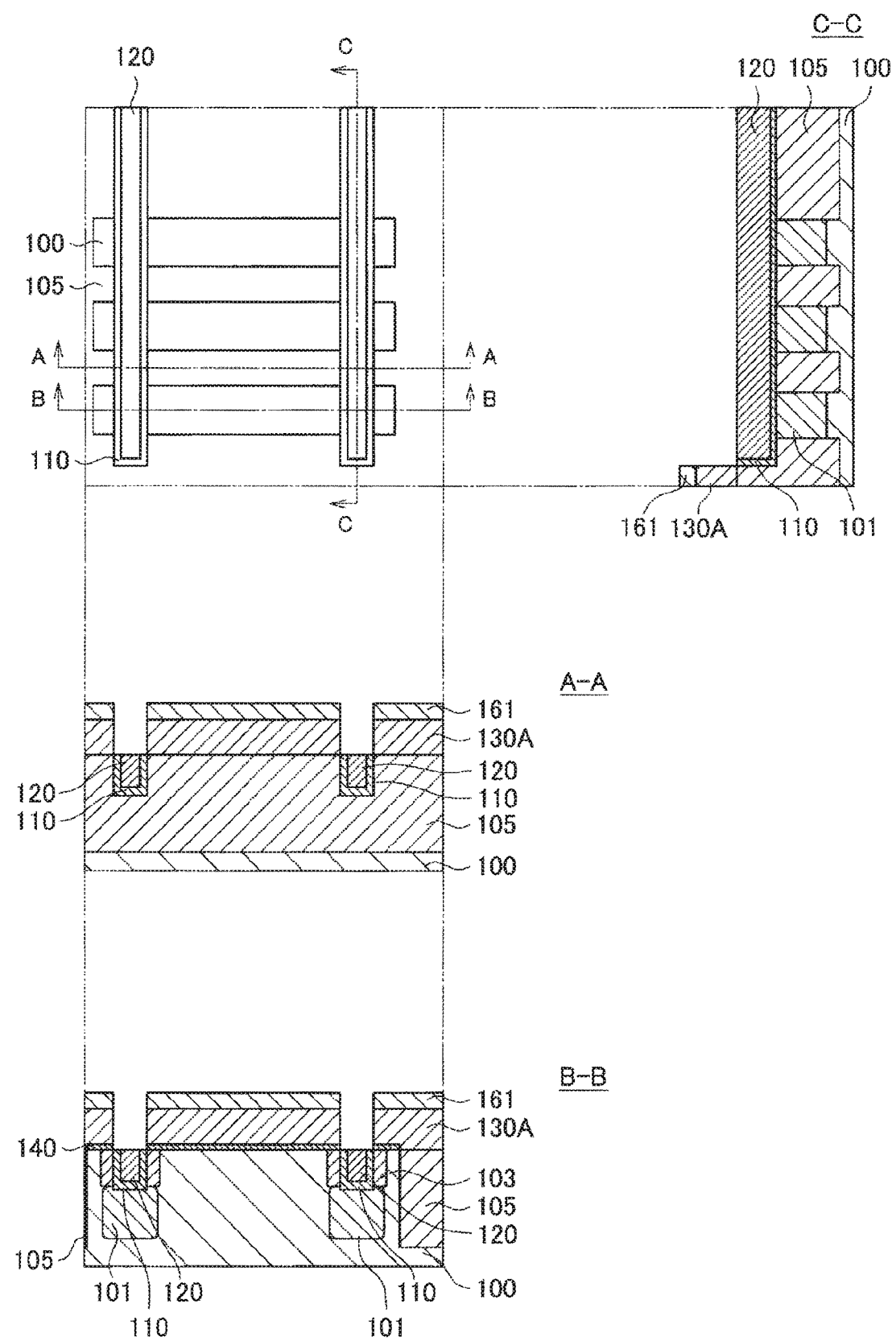
FIG. 9 shows a plan view and cross-sectional views for explaining one step of the first manufacturing method of the semiconductor storage device.

Next, as shown in FIG. 9, a part of the capacitor electrode 120 is removed.

Specifically, the ferroelectric film 110 and the capacitor electrode 120 are etched at a predetermined depth by anisotropy etching, thereby forming a recess. A depth of the recess can be arbitrarily set.

Figure 10:
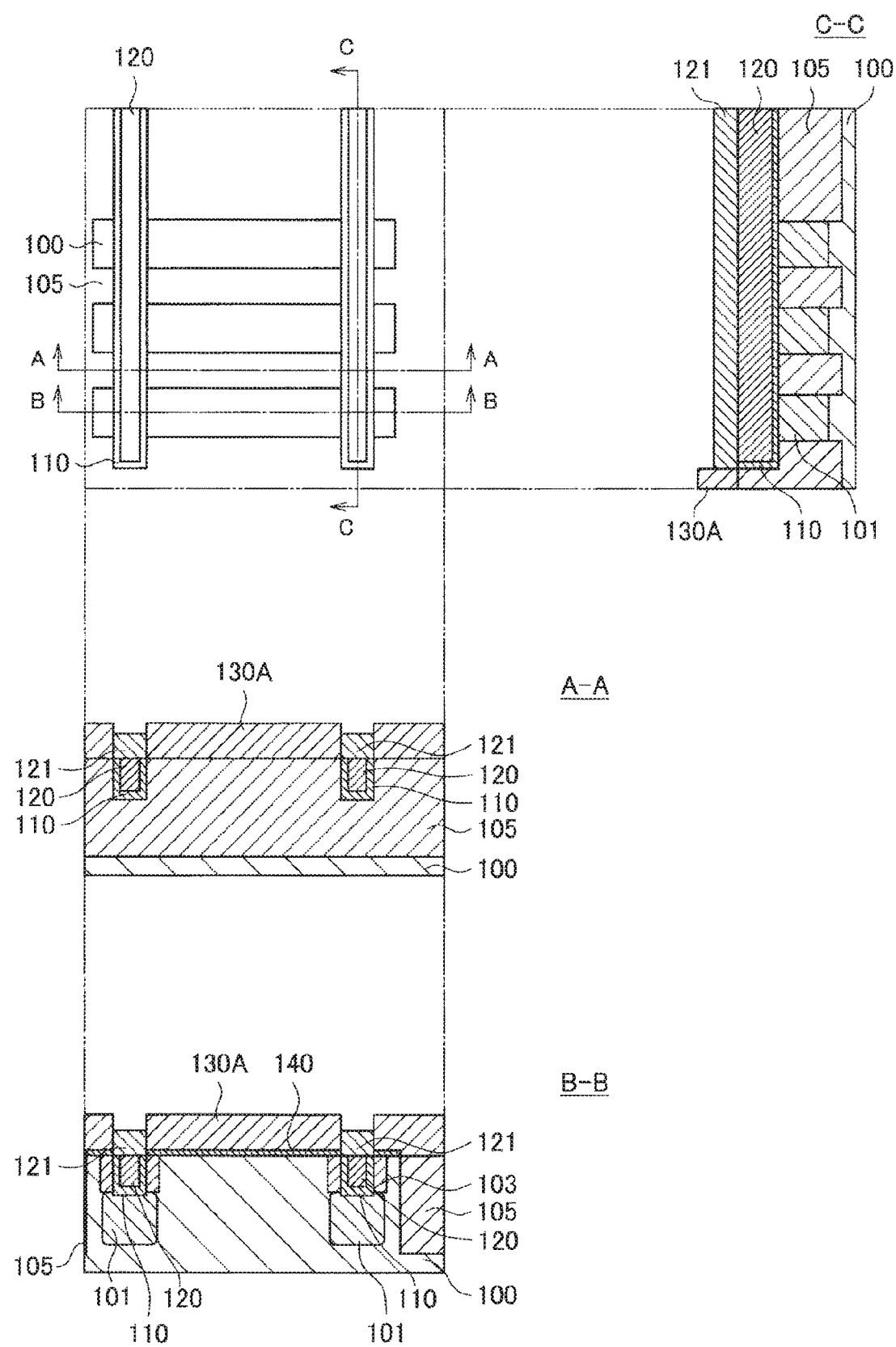
FIG. 10 shows a plan view and cross-sectional views for explaining one step of the first manufacturing method of the semiconductor storage device.

Then, as shown in FIG. 10, the cap layer 121 is formed on the capacitor electrode 120.

Specifically, the cap layer 121 is formed by forming a Si$_3$N$_4$ film having a film thickness of approximately 30 nm to 60 nm on the capacitor electrode 120 by low pressure CVD or the like and thereafter performing anisotropy etching. The cap layer 121 may be formed in, for example, the recess formed in the former step.

Figure 11:
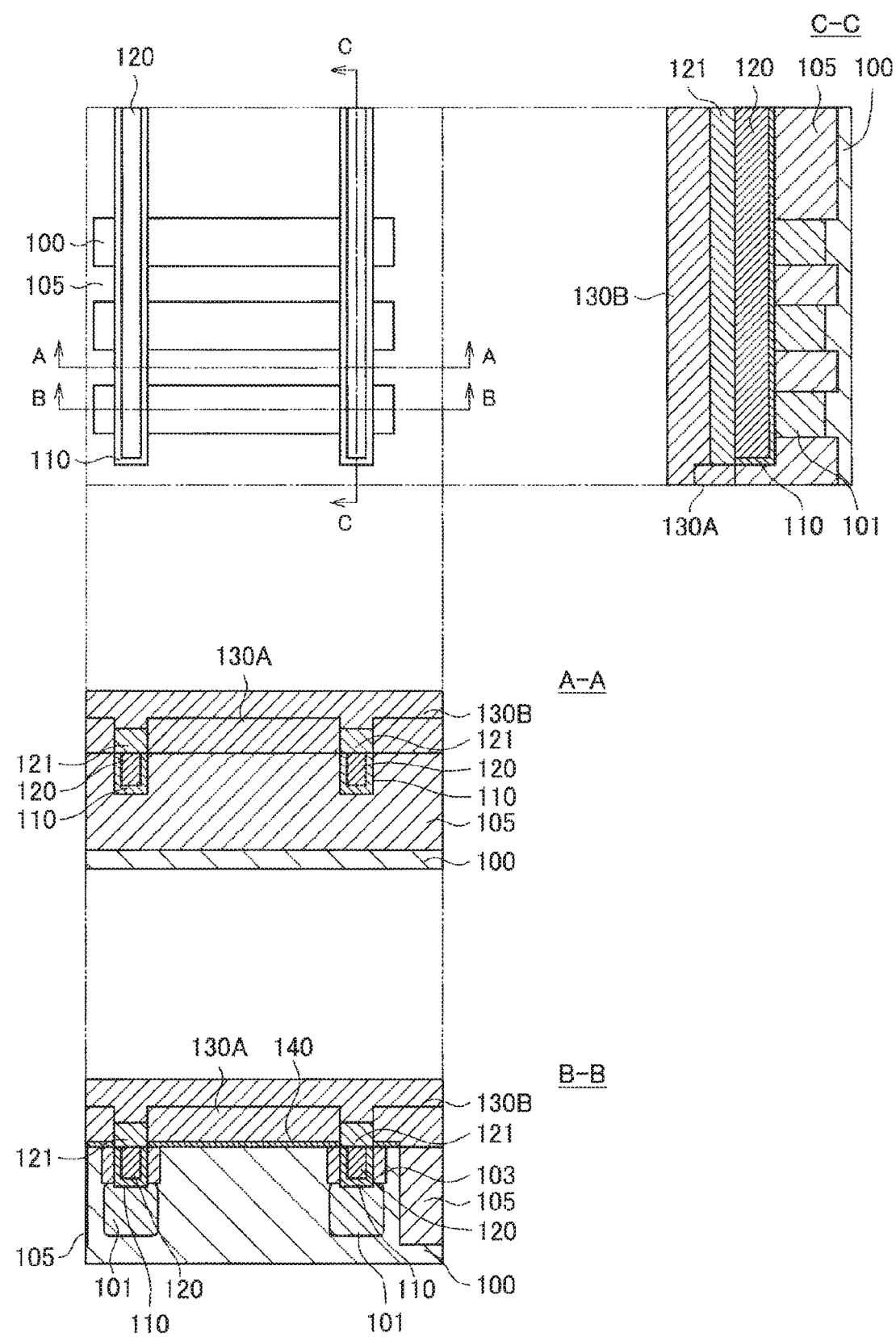
FIG. 11 shows a plan view and cross-sectional views for explaining one step of the first manufacturing method of the semiconductor storage device.

Thereafter, as shown in FIG. 11, an upper gate electrode 130B is formed on the lower gate electrode 130A.

Specifically, a polysilicon film having a film thickness of 50 nm to 150 nm is formed by low pressure CVD in which a SiH$_4$ gas is used as a material gas and a film forming temperature is set to 580° C. to 620° C.

Figure 12:
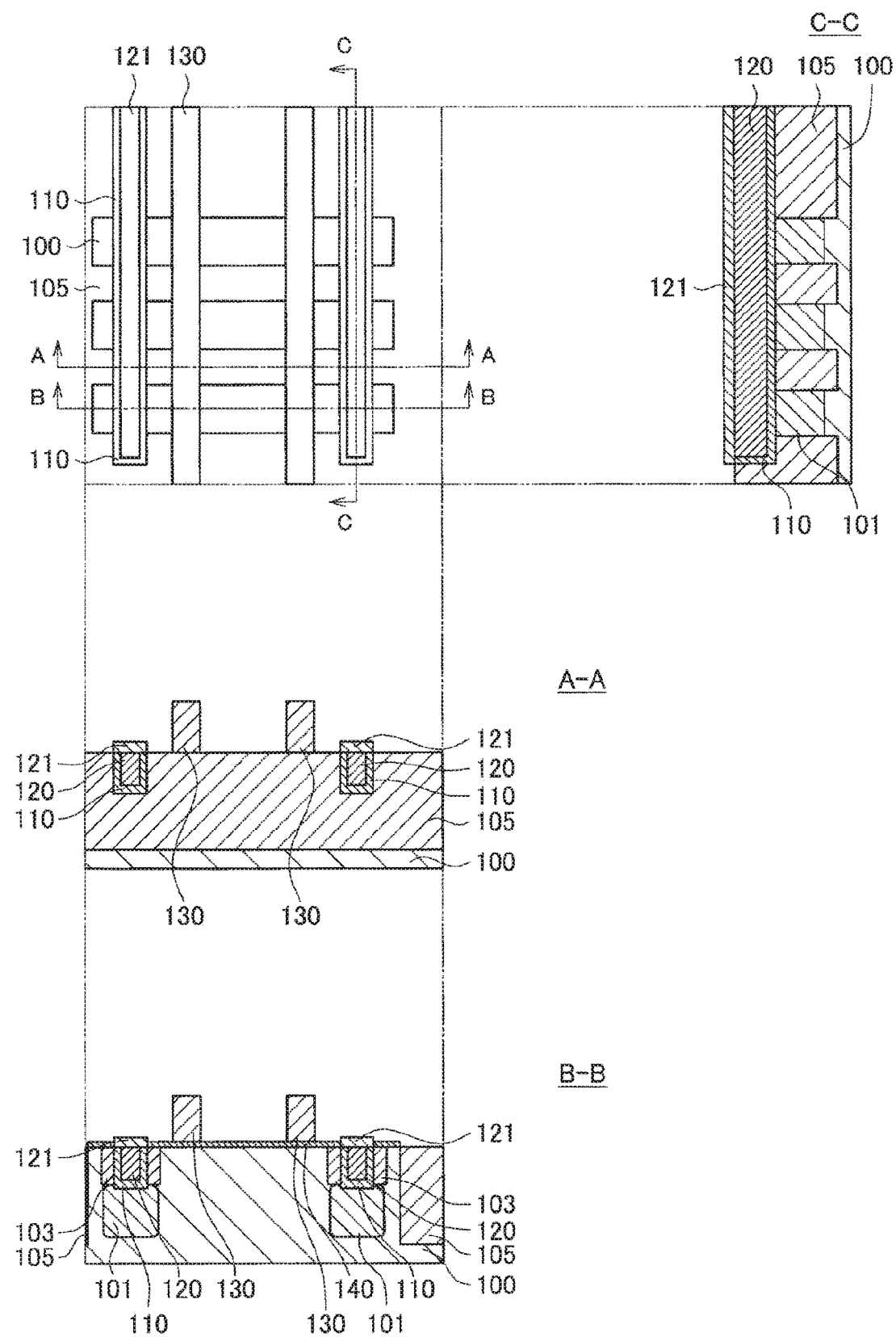
FIG. 12 shows a plan view and cross-sectional views for explaining one step of the first manufacturing method of the semiconductor storage device.

Next, as shown in FIG. 12, the lower gate electrode 130A and the upper gate electrode 130B are patterned to form the gate electrode 130.

Specifically, the gate electrode 130 is formed by performing anisotropy etching on the lower gate electrode 130A and the upper gate electrode 130B by using a patterned resist as a mask. For example, an HBr or Cl-based gas can be used for anisotropy etching. Such anisotropy etching is performed under the condition that a selection ratio of polysilicon forming the lower gate electrode 130A and the upper gate electrode 130B to SiO$_2$ or Si$_3$N$_4$ is high, and thus it is possible to restrain an amount of etching on the cap layer 121 made from Si$_3$N$_4$. For example, for 45 nm nodes, the gate electrode 130 may be formed to have a gate width of approximately 40 nm to 50 nm.

Figure 13:
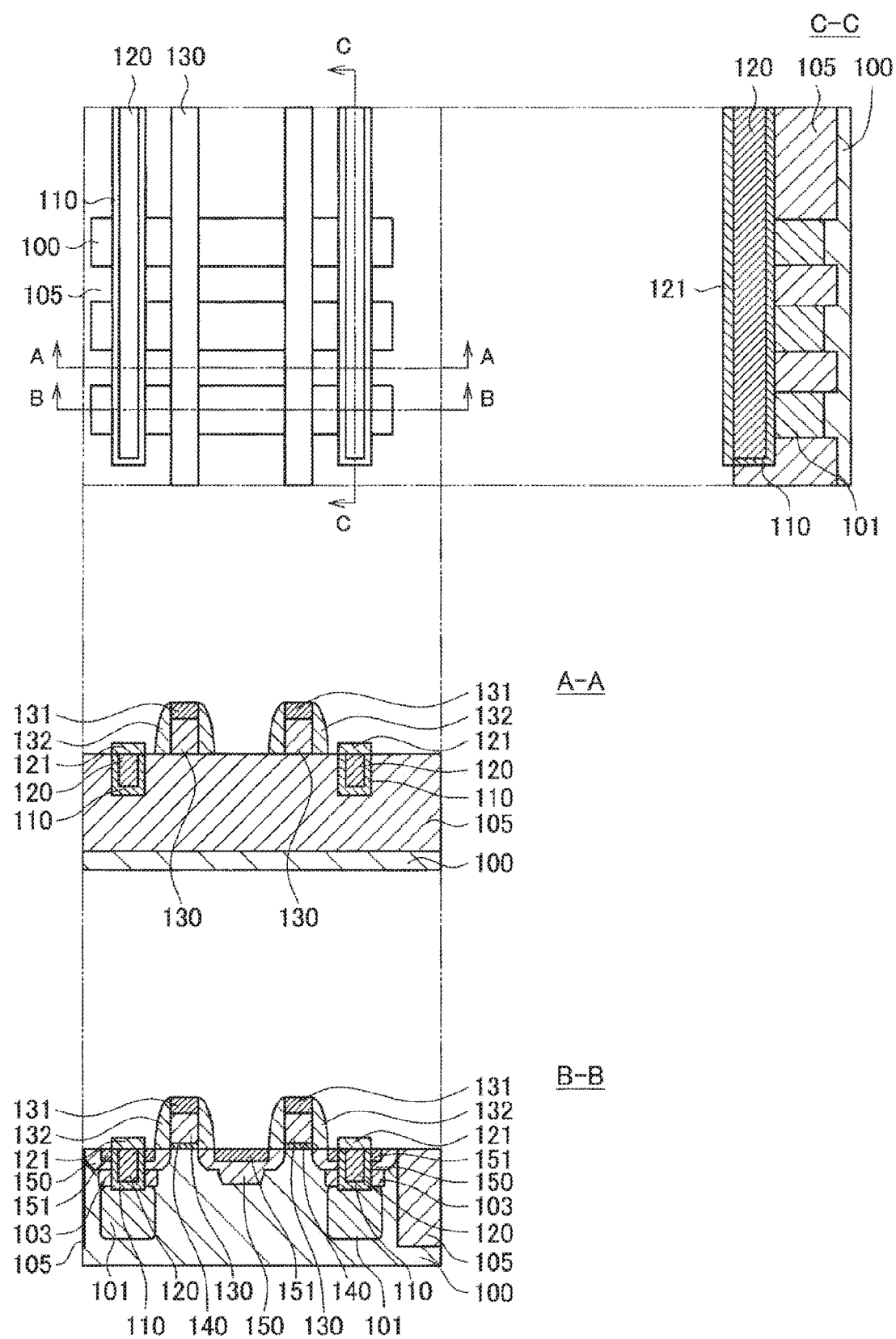
FIG. 13 shows a plan view and cross-sectional views for explaining one step of the first manufacturing method of the semiconductor storage device.

Then, as shown in FIG. 13, the side wall insulating films 132 are formed on both the side surfaces of the gate electrode 130, and thereafter the source or drain regions 150 are formed. Thereafter, the contact layer 131 and the contact regions 151 are formed on the gate electrode 130 and the source or drain regions 150.

Specifically, first, LDD regions are formed on both the sides of the gate electrode 130 by ion-implanting arsenic (As) that is the second conductivity-type impurities at 5 keV to 20 keV at the concentration of 5 to $20 \times 10^{13}$ impurities/cm$^2$. The LDD regions can restrain a short channel effect, and thus it is possible to restrain variations in characteristics of the transistors 21. Note that the second conductivity-type impurities may be phosphorus (P).

Next, a SiO$_2$ film having a film thickness of 10 nm to 30 nm is formed by plasma CVD, and thereafter a Si$_3$N$_4$ film having a film thickness of 30 nm to 50 nm is formed by plasma CVD. Thus, an insulating film for side walls is formed. Thereafter, the insulating film for side walls is subjected to anisotropy etching. In this way, the side wall insulating films 132 are formed on both the side surfaces of the gate electrode 130.

Thereafter, the source or drain regions 150 are formed on both the sides of the gate electrode 130 by ion-implanting arsenic (As) that is the second conductivity-type impurities at 20 keV to 50 keV at the concentration of 1 to $2 \times 10^{15}$ impurities/cm$^2$. Further, the ion-implanted impurities are activated by performing rapid thermal annealing (RTA) at 1000° C. for five seconds. Thus, the transistor 21 is formed. Note that, in order to promote activation of the introduced impurities and to restrain diffusion of the impurities, the impurities can also be activated by spike RTA. Note that, as described above, crystallization annealing with respect to the ferroelectric film 110 may be simultaneously performed in this step.

Further, a Ni film having a film thickness of 6 nm to 8 nm is formed over the whole surface of the semiconductor substrate 100 by sputtering or the like, and thereafter Ni on Si is silicidized by performing RTA at 300° C. to 450° C. for ten seconds to sixty seconds. Ni on $SiO_2$ remains unreacted, and thus, by removing unreacted Ni by using $H_2SO_4/H_2O_2$, it is possible to form the contact layer 131 and the contact regions 151 made from low-resistance NiSi on the gate electrode 130 and the source or drain regions 150. Note that the contact layer 131 and the contact regions 151 may be made from $CoSi_2$ or NiSi by forming a Co or NiPt film, instead of the Ni film. A temperature of RTA employed in a case where the Co or NiPt film is formed may be appropriately set.

Figure 14:
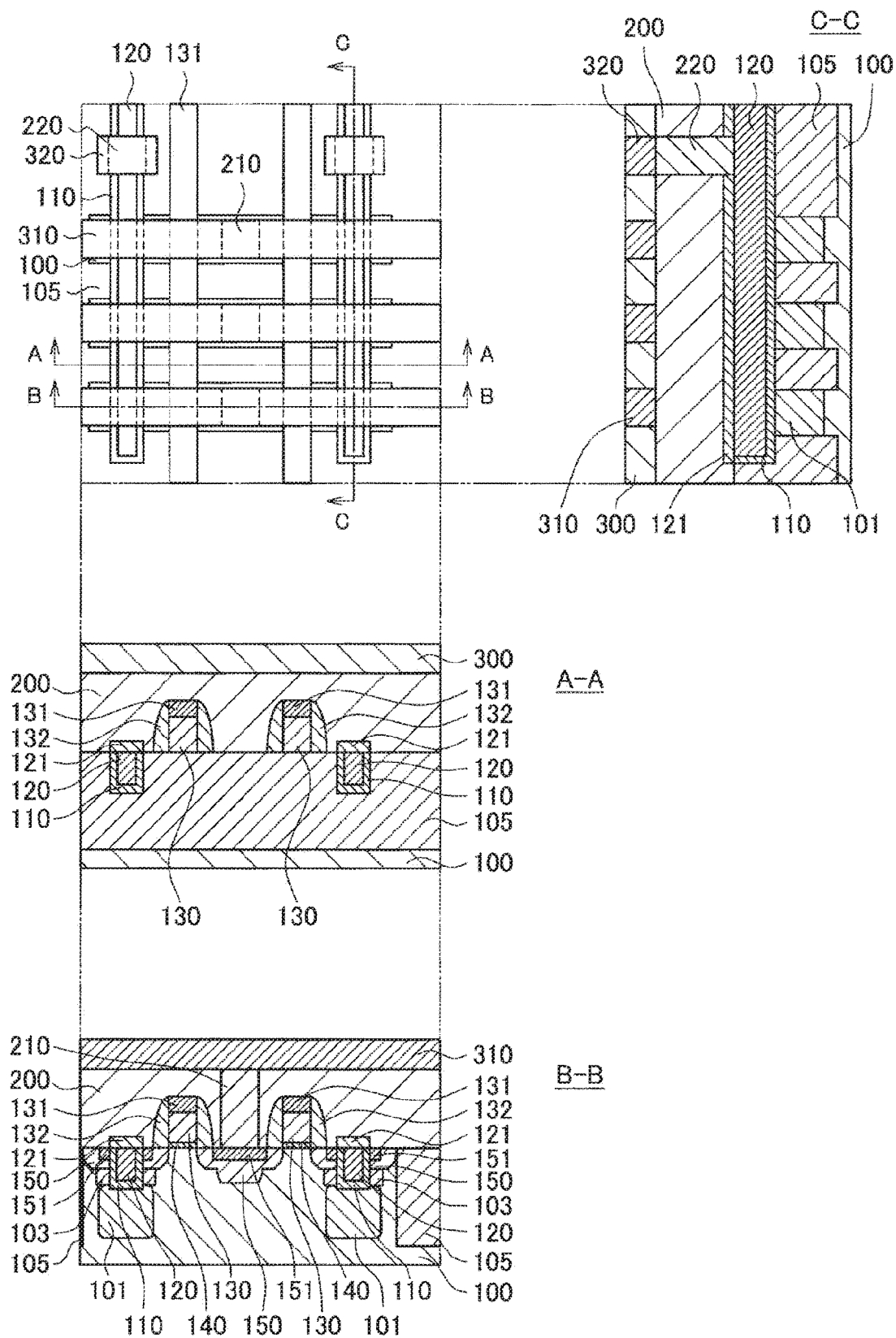
FIG. 14 shows a plan view and cross-sectional views for explaining one step of the first manufacturing method of the semiconductor storage device.

Next, as shown in FIG. 14, the flattening film 200 is formed over the whole surface of the semiconductor substrate 100, and thereafter the contacts 210 and 220 are formed. Further, the first interlayer insulating film 300 is formed over the whole surface of the semiconductor substrate 100, and thereafter the first wiring layers 310 and 320 are formed.

Specifically, a $SiO_2$ film having a film thickness of 100 nm to 500 nm is formed on the semiconductor substrate 100 by CVD or the like, and is then flattened by CMP. Thus, the flattening film 200 is formed. Next, the flattening film 200 is etched to form openings. Then, Ti and TiN films are formed in the openings by CVD or the like, and a W film is further formed thereon. Thereafter, those films are flattened by CMP. Thus, the contacts 210 and 220 are formed. Note that the Ti and TiN films may be formed by sputtering using ion metal plasma (IMP) or other methods. Further, flattening may be performed by the whole surface etching back, instead of CMP.

Herein, the liner layer made from SiN may be formed over the whole surface of the semiconductor substrate 100 before the flattening film 200 is formed. Specifically, a SiN film having a film thickness of 10 nm to 50 nm may be formed by plasma CVD to form the liner layer. Note that the liner layer can also be formed by low pressure CVD or ALD. In a case where the liner layer is provided, etching is performed under the condition that a selection ratio of the liner layer to the flattening film 200 is high. This can improve controllability of etching on the flattening film 200. Further, the liner layer can also be formed as a layer that applies compressive stress or tensile stress.

Further, a $SiO_2$ film having a film thickness of 100 nm to 500 nm is formed over the whole surface on the flattening film 200 by CVD or the like, and is then flattened by CMP. Thus, the first interlayer insulating film 300 is formed. Then, the first interlayer insulating film 300 is etched to form openings to be brought into contact with the contacts 210 and 220, and thereafter the first wiring layers 310 and 320 are formed by employing Cu or the like as a wiring material with the use of a damascene structure or dual damascene structure. Note that the first wiring layers 310 and 320 may be made from Al or the like. Note that the first wiring layer 310 is extended on the contact 210 in the first direction in which the element separation layer 105 extends, thereby functioning as the bit line BL.

Figure 15:
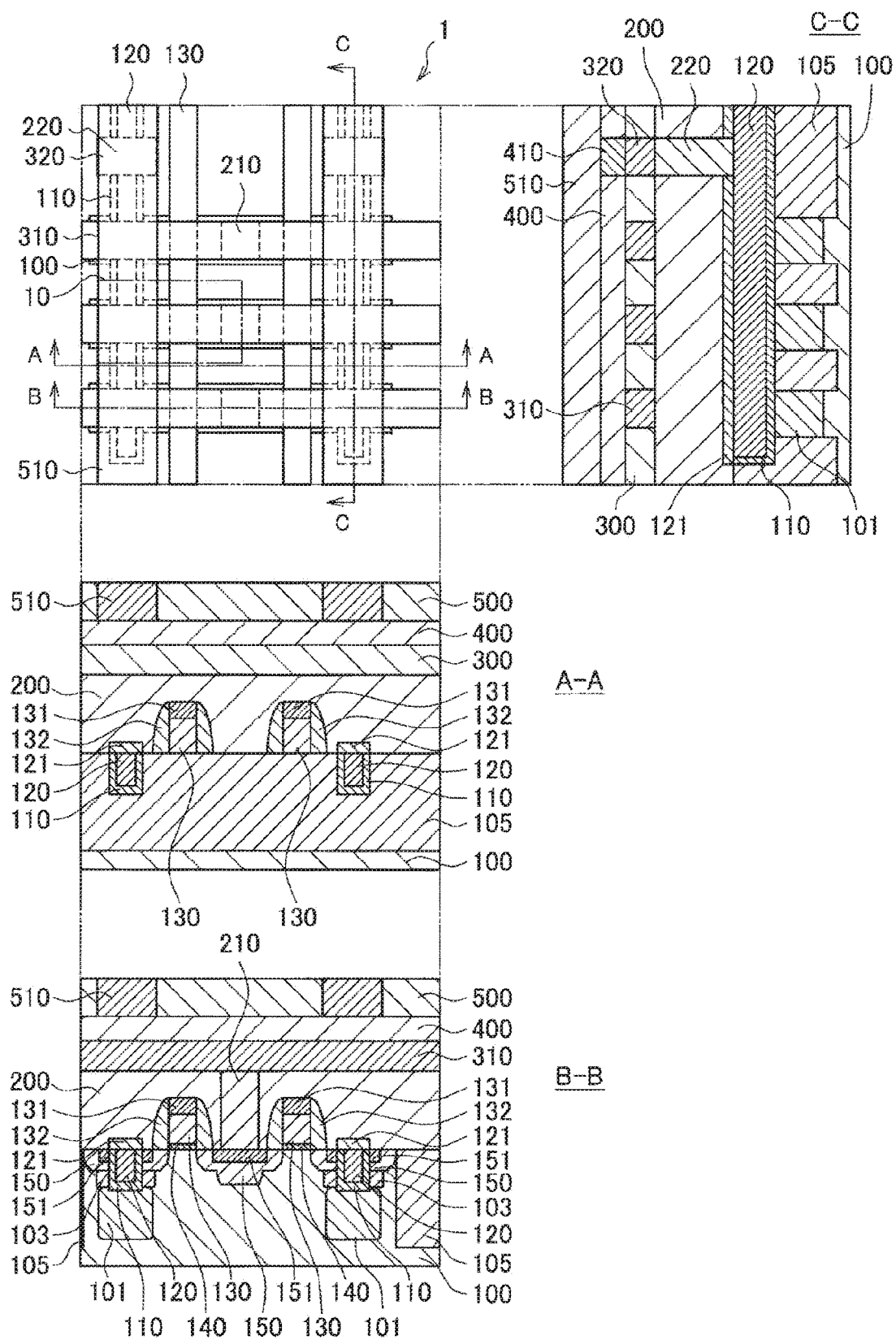
FIG. 15 shows a plan view and cross-sectional views for explaining one step of the first manufacturing method of the semiconductor storage device.

Then, as shown in FIG. 15, the second interlayer insulating film 400 is formed over the whole surface of the semiconductor substrate 100, and thereafter the via 410 is formed. Further, the third interlayer insulating film 500 is formed over the whole surface of the semiconductor substrate 100, and thereafter the second wiring layer 510 is formed.

Specifically, a $SiO_2$ film having a film thickness of 100 nm to 500 nm is formed over the whole surface on the first interlayer insulating film 300 by CVD or the like, and is then flattened by CMP. Thus, the second interlayer insulating film 400 is formed. Then, the second interlayer insulating film 400 is etched to form an opening to be brought into contact with the first wiring layer 320. Next, a TiN film is formed in the formed opening by CVD or the like, and a W film is further formed thereon. Thereafter, those films are flattened by CMP. Thus, the via 410 is formed. Note that the TiN film may be formed by sputtering using IMP or other methods. Further, flattening may be performed by the whole surface etching back, instead of CMP.

Next, a $SiO_2$ film having a film thickness of 100 nm to 500 nm is formed over the whole surface on the second interlayer insulating film 400 by CVD or the like, and is then flattened by CMP. Thus, the third interlayer insulating film 500 is formed. Next, the third interlayer insulating film 500 is etched to form an opening to be brought into contact with the via 410, and thereafter the second wiring layer 510 is formed by employing Cu or the like as a wiring material with the use of a damascene structure or dual damascene structure. Note that the second wiring layer 510 may be made from Al or the like. Note that the second wiring layer 510 is extended on the via 410 in the second direction in which the capacitor electrode 120 extends, thereby functioning as the source line SL.

By the above steps, the semiconductor storage device 10 according to this embodiment can be formed.

(3.2. Second manufacturing method)

Next, a second manufacturing method of the semiconductor storage device 10 according to this embodiment will be described with reference to FIGS. 16 to 19. FIGS. 16 to 19 are plan views and cross-sectional views showing respective steps of the second manufacturing method of the semiconductor storage device 10.

Note that, in FIGS. 16 to 19, as well as in FIG. 2, layers formed over the whole surface of the semiconductor substrate 100 are omitted. Further, each cross-sectional view shows a cross-section obtained by cutting the plan view along the line AA, the line BB, or the line CC.

First, the element separation layer 105 is formed in a step similar to the step described with reference to FIG. 3.

Figure 16:
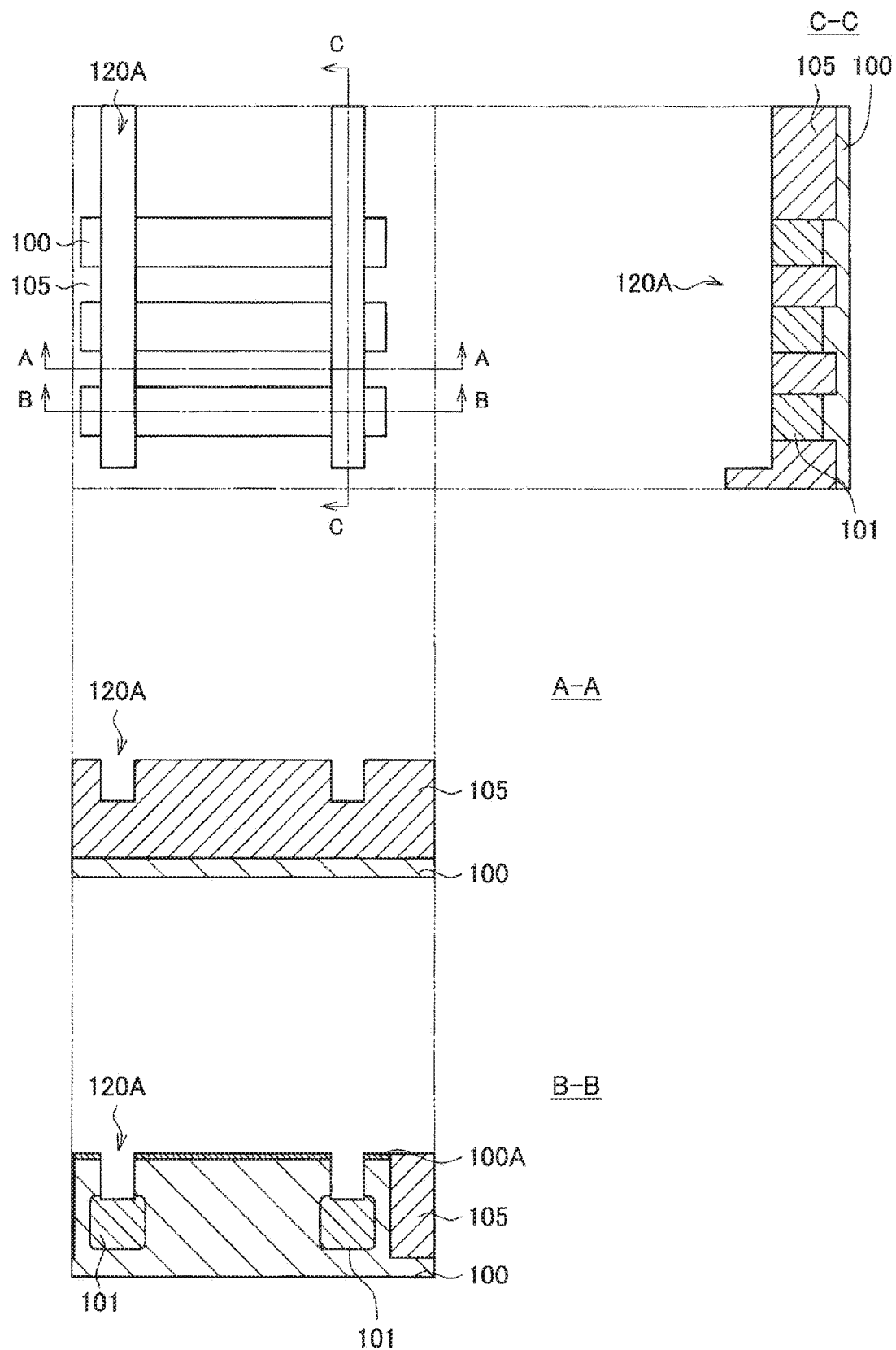
FIG. 16 shows a plan view and cross-sectional views for explaining one step of a second manufacturing method of a semiconductor storage device.

Then, as shown in FIG. 16, the recessed portions 120A extending in the second direction are formed on the semiconductor substrate 100, and ion implantation is performed on the inside of the recessed portions 120A to form the separation regions 101.

Specifically, each recessed portion 120A having a width of 60 nm and a depth of 0 nm to 1200 nm is formed by anisotropy etching in which a resist patterned by lithography is used as a mask. For example, an HBr or Cl-based gas can be used for anisotropy etching. Note that, in a case where an aspect ratio is up to approximately 20, the recessed portion 120A can be smoothly subjected to etching and embedding in the latter step.

Then, the separation region 101 is formed by ion-implanting boron (B) that is the first conductivity-type impurities into the bottom portion of the recessed portion 120A at 5 keV to 50 keV at the concentration of 5 to $20 \times 10^{13}$ impurities/cm$^2$.

Figure 17:
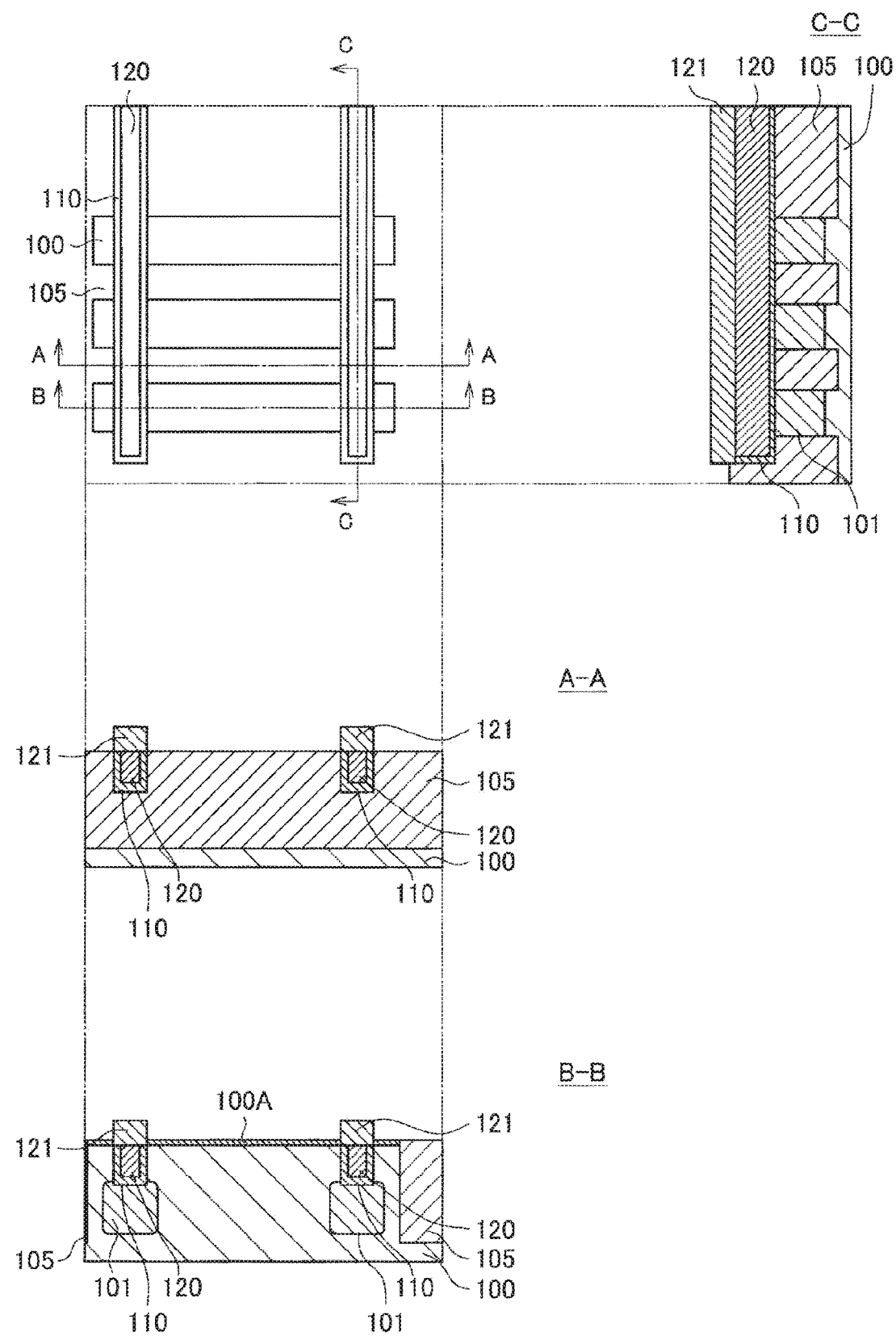
FIG. 17 shows a plan view and cross-sectional views for explaining one step of the second manufacturing method of the semiconductor storage device.

Next, as shown in FIG. 17, the ferroelectric film 110 and the capacitor electrode 120 are formed so as to be embedded in the recessed portion 120A, and thereafter the cap layer 121 is formed on the capacitor electrode 120.

Specifically, a natural oxide film on the recessed portion 120A is peeled off by using a HF solution, and thereafter an interface layer made from SiO$_2$ is formed on the surface of the recessed portion 120A by rapid thermal oxidization (RTO), oxygen plasma treatment, or chemical oxidation treatment using a drug solution such as a hydrogen peroxide solution so as to have a film thickness of 0.5 nm to 1.5 nm. Next, a film of hafnium oxide (HfO$_x$) that is a high dielectric material is formed on the interface layer by CVD or atomic layer deposition (ALD) so as to have a film thickness of 3 nm to 10 nm. Note that hafnium oxide (HfO$_x$) that is a high dielectric material is converted into a ferroelectric material by performing annealing treatment in the latter step.

Note that, instead of hafnium oxide, a high dielectric material such as zirconium oxide (ZrO$_x$) or hafnium zirconium oxide (HfZrO$_x$) can also be used. Further, those high dielectric materials can also be converted into ferroelectric materials by doping lanthanum (La), silicon (Si), gadolinium (Gd), or the like. Furthermore, a perovskite-based ferroelectric material such as lead zirconate titanate (PZT) or strontium bismuth tantalate (SBT) can also be used as the ferroelectric film 110.

Thereafter, a TiN film having a film thickness of 5 nm to 20 nm is formed on the ferroelectric film 110 by CVD, ALD, sputtering, or the like, thereby forming the capacitor electrode 120. Note that TaN can also be used as a material from which the capacitor electrode 120 is made.

Next, the ferroelectric film 110 and the capacitor electrode 120 that have been excessively formed are removed by performing CMP or the whole surface etching back. Thereafter, crystallization annealing is performed for converting HfO$_x$ (high dielectric material at this time) from which the ferroelectric film 110 is made into a ferroelectric material. Note that the crystallization annealing for converting HfO$_x$ into a ferroelectric material may be performed in this step, or may be simultaneously performed in another annealing step. An annealing temperature of the crystallization annealing is changed depending on the type of the high dielectric material from which the ferroelectric film 110 is made or the type of a dopant, but the crystallization annealing only needs to be performed within the range of, for example, 400° C. to 1100° C.

Then, the cap layer 121 is formed by forming a Si$_3$N$_4$ film having a film thickness of approximately 30 nm to 60 nm on the capacitor electrode 120 by low pressure CVD or the like and thereafter performing anisotropy etching.

Figure 18:
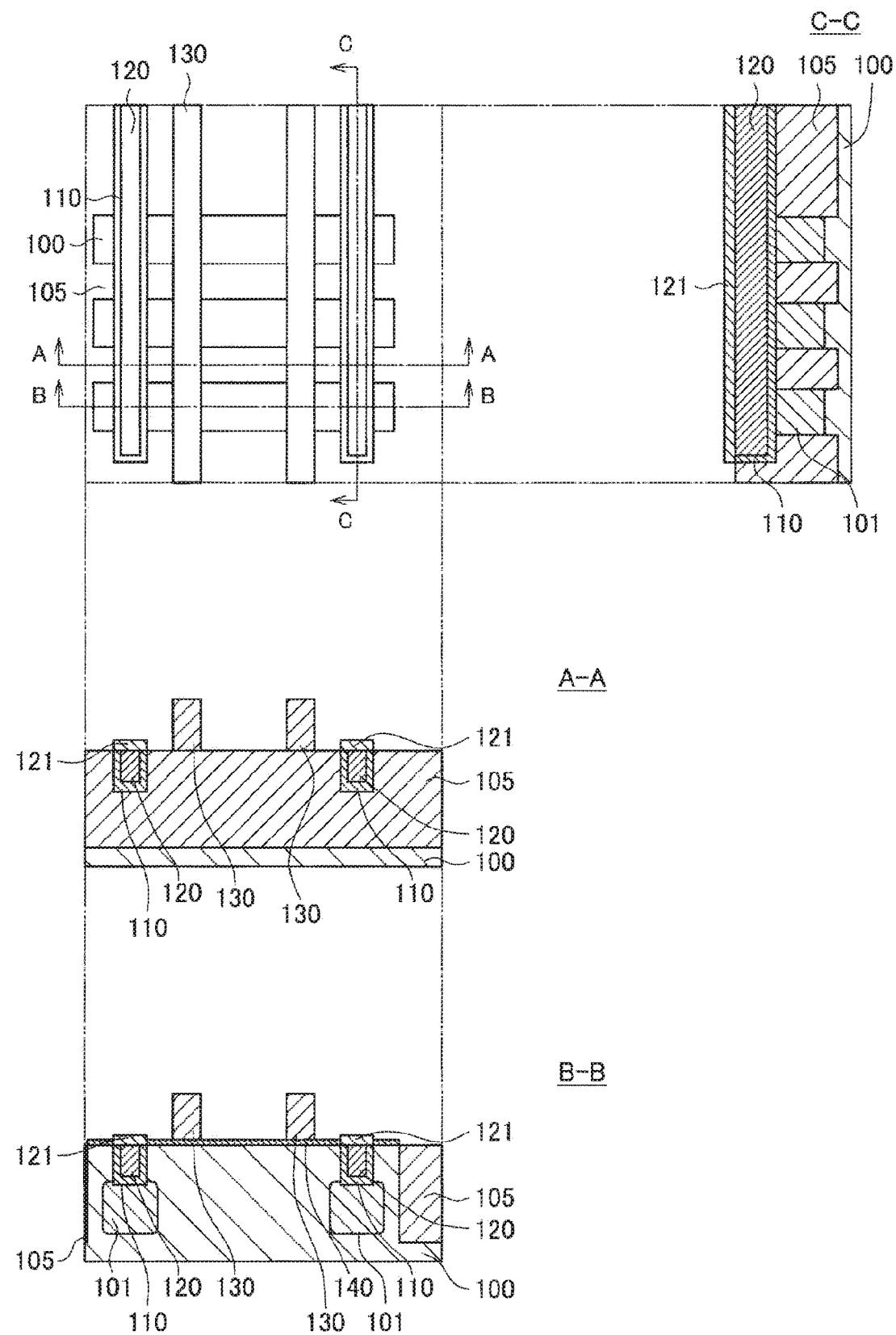
FIG. 18 shows a plan view and cross-sectional views for explaining one step of the second manufacturing method of the semiconductor storage device.

Thereafter, as shown in FIG. 18, the gate insulating film 140 is formed, and thereafter the gate electrode 130 is formed on the gate insulating film 140.

Specifically, the oxide film 100A covering the surface of the semiconductor substrate 100 is peeled off by using a hydrofluoric acid solution or the like. Thereafter, the gate insulating film 140 made from SiO$_2$ is formed on the semiconductor substrate 100 by dry oxidation using O$_2$ of 700° C. or rapid thermal anneal (RTA) treatment so as to have a film thickness of 1.5 nm to 10 nm. Note that the gas for use in dry oxidation may be not only 02 but also a mixture gas of H$_2$/O$_2$ and N$_2$O or NO. Further, when the gate insulating film 140 is formed, nitrogen doping can also be performed in the SiO$_2$ film by plasma nitridation.

Next, a polysilicon film having a film thickness of 50 nm to 150 nm is formed by low pressure CVD in which a SiH$_4$ gas is used as a material gas and a film forming temperature is set to 580° C. to 620° C. Thereafter, the gate electrode 130 is formed by performing anisotropy etching on the formed polysilicon film by using a patterned resist as a mask. For example, an HBr or Cl-based gas can be used for anisotropy etching. For example, for 45 nm nodes, the gate electrode 130 may be formed to have a gate width of approximately 40 nm to 50 nm.

Figure 19:
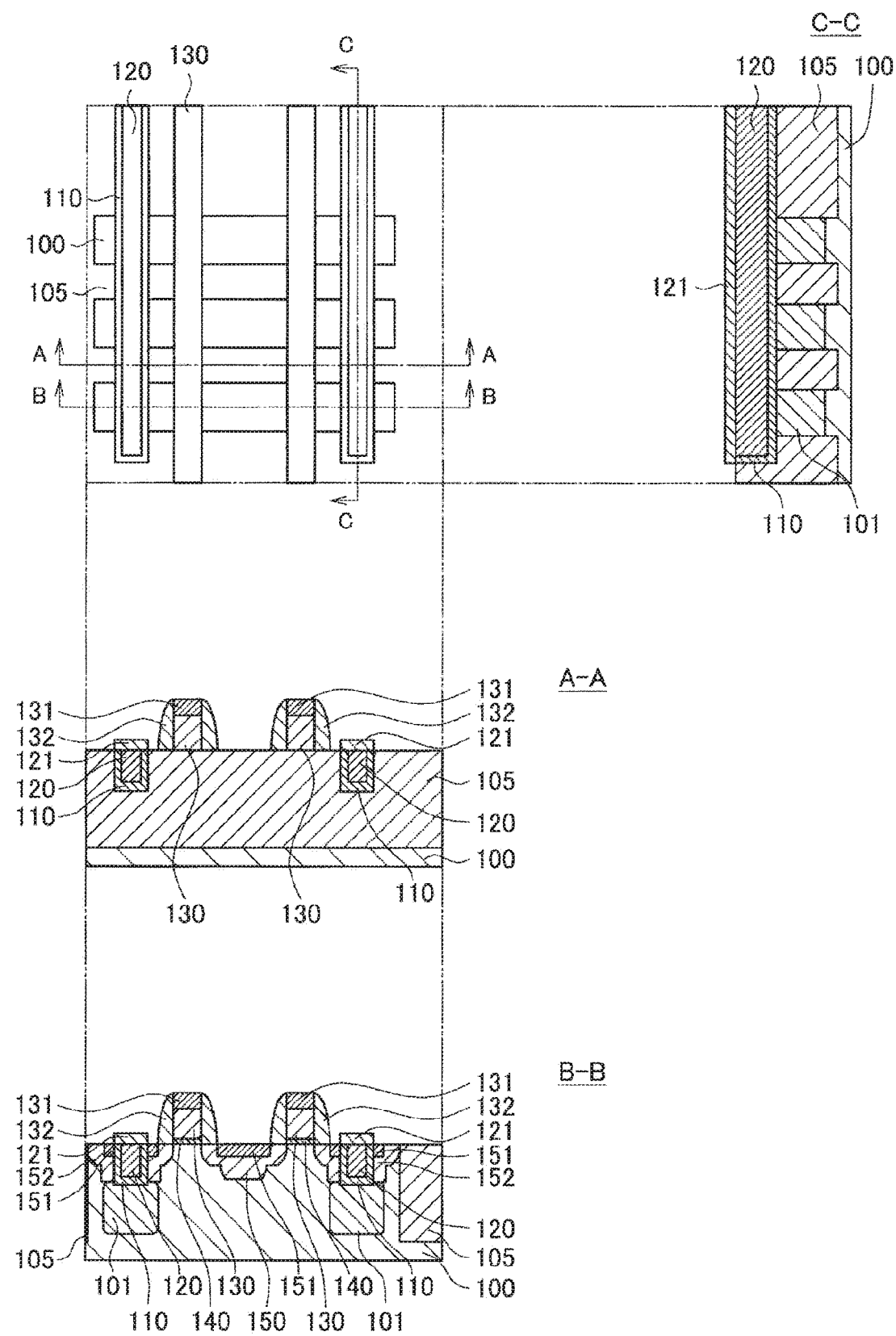
FIG. 19 shows a plan view and cross-sectional views for explaining one step of the second manufacturing method of the semiconductor storage device.

Further, as shown in FIG. 19, the side wall insulating films 132 are formed on both the side surfaces of the gate electrode 130, and thereafter the source or drain regions 152 are formed. Thereafter, the contact layer 131 and the contact regions 151 are formed on the gate electrode 130 and the source or drain regions 152.

Specifically, first, LDD regions are formed on both the sides of the gate electrode 130 by ion-implanting arsenic (As) that is the second conductivity-type impurities at 5 keV to 20 keV at the concentration of 5 to $20 \times 10^{13}$ impurities/cm$^2$. Formation of the LDD regions can restrain a short channel effect, and thus it is possible to restrain variations in characteristics of the transistors 21. Note that the second conductivity-type impurities may be phosphorus (P).

Next, a SiO$_2$ film having a film thickness of 10 nm to 30 nm is formed by plasma CVD, and thereafter a Si$_3$N$_4$ film having a film thickness of 30 nm to 50 nm is formed by plasma CVD. Thus, an insulating film for side walls is formed. Thereafter, the insulating film for side walls is subjected to anisotropy etching. In this way, the side wall insulating films 132 are formed on both the side surfaces of the gate electrode 130.

Thereafter, the source or drain regions 152 are formed on both the sides of the gate electrode 130 by ion-implanting arsenic (As) that is the second conductivity-type impurities at 20 keV to 50 keV at the concentration of 1 to $2 \times 10^{15}$ impurities/cm$^2$. Herein, each source or drain region 152 is formed to expand toward the side of the recessed portion 120A by controlling a condition of ion implantation for forming the source or drain regions 152. With this, the source or drain regions 152 can also function as the electrode region 103 described with reference to FIG. 2. Therefore, the source or drain regions 152, the ferroelectric film 110, and the capacitor electrode 120 form the capacitor 11.

Further, the ion-implanted impurities are activated by performing rapid thermal annealing (RTA) at 1000° C. for five seconds. Thus, the transistor 21 is formed. Note that, in order to promote activation of the introduced impurities and to restrain diffusion of the impurities, it is also possible to perform spike RTA. Note that, as described above, crystallization annealing with respect to the ferroelectric film 110 may be simultaneously performed in this step.

Further, a Ni film having a film thickness of 6 nm to 8 nm is formed over the whole surface of the semiconductor substrate 100 by sputtering or the like, and thereafter Ni on Si is silicidized by performing RTA at 300° C. to 450° C. for ten seconds to sixty seconds. Ni on SiO$_2$ remains unreacted, and thus, by removing unreacted Ni by using H$_2$SO$_4$/H$_2$O$_2$, it is possible to form the contact layer 131 and the contact regions 151 made from low-resistance NiSi on the gate electrode 130 and the source or drain regions 152. Note that the contact layer 131 and the contact regions 151 may be made from CoSi$_2$ or NiSi by forming a Co or NiPt film, instead of the Ni film. A temperature of RTA employed in a case where the Co or NiPt film is formed may be appropriately set.

Thereafter, the flattening film 200, the contacts 210 and 220, the first interlayer insulating film 300, the first wiring layers 310 and 320, the second interlayer insulating film 400, the vias 410, the third interlayer insulating film 500, and the second wiring layer 510 can be formed in steps similar to the steps described with reference to FIGS. 14 and 15.

Also by the above steps, the semiconductor storage device 10 according to this embodiment can be formed.

(3.3. Third Manufacturing Method)

Next, a third manufacturing method of the semiconductor storage device 10 according to this embodiment will be described with reference to FIGS. 20 to 24. FIGS. 20 to 24 are plan views and cross-sectional views showing respective steps of the third manufacturing method of the semiconductor storage device 10.

Note that, in FIGS. 20 to 24, as well as in FIG. 2, layers formed over the whole surface of the semiconductor substrate 100 are omitted. Further, each cross-sectional view shows a cross-section obtained by cutting the plan view along the line AA, the line BB, or the line CC.

First, the element separation layer 105 is formed in a step similar to the step described with reference to FIG. 3.

Figure 20:
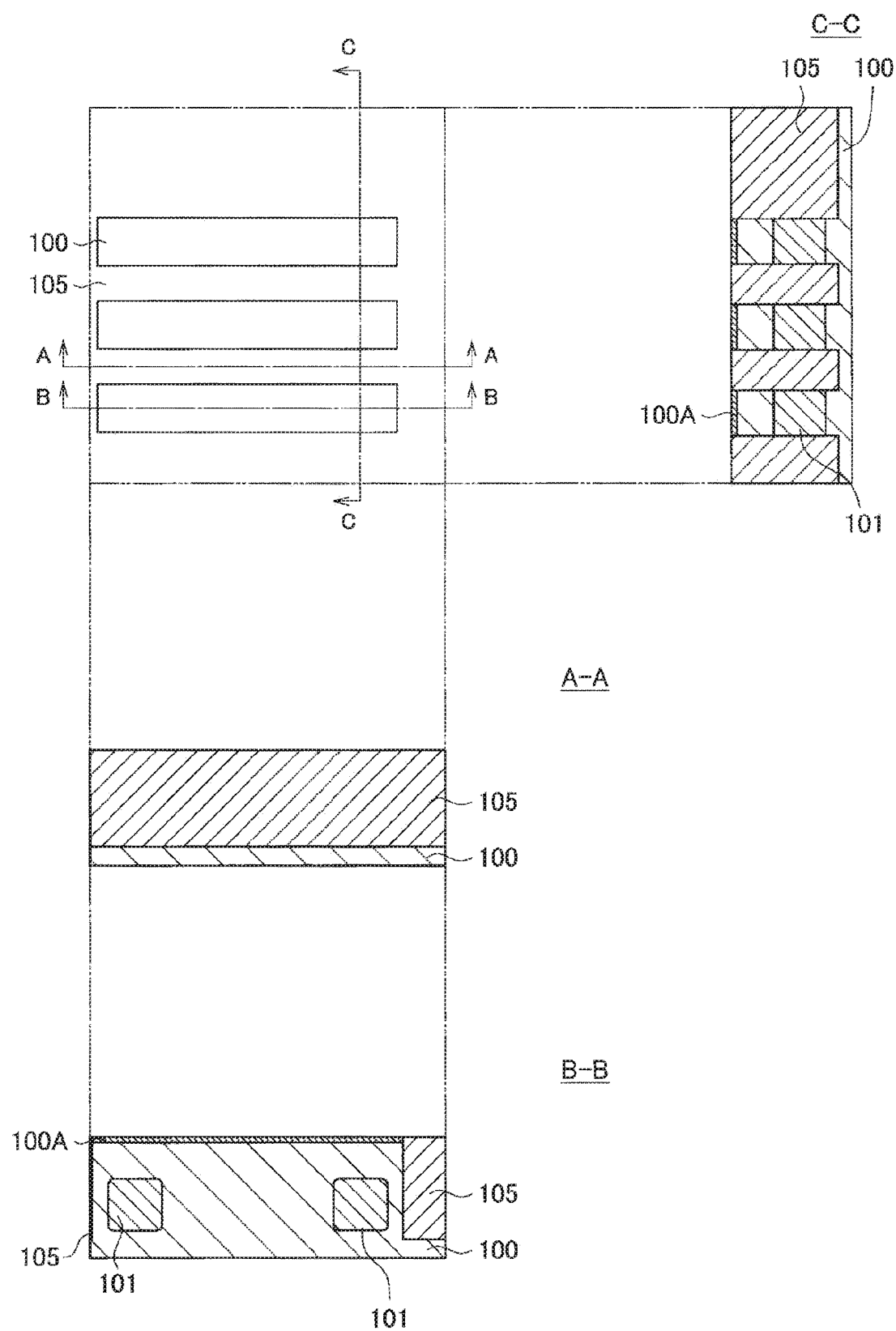
FIG. 20 shows a plan view and cross-sectional views for explaining one step of a third manufacturing method of a semiconductor storage device.

Then, as shown in FIG. 20, ion implantation is performed on inside of the semiconductor substrate 100 to form the separation regions 101.

Specifically, each separation region 101 is formed by ion-implanting boron (B) that is the first conductivity-type impurities into the semiconductor substrate 100 at 20 keV to 300 keV at the concentration of 5 to $20 \times 10^{13}$ impurities/cm$^2$. Herein, a range of ions to be implanted is appropriately adjusted so that the separation region 101 is provided in a region corresponding to a portion under the recessed portion 120A which is formed in the latter step.

Figure 21:
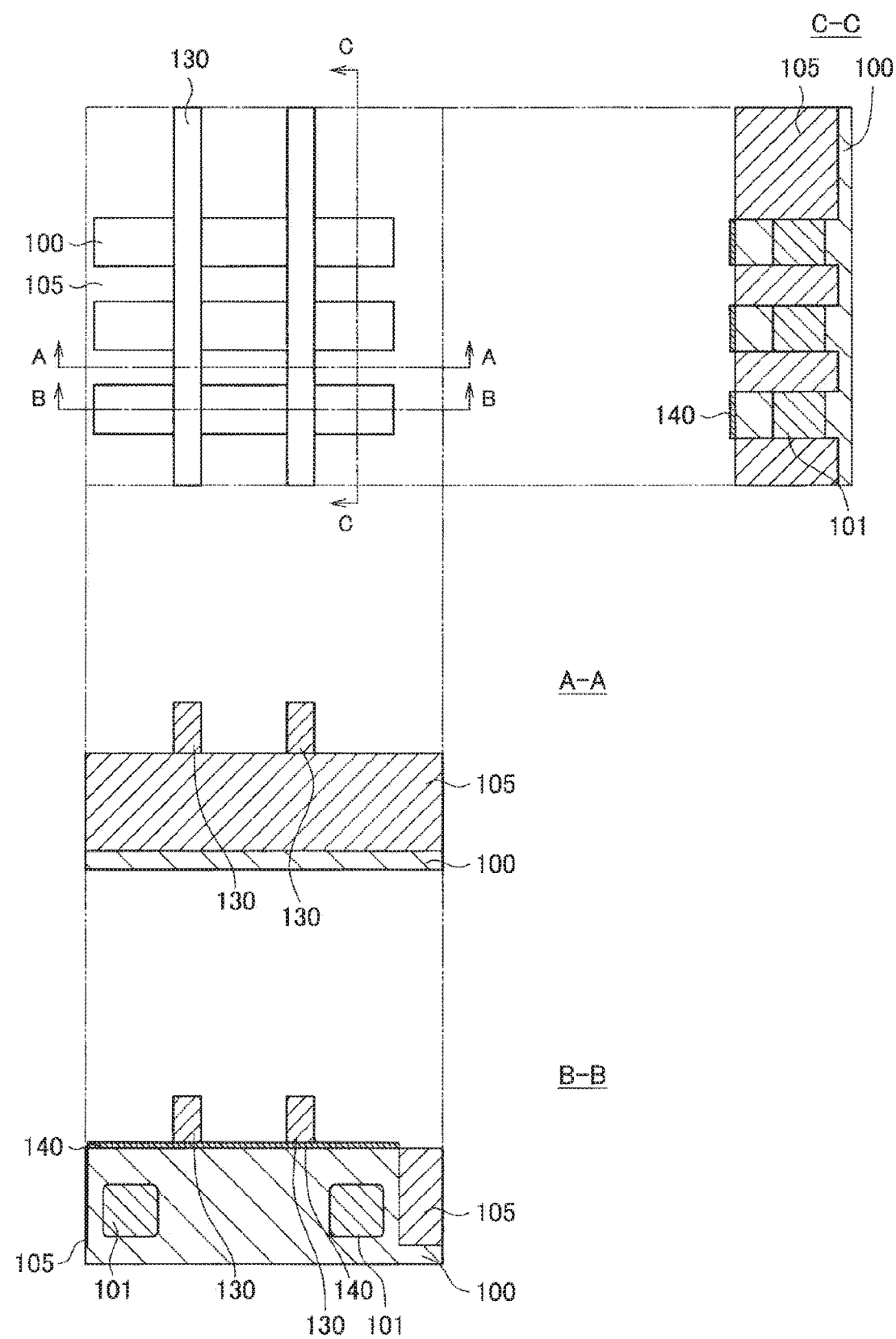
FIG. 21 shows a plan view and cross-sectional views for explaining one step of the third manufacturing method of the semiconductor storage device.

Next, as shown in FIG. 21, the gate insulating film 140 is formed, and thereafter the gate electrode 130 is formed on the gate insulating film 140.

Specifically, the oxide film 100A covering the surface of the semiconductor substrate 100 is peeled off by using a hydrofluoric acid solution or the like. Thereafter, the gate insulating film 140 made from SiO$_2$ is formed on the semiconductor substrate 100 by dry oxidation using O$_2$ of 700° C. or rapid thermal anneal (RTA) treatment so as to have a film thickness of 1.5 nm to 10 nm. Note that the gas for use in dry oxidation may be not only 02 but also a mixture gas of H$_2$/O$_2$ and N$_2$O or NO. Further, when the gate insulating film 140 is formed, nitrogen doping can also be performed in the SiO$_2$ film by plasma nitridation.

Next, a polysilicon film having a film thickness of 50 nm to 150 nm is formed by low pressure CVD in which a SiH$_4$ gas is used as a material gas and a film forming temperature is set to 580° C. to 620° C. Thereafter, the gate electrode 130 is formed by performing anisotropy etching on the formed polysilicon film by using a patterned resist as a mask. For example, an HBr or Cl-based gas can be used for anisotropy etching. For example, for 45 nm nodes, the gate electrode 130 may be formed to have a gate width of approximately 40 nm to 50 nm.

Figure 22:
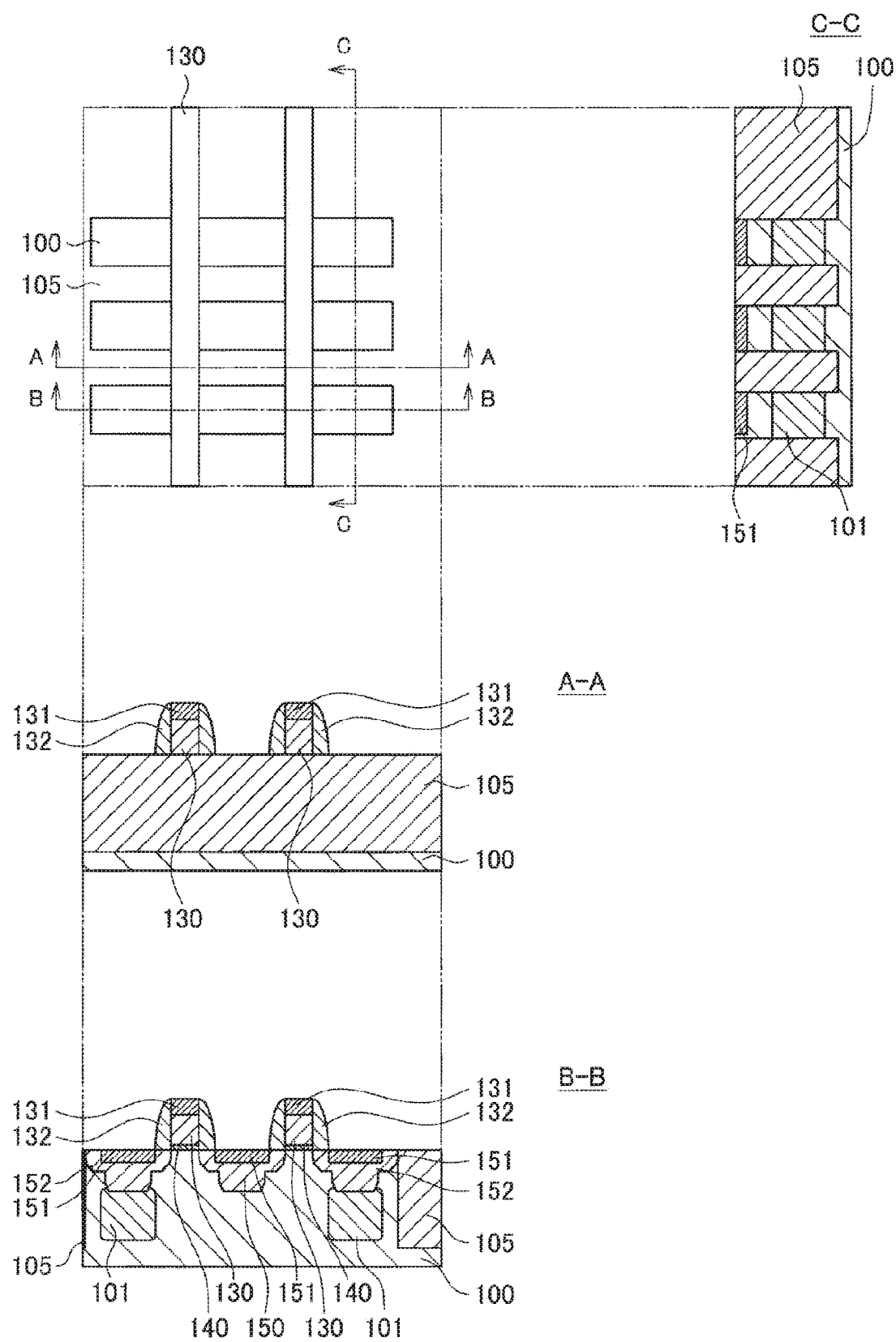
FIG. 22 shows a plan view and cross-sectional views for explaining one step of the third manufacturing method of the semiconductor storage device.

Further, as shown in FIG. 22, the side wall insulating films 132 are formed on both the side surfaces of the gate electrode 130, and thereafter the source or drain regions 152 are formed. Thereafter, the contact layer 131 and the contact regions 151 are formed on the gate electrode 130 and the source or drain regions 152.

Specifically, first, LDD regions are formed on both the sides of the gate electrode 130 by ion-implanting arsenic (As) that is the second conductivity-type impurities at 5 keV to 20 keV at the concentration of 5 to $20 \times 10^{13}$ impurities/cm$^2$. The LDD regions can restrain a short channel effect, and thus it is possible to restrain variations in characteristics of the transistors 21. Note that the second conductivity-type impurities may be phosphorus (P).

Next, a SiO$_2$ film having a film thickness of 10 nm to 30 nm is formed by plasma CVD, and thereafter a Si$_3$N$_4$ film having a film thickness of 30 nm to 50 nm is formed by plasma CVD. Thus, an insulating film for side walls is formed. Thereafter, the insulating film for side walls is subjected to anisotropy etching. In this way, the side wall insulating films 132 are formed on both the side surfaces of the gate electrode 130.

Thereafter, the source or drain regions 152 are formed on both the sides of the gate electrode 130 by ion-implanting arsenic (As) that is the second conductivity-type impurities at 20 keV to 50 keV at the concentration of 1 to $2 \times 10^{15}$ impurities/cm$^2$. Herein, each source or drain region 152 is formed to expand toward the separation region 101 by controlling the condition of ion implantation for forming the source or drain regions 152. With this, the source or drain regions 152 can also function as the electrode region 103 described with reference to FIG. 2.

Further, the ion-implanted impurities are activated by performing rapid thermal annealing (RTA) at 1000° C. for five seconds. Thus, the transistor 21 is formed. Note that, in order to promote activation of the introduced impurities and to restrain diffusion of the impurities, it is also possible to perform spike RTA. Note that, as described above, crystallization annealing with respect to the ferroelectric film 110 may be simultaneously performed in this step.

Further, a Ni film having a film thickness of 6 nm to 8 nm is formed over the whole surface of the semiconductor substrate 100 by sputtering or the like, and thereafter Ni on Si is silicidized by performing RTA at 300° C. to 450° C. for ten seconds to sixty seconds. Ni on SiO$_2$ remains unreacted, and thus, by removing unreacted Ni by using H$_2$SO$_4$/H$_2$O$_2$, it is possible to form the contact layer 131 and the contact regions 151 made from low-resistance NiSi on the gate electrode 130 and the source or drain regions 152. Note that the contact layer 131 and the contact regions 151 may be made from CoSi$_2$ or NiSi by forming a Co or NiPt film, instead of the Ni film. A temperature of RTA employed in a case where the Co or NiPt film is formed may be appropriately set.

Figure 23:
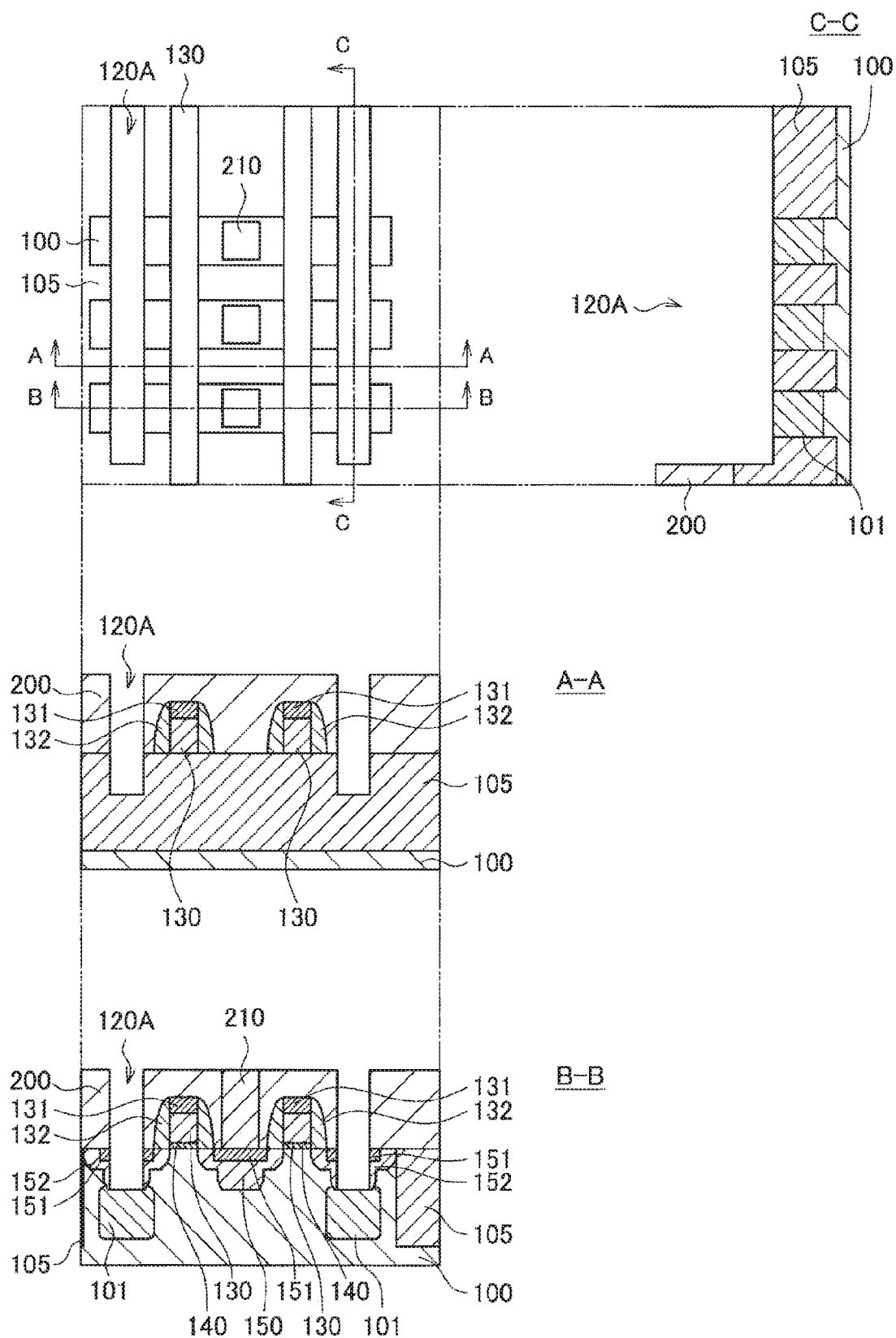
FIG. 23 shows a plan view and cross-sectional views for explaining one step of the third manufacturing method of the semiconductor storage device.

Next, as shown in FIG. 23, the flattening film 200 is formed over the whole surface of the semiconductor substrate 100, and thereafter the contact 210 is formed. Thereafter, the recessed portion 120A that penetrates the flattening film 200 and the semiconductor substrate 100 and extends in the second direction is formed.

Specifically, a SiO$_2$ film having a film thickness of 100 nm to 500 nm is formed on the semiconductor substrate 100 by CVD or the like, and is then flattened by CMP. Thus, the flattening film 200 is formed. Next, the flattening film 200 is etched to form an opening. Then, Ti and TiN films are formed in the openings by CVD or the like, and a W film is further formed thereon. Thereafter, those films are flattened by CMP. Thus, the contact 210 is formed. Note that the Ti and TiN films may be formed by sputtering using ion metal plasma (IMP) or other methods. Further, flattening may be performed by the whole surface etching back, instead of CMP.

Herein, the liner layer made from SiN may be formed over the whole surface of the semiconductor substrate 100 before the flattening film 200 is formed. Specifically, a SiN film having a film thickness of 10 nm to 50 nm may be formed by plasma CVD to form the liner layer. The liner layer can also be formed as a layer that applies compressive stress or tensile stress.

Thereafter, each recessed portion 120A having a width of 60 nm and a depth of 0 nm to 1200 nm is formed by anisotropy etching in which a resist patterned by lithography is used as a mask. For example, a fluorocarbon-based gas can be used for anisotropy etching. Note that, in a case where an aspect ratio is up to approximately 20, the recessed portion 120A can be smoothly subjected to etching and embedding in the latter step.

Figure 24:
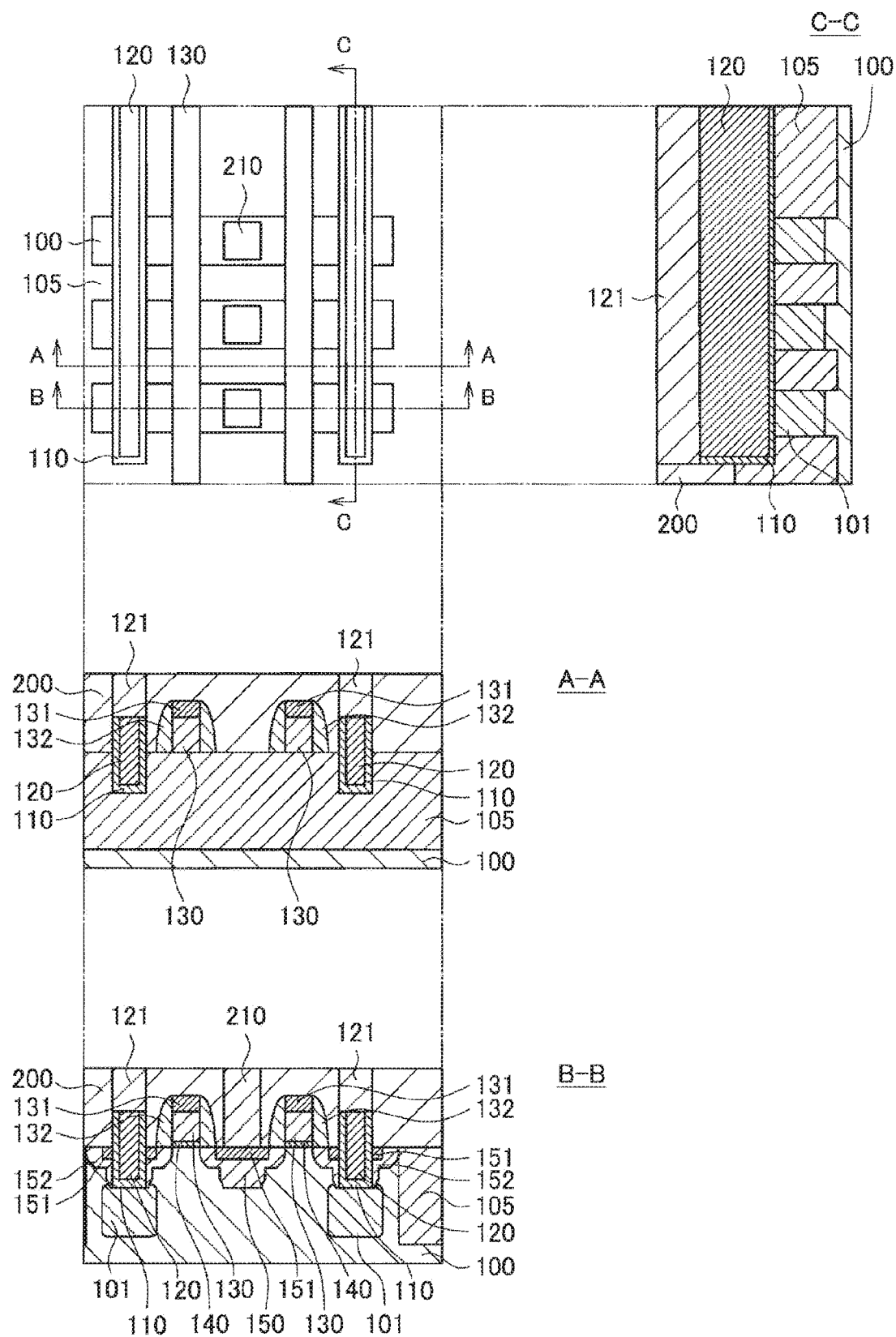
FIG. 24 shows a plan view and cross-sectional views for explaining one step of the third manufacturing method of the semiconductor storage device.

Then, as shown in FIG. 24, the ferroelectric film 110 and the capacitor electrode 120 are formed so as to be embedded in the recessed portion 120A, and thereafter the cap layer 121 is formed on the capacitor electrode 120.

Specifically, a natural oxide film on the recessed portion 120A is peeled off by using a HF solution, and thereafter an interface layer made from $SiO_2$ is formed on the surface of the recessed portion 120A by rapid thermal oxidization (RTO), oxygen plasma treatment, or chemical oxidation treatment using a drug solution such as a hydrogen peroxide solution so as to have a film thickness of 0.5 nm to 1.5 nm. Next, a film of hafnium oxide ($HfO_x$) that is a high dielectric material is formed on the interface layer by CVD or atomic layer deposition (ALD) so as to have a film thickness of 3 nm to 10 nm. Note that hafnium oxide ($HfO_x$) that is a high dielectric material is converted into a ferroelectric material by performing annealing treatment in the latter step.

Note that, instead of hafnium oxide, a high dielectric material such as zirconium oxide ($ZrO_x$) or hafnium zirconium oxide ($HfZrO_x$) can also be used. Further, those high dielectric materials can also be converted into ferroelectric materials by doping lanthanum (La), silicon (Si), gadolinium (Gd), or the like. Furthermore, a perovskite-based ferroelectric material such as lead zirconate titanate (PZT) or strontium bismuth tantalate (SBT) can also be used as the ferroelectric film 110.

Thereafter, a TiN film having a film thickness of 5 nm to 20 nm is formed on the ferroelectric film 110 by CVD, ALD, sputtering, or the like, thereby forming the capacitor electrode 120. Note that TaN can also be used as a material from which the capacitor electrode 120 is made.

Next, the ferroelectric film 110 and the capacitor electrode 120 that have been excessively formed on the flattening film 200 are removed by performing CMP or the whole surface etching back. Thereafter, crystallization annealing is performed for converting $HfO_x$ (high dielectric material at this time) from which the ferroelectric film 110 is made into a ferroelectric material. Note that the crystallization annealing for converting $HfO_x$ into a ferroelectric material may be performed in this step, or may be simultaneously performed in another annealing step. An annealing temperature of the crystallization annealing is changed depending on the type of the high dielectric material from which the ferroelectric film 110 is made or the type of a dopant, but crystallization annealing only needs to be performed within the range of, for example, 400° C. to 800° C.

Then, the ferroelectric film 110 and the capacitor electrode 120 are etched at a predetermined depth by anisotropy etching, thereby forming a recess. A depth of the recess can be arbitrarily adjusted. Thereafter, the cap layer 121 is formed by forming a $Si_3N_4$ film having a film thickness of approximately 30 nm to 60 nm on the capacitor electrode 120 by low pressure CVD or the like and thereafter performing anisotropy etching.

Thereafter, the contacts 220, the first interlayer insulating film 300, the first wiring layers 310 and 320, the second interlayer insulating film 400, the vias 410, the third interlayer insulating film 500, and the second wiring layer 510 can be formed in steps similar to the steps described with reference to FIGS. 14 and 15.

Also by the above steps, the semiconductor storage device 10 according to this embodiment can be formed.

(3.4. Fourth Manufacturing Method)

Next, a fourth manufacturing method of the semiconductor storage device 10 according to this embodiment will be described with reference to FIGS. 25 to 31. FIGS. 25 to 31 are plan views and cross-sectional views showing respective steps of the fourth manufacturing method of the semiconductor storage device 10.

Note that, in FIGS. 25 to 31, as well as in FIG. 2, layers formed over the whole surface of the semiconductor substrate 100 are omitted. Further, each cross-sectional view shows a cross-section obtained by cutting the plan view along the line AA, the line BB, or the line CC.

In the first to third manufacturing methods, one of the electrodes forming the capacitor 11 is formed as the second conductivity-type region in the semiconductor substrate 100. Meanwhile, in the fourth manufacturing method, both the electrodes forming the capacitor 11 are made from a conductive material such as a metal. That is, the fourth manufacturing method is different from the first to third manufacturing methods in that an electrode layer 111 made from a conductive material such as a metal is provided between the electrode region 103 and the ferroelectric film 110.

First, the element separation layer 105, the gate insulating film 140, the lower gate electrode 130A, the protective layer 161, and the recessed portions 120A are formed in steps similar to the steps described with reference to FIGS. 3 to 5.

Figure 25:
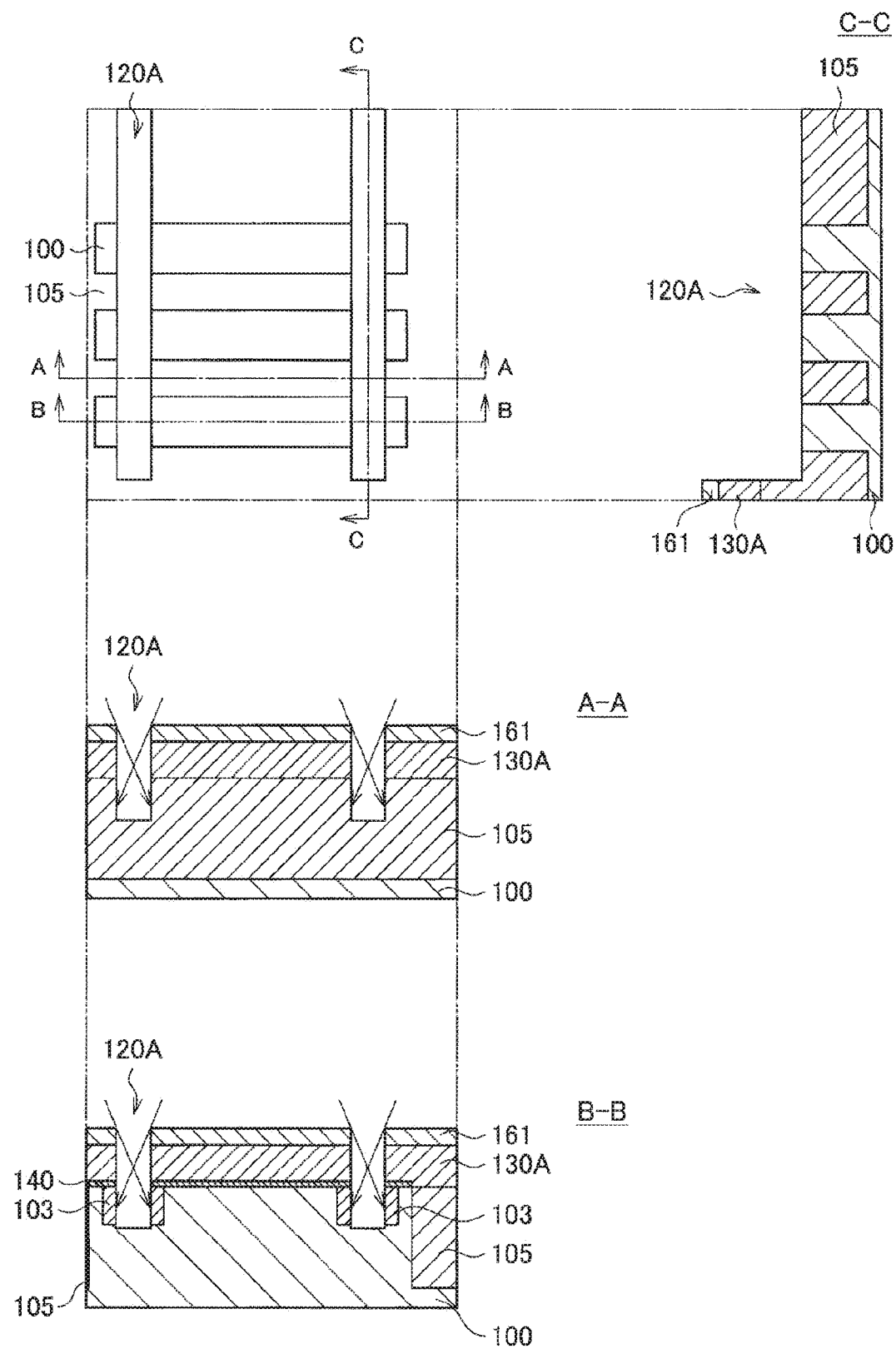
FIG. 25 shows a plan view and cross-sectional views for explaining one step of a fourth manufacturing method of a semiconductor storage device.

Next, as shown in FIG. 25, ion implantation is performed on the inside of each recessed portion 120A to form the electrode regions 103.

Specifically, each electrode region 103 is formed by obliquely ion-implanting arsenic (As) that is the second conductivity-type impurities into the recessed portion 120A at 10 keV to 50 keV at the concentration of 5 to $20 \times 10^{14}$ impurities/$cm^2$. An angle of the oblique ion implantation can be adjusted depending on the width and depth of the recessed portion 120A so that ion implantation is performed on the inner surface of the recessed portion 120A. The angle of the oblique ion implantation may be, for example, 10° to 45°.

Figure 26:
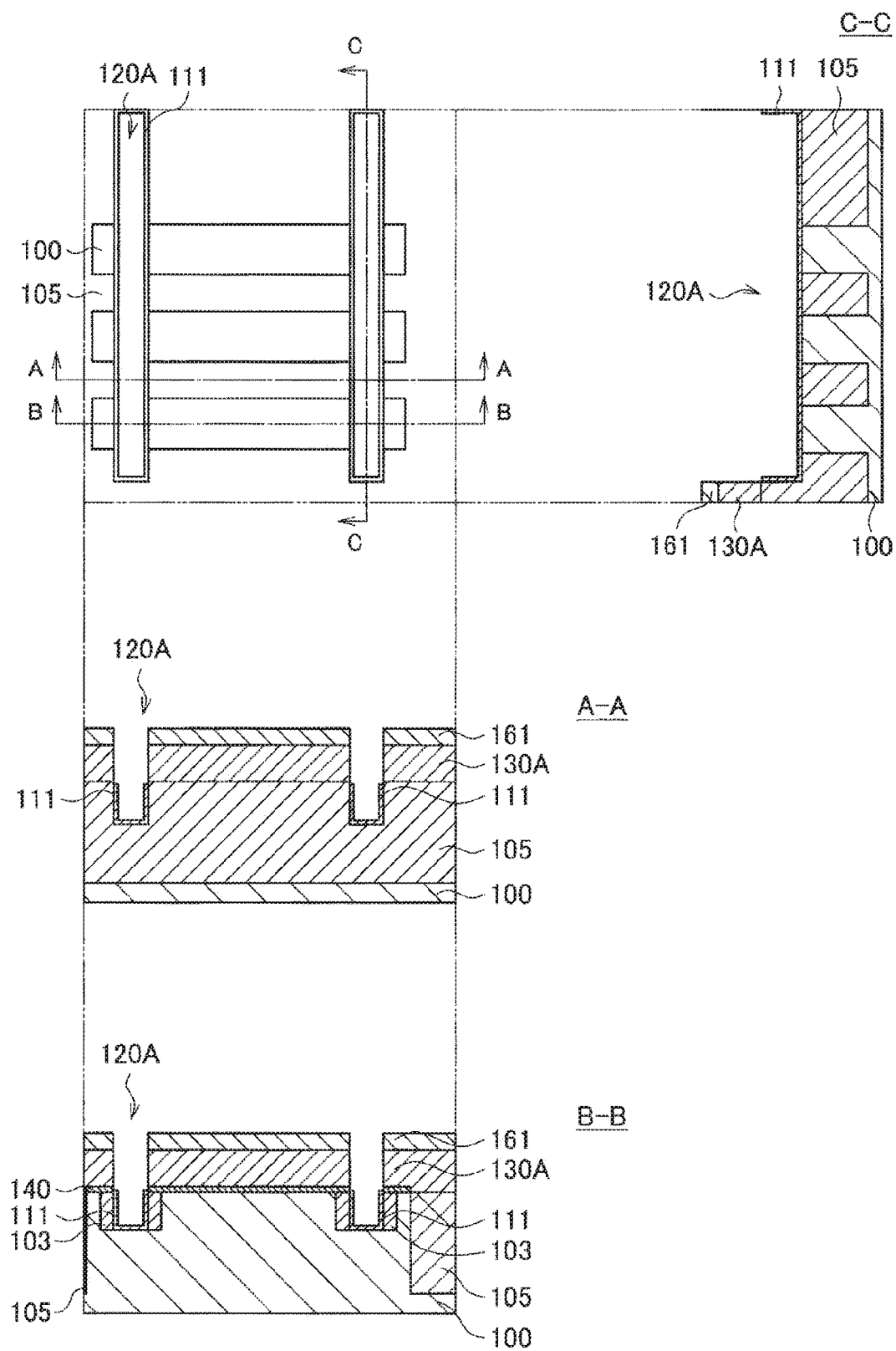
FIG. 26 shows a plan view and cross-sectional views for explaining one step of the fourth manufacturing method of the semiconductor storage device.

Then, as shown in FIG. 26, the electrode layer 111 is formed in the recessed portion 120A.

Specifically, a TiN film having a film thickness of 5 nm to 20 nm is formed by CVD, ALD, sputtering, or the like on the inner surface of the recessed portion 120A. Thus, the electrode layer 111 is formed. Note that TaN can also be used as a material from which the electrode layer 111 is made.

Figure 27:
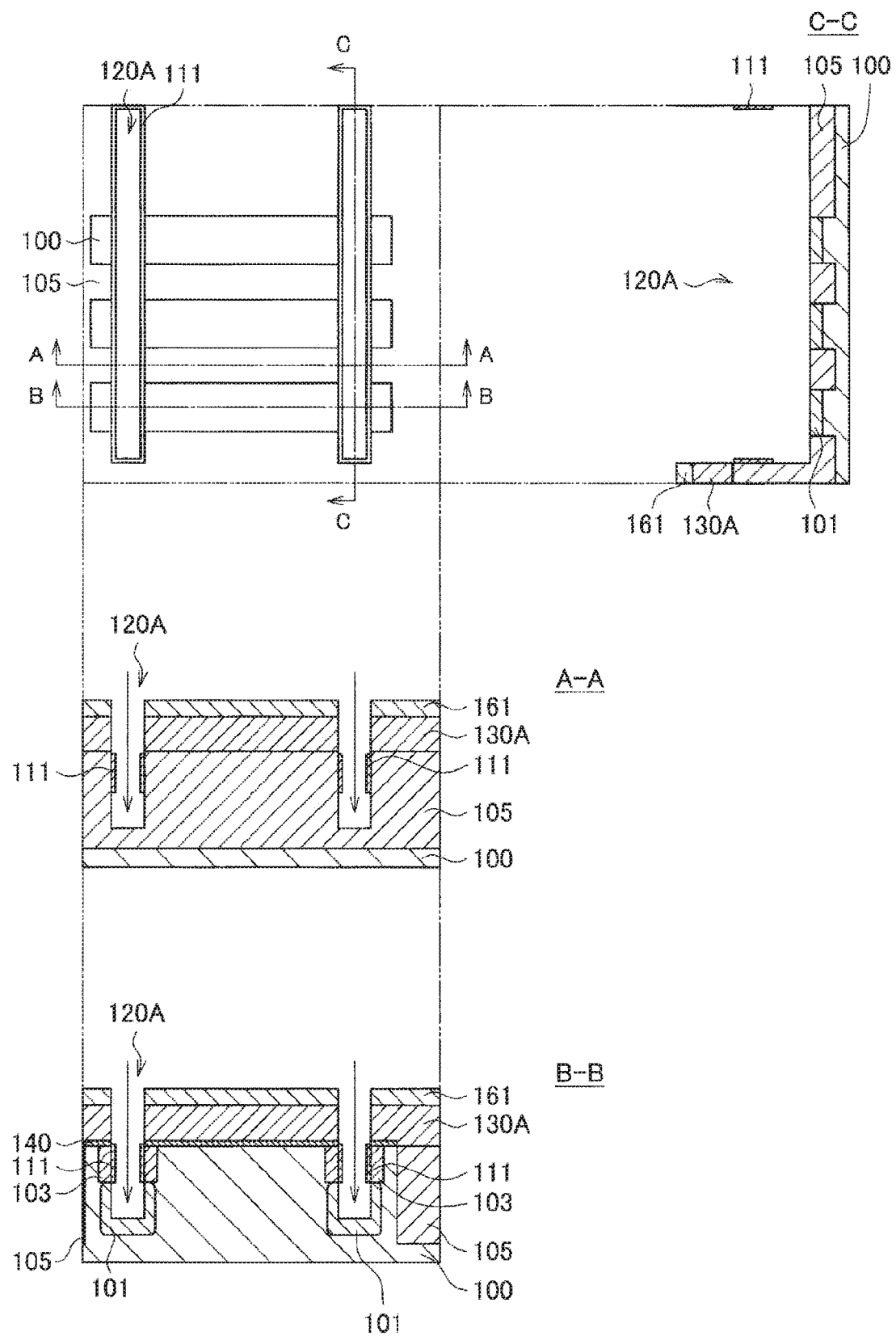
FIG. 27 shows a plan view and cross-sectional views for explaining one step of the fourth manufacturing method of the semiconductor storage device.

Thereafter, as shown in FIG. 27, the bottom portion of the recessed portion 120A is etched, and thereafter ion implantation is performed on the inside of the recessed portion 120A. Thus, the separation region 101 is formed.

Specifically, the bottom portion of the recessed portion 120A is etched by anisotropy etching so that the electrode layers 111 are formed only on side surfaces of the recessed portion 120A. Further, the electrode layers 111 are over-etched to cause the electrode layers 111 to recede. This makes it possible to restrain a short circuit between the capacitor electrode 120 formed in the latter step and the electrode layers 111. Furthermore, the recessed portion 120A may be formed more deeply by further etching the semiconductor substrate 100 under the bottom portion of the recessed portion 120A. Thereafter, the separation region 101 is formed by ion-implanting boron (B) that is the first conductivity-type impurities into the bottom portion of the recessed portion 120A at 5 keV to 20 keV at the concentration of 5 to $20 \times 10^{13}$ impurities/cm$^2$.

Figure 28:
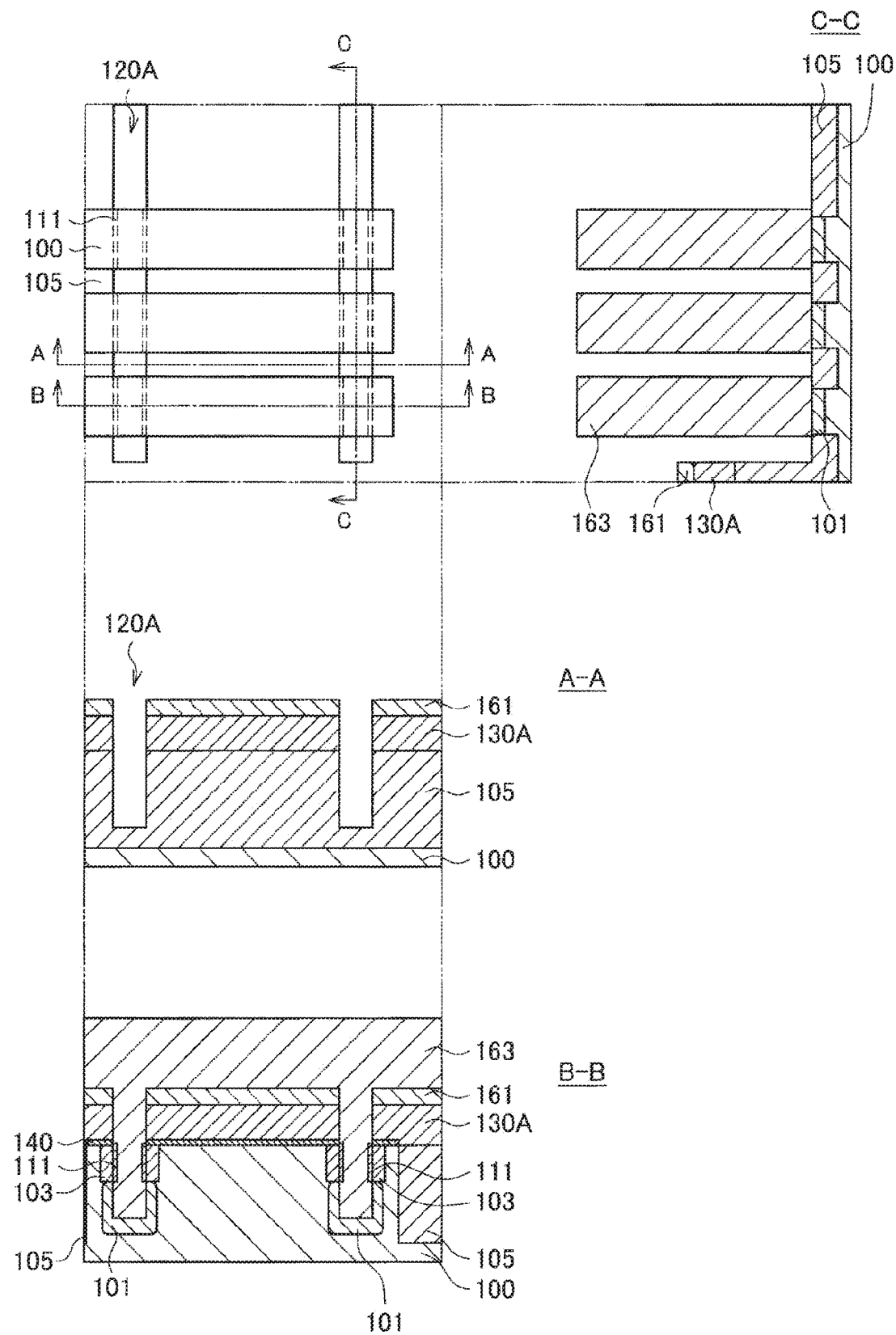
FIG. 28 shows a plan view and cross-sectional views for explaining one step of the fourth manufacturing method of the semiconductor storage device.

Then, as shown in FIG. 28, the electrode layers 111 are patterned by using a patterned resist layer 163.

Specifically, anisotropy etching in which the resist layer 163 patterned by lithography is used as a mask is performed, and thus the electrode layers 111 in the element region remain, whereas the electrode layer 111 in a region in which the element separation layer 105 is provided is removed. After anisotropy etching, the resist layer 163 is peeled off.

Figure 29:
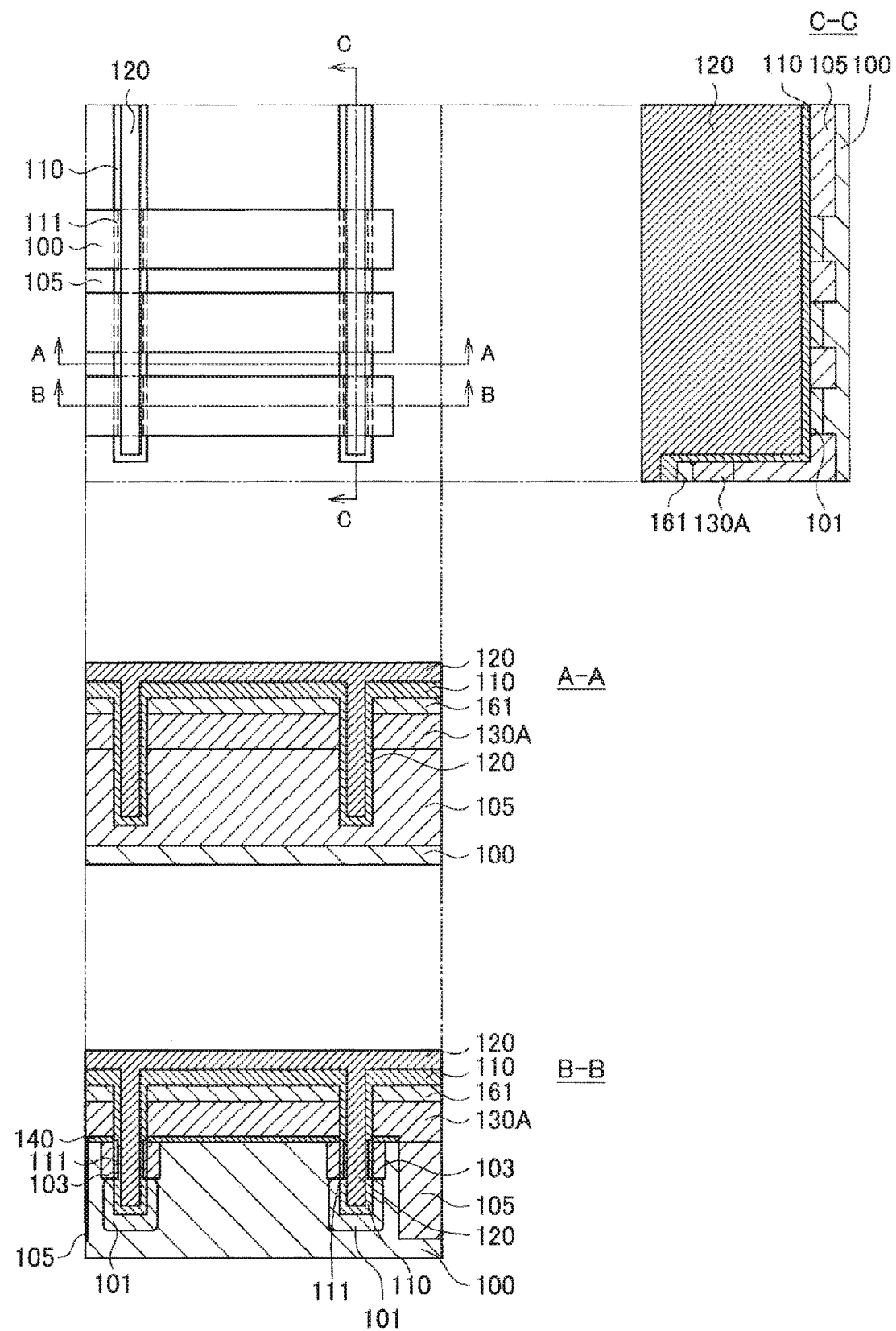
FIG. 29 shows a plan view and cross-sectional views for explaining one step of the fourth manufacturing method of the semiconductor storage device.

Next, as shown in FIG. 29, the ferroelectric film 110 and the capacitor electrode 120 are formed on the protective layer 161 so as to be embedded in the recessed portion 120A.

Specifically, a film of hafnium oxide (HfO$_x$) that is a high dielectric material is formed on the protective layer 161 along the recessed portion 120A by CVD or atomic layer deposition (ALD) so as to have a film thickness of 3 nm to 10 nm. Note that hafnium oxide (HfO$_x$) that is a high dielectric material is converted into a ferroelectric material by performing annealing treatment in the latter step.

Note that, instead of hafnium oxide, a high dielectric material such as zirconium oxide (ZrO$_x$) or hafnium zirconium oxide (HfZrO$_x$) can also be used. Further, those high dielectric materials can also be converted into ferroelectric materials by doping lanthanum (La), silicon (Si), gadolinium (Gd), or the like. Furthermore, a perovskite-based ferroelectric material such as lead zirconate titanate (PZT) or strontium bismuth tantalate (SBT) can also be used as the ferroelectric film 110.

Thereafter, a TiN film having a film thickness of 5 nm to 20 nm is formed on the ferroelectric film 110 by CVD, ALD, sputtering, or the like, thereby forming the capacitor electrode 120. Note that TaN can also be used as a material from which the capacitor electrode 120 is made.

Figure 30:
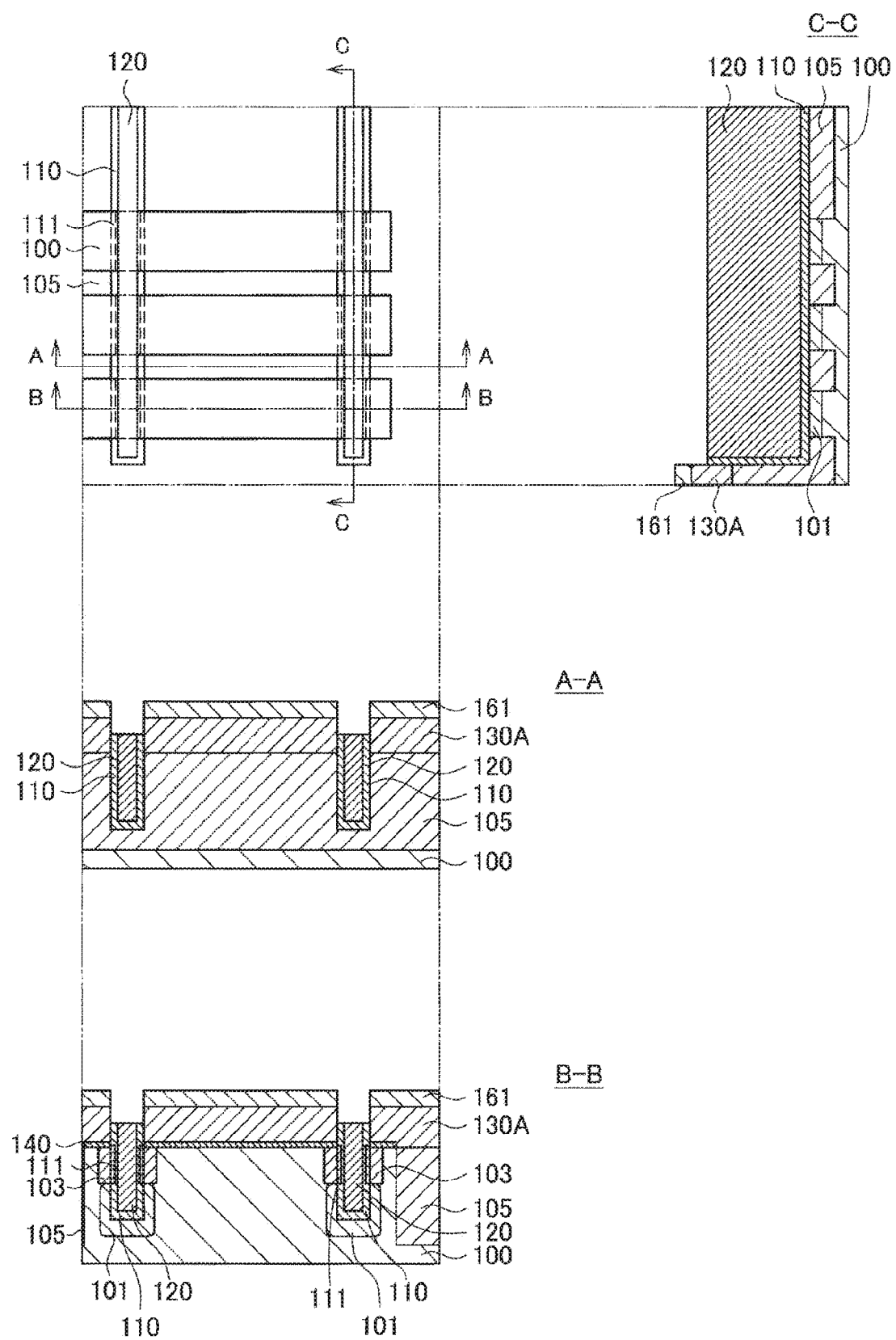
FIG. 30 shows a plan view and cross-sectional views for explaining one step of the fourth manufacturing method of the semiconductor storage device.

Then, as shown in FIG. 30, the ferroelectric film 110 and the capacitor electrode 120 that have been excessively formed are removed, and a part of the capacitor electrode 120 in the recessed portion 120A is further removed.

Specifically, the ferroelectric film 110 and the capacitor electrode 120 that have been excessively formed are removed by performing CMP until the protective layer 161 of the Si$_3$N$_4$ film is exposed. At this time, the protective layer 161 of the Si$_3$N$_4$ film functions as a stopper. This makes it possible to controllably perform polishing by CMP. Thereafter, crystallization annealing is performed for converting HfO$_x$ (high dielectric material at this time) from which the ferroelectric film 110 is made into a ferroelectric material. Note that the crystallization annealing for converting HfO$_x$ into a ferroelectric material may be performed in this step, or may be simultaneously performed in another annealing step. An annealing temperature of the crystallization annealing is changed depending on the type of the high dielectric material from which the ferroelectric film 110 is made or the type of a dopant, but the crystallization annealing only needs to be performed within the range of, for example, 400° C. to 1100° C.

Further, the ferroelectric film 110 and the capacitor electrode 120 are etched at a predetermined depth by anisotropy etching, thereby forming a recess. A depth of the recess can be arbitrarily adjusted.

Figure 31:
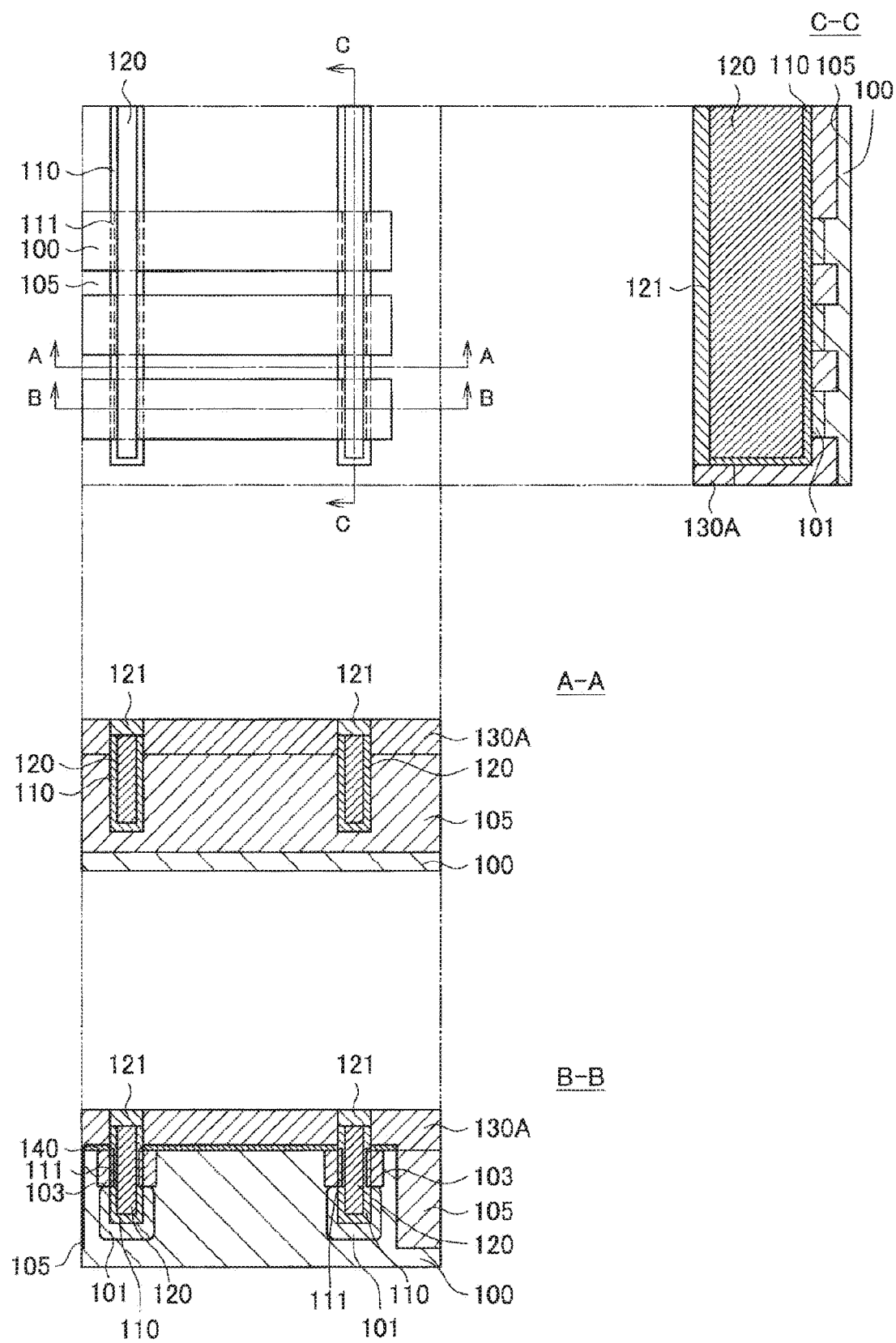
FIG. 31 shows a plan view and cross-sectional views for explaining one step of the fourth manufacturing method of the semiconductor storage device.

Then, as shown in FIG. 31, the cap layer 121 is formed on the capacitor electrode 120.

Specifically, the cap layer 121 is formed by forming a Si$_3$N$_4$ film having a film thickness of approximately 30 nm to 60 nm on the capacitor electrode 120 by low pressure CVD or the like and thereafter performing anisotropy etching. The cap layer 121 may be formed in, for example, the recess formed in the former step.

The transistor 21, the flattening film on the capacitor 11 and the transistor 21, various kinds of wiring layers, and the interlayer insulating film can be formed in steps similar to the steps described with reference to FIGS. 11 to 15.

Also by the above steps, the semiconductor storage device 10 according to this embodiment can be formed.

4. Operation Example

Figure 32:
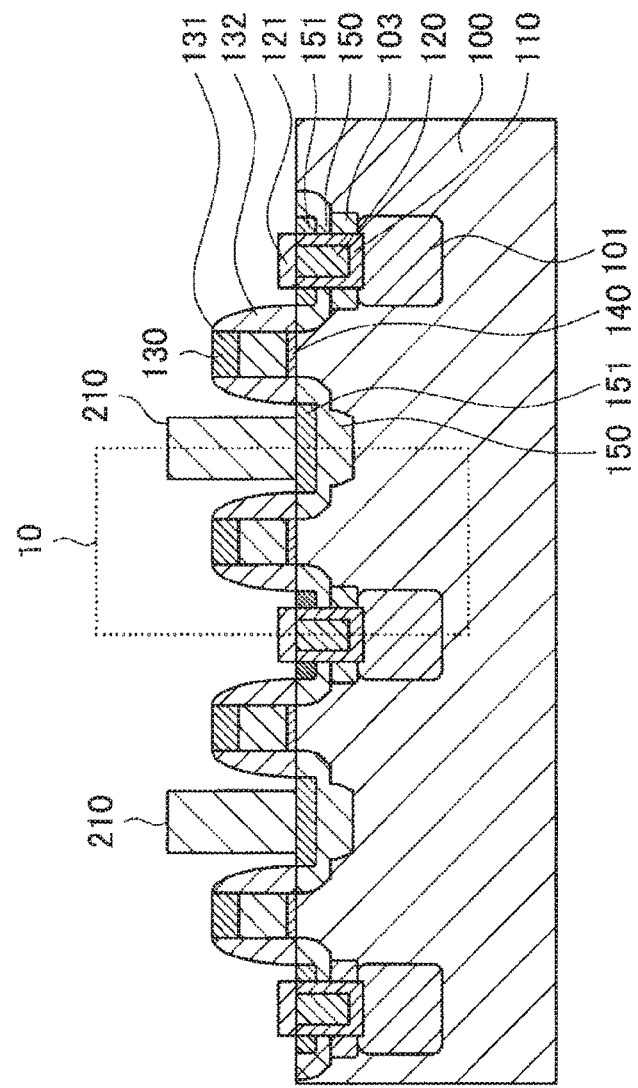
FIG. 32 is a cross-sectional view of a transistor and a capacitor of the semiconductor storage device according to the same embodiment.

Next, writing operation and reading operation of the semiconductor storage device 10 described above will be described with reference to FIG. 32. FIG. 32 is a cross-sectional view of the transistor 21 and the capacitor 11 of the semiconductor storage device 10.

Table 1 below shows examples of voltages (unit: V) applied to each wiring and the semiconductor substrate 100 in the writing operation and the reading operation of the semiconductor storage device 10. Note that Vth indicates a threshold voltage for changing a channel of the transistor 21 to an on state, and Vw indicates a writing voltage for polarizing the capacitor 11.

TABLE 1

|  | WORD LINE WL | BIT LINE BL | SOURCE LINE SL | WORD LINE OF NON-SELECTED CELL WL |
|---|---|---|---|---|
| WRITE "1" | Vw + Vth | Vw | 0 | 0 |
| WRITE "0" | Vw + Vth | 0 | Vw | 0 |
| READ | Vw + Vth | Vw | 0 | 0 |

As shown in Table 1, for example, in a case where information of "1" is written to the semiconductor storage device 10, Vw+Vth is applied to the word line WL connected to the selected semiconductor storage device 10, and Vw is applied to the bit line BL. The source line SL and the semiconductor substrate 100 including the separation region 101 are set to 0 V.

Thus, by applying Vw to the bit line BL (contact 210), a potential of the source of the transistor 21 becomes Vw, and thus a potential of the electrode region 103 of the capacitor 11 becomes Vw. Meanwhile, a potential of the source line SL is 0 V, and thus a potential of the capacitor electrode 120 becomes 0 V. With this, a potential difference of Vw in which the electrode region 103 is a high potential side is applied to the ferroelectric film 110 of the capacitor 11. Thus, a polarization state of the ferroelectric film 110 is controlled, and, for example, information of "1" is written to the semiconductor storage device 10.

However, because the potential of the source of the transistor 21 is Vw, a potential difference occurs between the potential of the source of the transistor 21 and the potential of the source of the adjacent non-selected semiconductor storage device 10 which is 0V. However, in the semiconductor storage device 10, the concentration of the first conductivity-type impurities in the separation region 101 is sufficiently high and thus electrical connection caused by punch-through is restrained. Thus, the potential difference is not applied to the ferroelectric film 110 of the adjacent non-selected semiconductor storage device 10. Therefore, according to this embodiment, information stored in the non-selected semiconductor storage device 10 is prevented from being rewritten.

Further, in a case where information of "0" is written to the semiconductor storage device 10, as shown in Table 1, Vw+Vth is applied to the word line WL connected to the selected semiconductor storage device 10, and Vw is applied to the source line SL. The bit line BL and the semiconductor substrate 100 including the separation region 101 are set to 0 V.

Thus, because the bit line BL (contact 210) is 0 V, the potential of the source of the transistor 21 becomes 0 V, and the potential of the electrode region 103 of the capacitor 11 becomes 0 V. Meanwhile, Vw is applied to the source line SL, and thus the potential of the capacitor electrode 120 becomes Vw. With this, a potential difference of Vw in which the capacitor electrode 120 is a high potential side is applied to the ferroelectric film 110 of the capacitor 11. Thus, the polarization state of the ferroelectric film 110 is controlled, and, for example, information of "0" is written to the semiconductor storage device 10.

However, Vw is applied to the source line SL, and thus, by forming a channel below the recessed portion in which the capacitor electrode 120 and the ferroelectric film 110 are embedded, there is a possibility that the potential of the source of the adjacent non-selected semiconductor storage device 10 also becomes 0 V. However, in the semiconductor storage device 10, the concentration of the first conductivity-type impurities in the separation region 101 is sufficiently high, and thus no channel is formed in the separation region 101. Further, the potential of the source of the adjacent non-selected semiconductor storage device 10 is determined on the basis of a capacitance ratio of the source line SL—the source—the semiconductor substrate 100. In the semiconductor storage device 10, the capacitance of the capacitor 11 is sufficiently high, and thus the potential of the source of the adjacent non-selected semiconductor storage device 10 becomes Vw. Therefore, according to this embodiment, information stored in the non-selected semiconductor storage device 10 is prevented from being rewritten.

Note that information is read from the semiconductor storage device 10 in such a manner that a displacement current generated when "0" or "1" is written to the semiconductor storage device 10 is changed depending on whether information stored before the writing is "0" or "1".

For example, Table 1 shows voltages applied to the wiring and the semiconductor substrate 100 in a case where information of "1" is written to the semiconductor storage device 10 and then information is read from the semiconductor storage device 10. In such a case, in a case where the information stored in the semiconductor storage device 10 is "1", an amount of the displacement current is small. Meanwhile, in a case where the information stored in the semiconductor storage device 10 is "0", the amount of the displacement current is large. With this, the semiconductor storage device 10 can determine whether the stored information is "0" or "1".

However, in a case where information is read from the semiconductor storage device 10 by such reading operation, the information stored in the semiconductor storage device 10 is rewritten to either "0" or "1". That is, reading of the information from the semiconductor storage device 10 is destructive read. Therefore, in the semiconductor storage device 10, rewriting operation for restoring the information destructed by the reading operation is performed after the reading operation.

5. Modification Example

Figure 33:
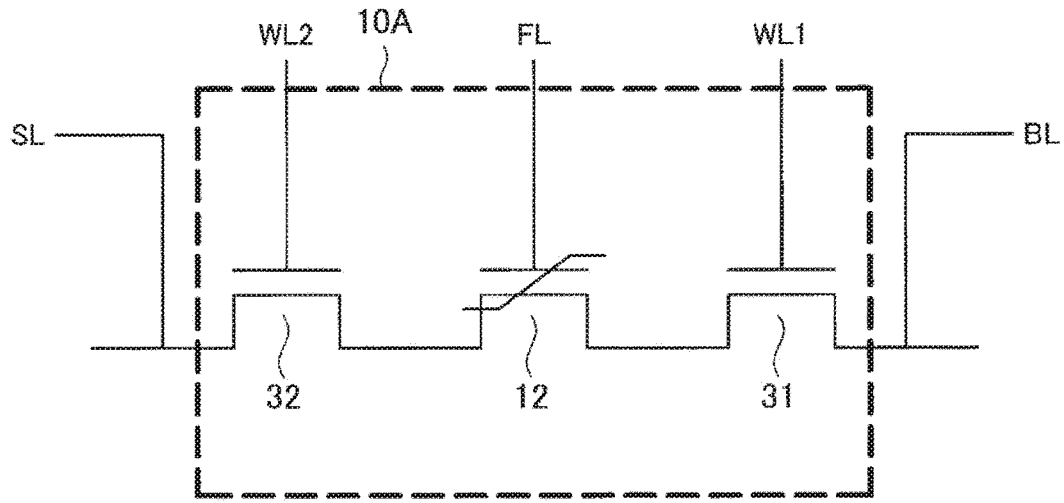
FIG. 33 is a circuit diagram showing an equivalent circuit of a semiconductor storage device according to a modification example.
Figure 34:
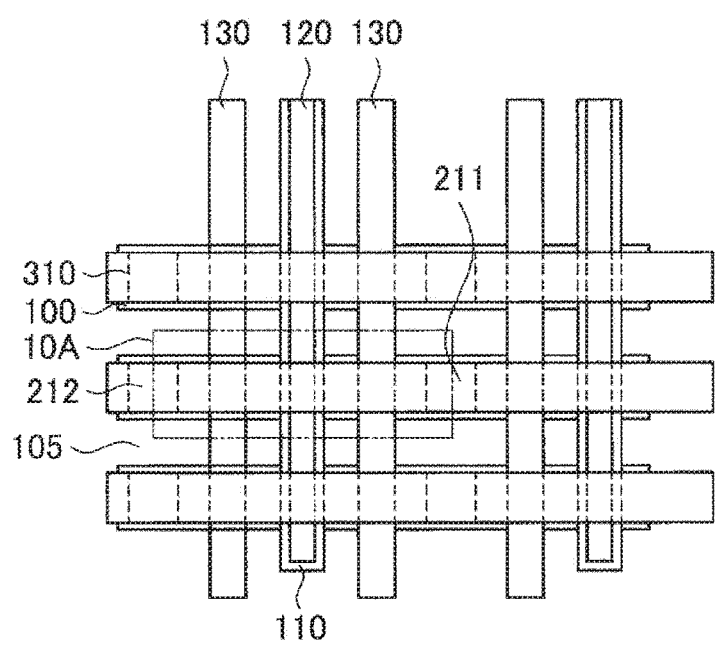
FIG. 34 is a schematic diagram showing a planar structure of a semiconductor storage device according to a modification example.
Figure 35:
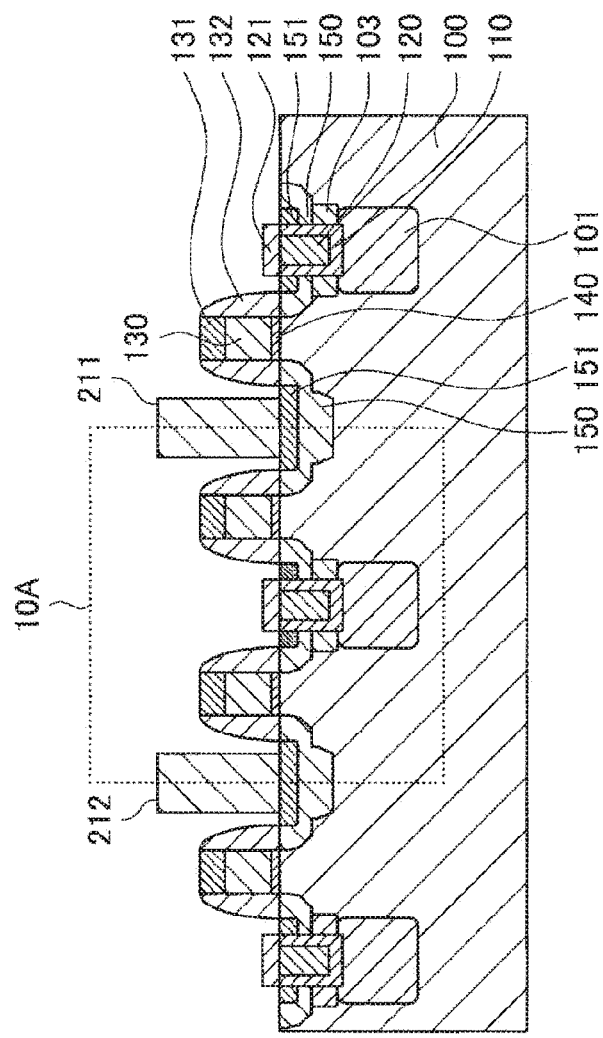
FIG. 35 is a cross-sectional view of each transistor included in a semiconductor storage device according to a modification example.

Next, a modification example of the semiconductor storage device 10 according to this embodiment will be described with reference to FIGS. 33 to 35. FIG. 33 is a circuit diagram showing an equivalent circuit of a semiconductor storage device according to this modification example. FIG. 34 is a schematic diagram showing a planar structure of a semiconductor storage device 10A according to this modification example. FIG. 35 is a cross-sectional view of each transistor included in the semiconductor storage device 10A according to this modification example.

The semiconductor storage device 10A according to this modification example is a modification example where the concentration of the first conductivity-type impurities of the separation region 101 is less than $1 \times 10^{18}$ impurities/cm$^3$ (e.g., approximately $1 \times 10^{16}$ to $10^{17}$ impurities/cm$^3$) and the capacitor 11 functions as a field-effect transistor. Also in such a case, the semiconductor storage device 10A, as well as the above-mentioned semiconductor storage device 10, can store information in the ferroelectric film 110.

As shown in FIG. 33, the semiconductor storage device 10A according to the modification example includes a ferroelectric transistor 12 that stores information and selection transistors 31 and 32 that control selection and non-selection of the ferroelectric transistor 12.

The ferroelectric transistor 12 has substantially the similar configuration to that of the capacitor 11 of the semiconductor storage device 10, except that the concentration of the first conductivity-type impurities included in the separation region 101 is less than $1 \times 10^{18}$ impurities/cm$^3$, and functions as a field-effect transistor. A gate of the ferroelectric transistor 12 is electrically connected to a control line FL, and a source or drain thereof is electrically connected to one of a source and drain of the selection transistor 31 or 32.

The selection transistors 31 and 32 are field-effect transistors that control selection and non-selection of the ferroelectric transistor 12. One of the source and drain of the selection transistor 31 is electrically connected to the source or drain of the ferroelectric transistor 12, and the other of the source and drain thereof is electrically connected to the bit line BL. Further, a gate of the selection transistor 31 is electrically connected to a first word line WL1. One of the source and drain of the selection transistor 32 is electrically connected to the other of the source and drain of the ferroelectric transistor 12, and the other of the source and drain thereof is electrically connected to the source line SL. Further, a gate of the selection transistor 32 is electrically connected to a second word line WL2.

FIG. 34 shows a planar structure of such the semiconductor storage device 10A. As shown in FIG. 34, the ferroelectric transistors 12 including the ferroelectric film 110 is provided at intersections of the element regions on the semiconductor substrate 100 separated by the element separation layer 105 extending in the first direction and the capacitor electrodes 120 extending in the second direction (function as gate electrodes in this modification example).

The selection transistors 31 and 32 are provided at intersections of the element regions on the semiconductor substrate 100 separated by the element separation layer 105 extending in the first direction and the gate electrodes 130 extending in the second direction. For example, in a case where the selection transistor 31 is provided on a right side of the capacitor electrode 120, the selection transistor 31 is electrically connected to the bit line BL via a contact 211. Further, in a case where the selection transistor 32 is provided on a left side of the capacitor electrode 120, the selection transistor 32 is electrically connected to the source line SL via a contact 212.

Next, writing operation and reading operation of the semiconductor storage device 10A according to this modification example will be described with reference to FIG. 35.

Table 2 below shows examples of voltages (unit: V) applied to each wiring and the semiconductor substrate 100 in the writing operation and the reading operation of the semiconductor storage device 10A. Note that Vth indicates a threshold voltage for changing channels of the selection transistors 31 and 32 to an on state, and Vw indicates a writing voltage for polarizing the ferroelectric film 110 of the ferroelectric transistor 12.

TABLE 2

|  | FIRST WORD LINE WL1 | SECOND WORD LINE WL2 | BIT LINE BL | CONTROL LINE FL | SOURCE LINE SL | WORD LINE OF NON-SELECTED CELL WL |
|---|---|---|---|---|---|---|
| WRITE "1" | Vw | 0 | 0 | Vw | 0 | 0 |
| WRITE "0" | Vw + Vth | 0 | Vw | 0 | 0 | 0 |
| READ | Vr1 | Vr1 | Vr2 | Vr3 | 0 | 0 |

As shown in Table 2, for example, in a case where information of "1" is written to the semiconductor storage device 10A, Vw is applied to the first word line WL connected to the selected semiconductor storage device 10A, and Vw is applied to the control line FL. Further, the second word line WL2 connected to the selected semiconductor storage device 10A, the bit line BL, and the source line SL are set to 0 V. Note that the semiconductor substrate 100 including the separation region 101 is set to 0 V.

Thus, because the bit line BL (contact 211) is set to 0 V, the potential of the source (electrode region 103) of the ferroelectric transistor 12 becomes 0 V. Meanwhile, because the potential of the control line FL (capacitor electrode 120) is Vw, the potential difference of Vw in which the capacitor electrode 120 is a high potential side is applied to the ferroelectric film 110 of the ferroelectric transistor 12. With this, the polarization state of the ferroelectric film 110 is controlled, and thus, for example, information of "1" is written to the semiconductor storage device 10A. Note that, at this time, the selection transistor 32 is in an off state.

Further, in a case where information of "0" is written to the semiconductor storage device 10, as shown in Table 2, Vw+Vth is applied to the first word line WL connected to the selected semiconductor storage device 10A, and Vw is applied to the bit line BL. Further, the second word line WL2 connected to the selected semiconductor storage device 10A, the control line FL, and the source line SL are set to 0 V. Note that the semiconductor substrate 100 including the separation region 101 is set to 0 V.

Thus, Vw is applied to the bit line BL (contact 211), and thus the potential of the source (electrode region 103) of the ferroelectric transistor 12 becomes Vw. Meanwhile, the potential of the control line FL (capacitor electrode 120) is 0 V, and thus the potential difference of Vw in which the separation region 101 and the electrode region 103 are a high potential side is applied to the ferroelectric film 110 of the ferroelectric transistor 12. With this, the polarization state of the ferroelectric film 110 is controlled, and, for example, information of "0" is written to the semiconductor storage device 10A. Note that, at this time, the selection transistor 32 is in an off state.

Note that, as shown in Table 2, information is read from the semiconductor storage device 10A by applying arbitrary potentials (Vr1, Vr3) for changing each of the selection transistors 31 and 32 and the ferroelectric transistor 12 to the on state to the first word line WL1, the second word line WL2, and the control line FL. Further, a potential (Vr2) necessary for reading a current is applied to the bit line BL. In such a case, a current flowing through the bit line BL from the source line SL is changed depending on the threshold voltage (Vth) of the ferroelectric transistor 12. The threshold voltage of the ferroelectric transistor 12 is changed depending on the remanent polarization direction of the ferroelectric film 110. With this, the semiconductor storage device 10A can determine whether the stored information is "0" or "1".

That is, reading of the information from the semiconductor storage device 10A is nondestructive read. Thus, the semiconductor storage device 10A can stably read information, without rewriting information every time when the information is read.

6. Electronic Apparatuses

Figure 36:
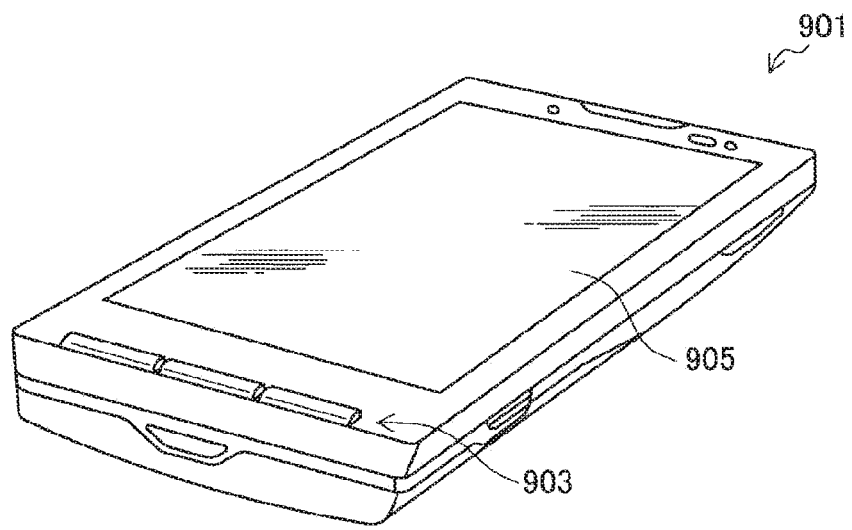
FIG. 36 is an external view showing an example of an electronic apparatus according to an embodiment of the present disclosure.
Figure 37:
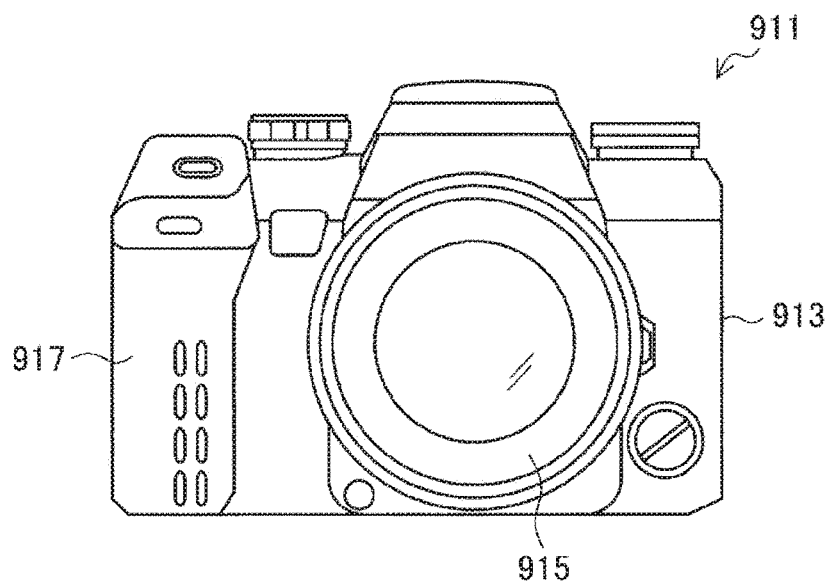
FIG. 37 is an external view showing another example of an electronic apparatus according to an embodiment of the present disclosure.
Figure 38:
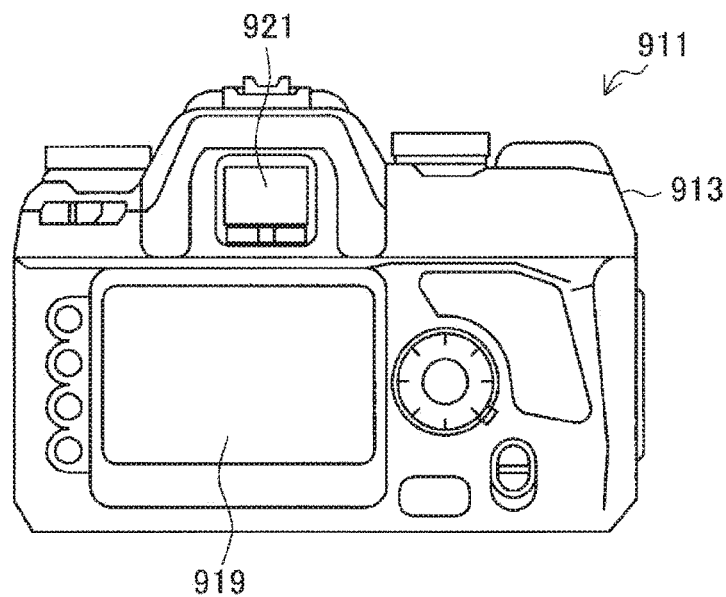
FIG. 38 is an external view showing another example of an electronic apparatus according to an embodiment of the present disclosure.

Next, electronic apparatuses according to an embodiment of the present disclosure will be described. The electronic apparatuses according to the embodiment of the present disclosure are various electronic apparatuses on which a circuit including the above-mentioned semiconductor storage device 10 is mounted. Examples of such electronic apparatus according to this embodiment will be described with reference to FIGS. 36 to 38. FIGS. 36 to 38 are external views showing examples of the electronic apparatus according to this embodiment.

An example of the electronic apparatus according to this embodiment may be an electronic apparatus such as a smartphone. Specifically, as shown in FIG. 36, a smartphone 900 includes a display unit 901 that displays various kinds of information and an operation unit 903 including, for example, buttons for accepting operation input from a user. Herein, the above-mentioned semiconductor storage device 10 may be provided in a circuit mounted on the smartphone 900.

An example of the electronic apparatus according to this embodiment may be an electronic apparatus such as a digital camera. Specifically, as shown in FIGS. 37 and 38, a digital camera 910 includes a main body portion (camera body) 911, a replaceable lens unit 913, a grip portion 915 gripped by the user at the time of capturing an image, a monitor portion 917 that displays various kinds of information, and an electronic view finder (EVF) 919 that displays a through image observed by the user at the time of capturing an image. Note that FIG. 37 is an external view seen from the front (i.e., a subject side) of the digital camera 910, and FIG. 38 is an external view seen from the back (i.e., a photographing person side) of the digital camera 910. Herein, the above-mentioned semiconductor storage device 10 may be provided in the circuit mounted on the digital camera 910.

Note that the electronic apparatus according to this embodiment is not limited to the above examples. The electronic apparatus according to this embodiment may be electronic apparatuses in various fields. Examples of such the electronic apparatus encompass an eyeglass-type wearable device, a head mounted display (HMD), a television device, an electronic book, a personal digital assistant (PDA), a laptop computer, a video camera, a game console, and the like.

The preferred embodiments of the present disclosure have been described above with reference to the accompanying drawings, whilst the present disclosure is not limited to the above examples. A person skilled in the art may find various alterations and modifications within the scope of the appended claims, and it should be understood that they will naturally come under the technical scope of the present disclosure.

Further, the effects described in this specification are merely illustrative or exemplified effects, and are not limitative. That is, with or in the place of the above effects, the technology according to the present disclosure may achieve other effects that are clear to those skilled in the art from the description of this specification.

Note that the following configurations also fall within the technical scope of the present disclosure.

(1)
A semiconductor storage device including:
a recessed portion provided in a semiconductor substrate;
a ferroelectric film provided along an inner side of the recessed portion;
an electrode provided on the ferroelectric film so as to be embedded in the recessed portion;
a first conductivity-type separation region provided in the semiconductor substrate under the recessed portion; and
a second conductivity-type electrode region provided in the semiconductor substrate on at least one side of the recessed portion.

(2)
The semiconductor storage device according to (1), in which
the separation region includes first conductivity-type impurities, and
the electrode region includes second conductivity-type impurities whose conductivity type is different from the conductivity type of the first conductivity-type impurities.

(3)
The semiconductor storage device according to (2), in which the separation region and the electrode region include the first conductivity-type impurities or the second conductivity-type impurities at a concentration of $1\times10^{18}$ impurities/cm$^3$ or more.

(4)
The semiconductor storage device according to any one of (1) to (3), in which
the electrode, the ferroelectric film, and the electrode region form a capacitor that stores information by using polarization of the ferroelectric film,
the electrode is electrically connected to a source line, and
the electrode region is electrically connected to a bit line via a source and drain of a field-effect transistor.

(5)
The semiconductor storage device according to (4), in which a capacitance of the capacitor is equal to or more than twice as much as a parasitic capacitance formed in the electrode region and the semiconductor substrate.

(6)
The semiconductor storage device according to any one of (1) to (5), in which an element separation layer that separates element regions in each of which the separation region and the electrode region are formed and extends in a first direction within a surface of the semiconductor substrate is provided on the semiconductor substrate.

(7)
The semiconductor storage device according to (6), in which
the electrode region is provided on each side in the first direction of the recessed portion, and
the electrode, the ferroelectric film, and the electrode region form, on the each side, a capacitor that stores information by using polarization of the ferroelectric film.

(8)
The semiconductor storage device according to (6) or (7), in which the recessed portion is provided to extend in a second direction orthogonal to the first direction.

(9)
The semiconductor storage device according to any one of (6) to (8), in which a formation depth of the recessed portion is shallower than a formation depth of the element separation layer provided on the semiconductor substrate.

(10)
The semiconductor storage device according to (2), in which
the separation region includes the first conductivity-type impurities at a concentration less than $1\times10^{18}$ impurities/cm$^3$, and
the electrode, the ferroelectric film, and the electrode region form a field-effect transistor that stores information by using polarization of the ferroelectric film.

(11)
The semiconductor storage device according to any one of (1) to (9), in which a metal layer is further provided between the electrode region and the ferroelectric film.

(12)
An electronic apparatus, including
a semiconductor storage device, in which
the semiconductor storage device includes
a recessed portion provided in a semiconductor substrate,
a ferroelectric film provided along an inner side of the recessed portion,
an electrode provided on the ferroelectric film so as to be embedded in the recessed portion,
a first conductivity-type separation region provided in the semiconductor substrate under the recessed portion, and
a second conductivity-type electrode region provided in the semiconductor substrate on at least one side of the recessed portion.

(13)
A method of manufacturing a semiconductor storage device, including:
a step of providing a recessed portion in a semiconductor substrate;
a step of providing a second conductivity-type electrode region in the semiconductor substrate on at least one side of the recessed portion;
a step of providing a first conductivity-type separation region in the semiconductor substrate under the recessed portion;
a step of providing a ferroelectric film along an inner side of the recessed portion; and
a step of providing an electrode on the ferroelectric film so that the electrode is embedded in the recessed portion.

REFERENCE SIGNS LIST

10 Semiconductor storage device
11 Capacitor
21 Transistor
100 Semiconductor substrate
101 Separation region
103 Electrode region
105 Element separation layer
110 Ferroelectric film
120 Capacitor electrode
120A Recessed portion
121 Cap layer
130 Gate electrode
131 Contact layer
132 Side wall insulating film
140 Gate insulating film
150, 152 Source or drain region
151 Contact region
200 Flattening film
210, 220 Contact
300 First interlayer insulating film
310, 320 First wiring layer
400 Second interlayer insulating film
410 Via
500 Third interlayer insulating film
510 Second wiring layer

The invention claimed is:

1. A semiconductor storage device, comprising:
a recessed portion in a semiconductor substrate;
a ferroelectric film along an inner side of the recessed portion;
an electrode on the ferroelectric film, wherein the electrode is embedded in the recessed portion;
a first conductivity-type separation region in the semiconductor substrate under the recessed portion; and
a second conductivity-type electrode region in the semiconductor substrate on at least one side of the recessed portion, wherein
the electrode, the ferroelectric film, and the second conductivity-type electrode region form a capacitor,
the capacitor is configured to store information based on polarization of the ferroelectric film,
the electrode is electrically connected to a source line, and
the second conductivity-type electrode region is electrically connected to a bit line via a source of a specific field-effect transistor and a drain of the specific field-effect transistor.

2. The semiconductor storage device according to claim 1, wherein
the first conductivity-type separation region includes first conductivity-type impurities,
the second conductivity-type electrode region includes second conductivity-type impurities, and
a conductivity type of the second conductivity-type impurities is different from the conductivity type of the first conductivity-type impurities.

3. The semiconductor storage device according to claim 2, wherein the first conductivity-type separation region includes the first conductivity-type impurities and the second conductivity-type electrode region includes the second conductivity-type impurities at a concentration of $1\times10^{18}$ impurities/cm$^3$ or more.

4. The semiconductor storage device according to claim 2, wherein
the first conductivity-type separation region includes the first conductivity-type impurities at a concentration less than $1\times10^{18}$ impurities/cm$^3$, and
the capacitor formed by the electrode, the ferroelectric film, and the second conductivity-type electrode region functions as a field-effect transistor configured to store the information based on the polarization of the ferroelectric film.

5. The semiconductor storage device according to claim 1, wherein a capacitance of the capacitor is equal to or more than twice a parasitic capacitance formed in the second conductivity-type electrode region and the semiconductor substrate.

6. The semiconductor storage device according to claim 1, further comprising an element separation layer on the semiconductor substrate, wherein
the element separation layer separates a first element region and a second element region,
the first element region includes the first conductivity-type separation region and the second element region includes the second conductivity-type electrode region, and
the element separation layer extends in a first direction within a surface of the semiconductor substrate.

7. The semiconductor storage device according to claim 6, wherein
the second conductivity-type electrode region is on each side of the recessed portion in the first direction, and
the electrode, the ferroelectric film, and the second conductivity-type electrode region form the capacitor on each side of the recessed portion.

8. The semiconductor storage device according to claim 6, wherein the recessed portion extends in a second direction orthogonal to the first direction.

9. The semiconductor storage device according to claim 6, wherein a formation depth of the recessed portion is shallower than a formation depth of the element separation layer on the semiconductor substrate.

10. The semiconductor storage device according to claim 1, further comprising a metal layer between the second conductivity-type electrode region and the ferroelectric film.

11. An electronic apparatus, comprising:
a semiconductor storage device, wherein the semiconductor storage device includes:
a recessed portion in a semiconductor substrate;
a ferroelectric film along an inner side of the recessed portion;
an electrode on the ferroelectric film, wherein the electrode is embedded in the recessed portion;
a first conductivity-type separation region in the semiconductor substrate under the recessed portion; and
a second conductivity-type electrode region in the semiconductor substrate on at least one side of the recessed portion, wherein
the electrode, the ferroelectric film, and the second conductivity-type electrode region form a capacitor,
the capacitor is configured to store information based on polarization of the ferroelectric film,
the electrode is electrically connected to a source line, and
the second conductivity-type electrode region is electrically connected to a bit line via a source of a field-effect transistor and drain of the field-effect transistor.

* * * * *